United States Patent
Ishio

(10) Patent No.: US 7,906,856 B2
(45) Date of Patent: Mar. 15, 2011

(54) SEMICONDUCTOR DEVICE AND METHOD FOR MANUFACTURING SEMICONDUCTOR DEVICE

(75) Inventor: Toshiya Ishio, Nabari (JP)

(73) Assignee: Sharp Kabushiki Kaisha, Osaka (JP)

( * ) Notice: Subject to any disclaimer, the term of this patent is extended or adjusted under 35 U.S.C. 154(b) by 54 days.

(21) Appl. No.: 12/109,664

(22) Filed: Apr. 25, 2008

(65) Prior Publication Data

US 2008/0272500 A1 Nov. 6, 2008

(30) Foreign Application Priority Data

Apr. 27, 2007 (JP) ................................. 2007-120202
Feb. 8, 2008 (JP) ................................. 2008-029697
Apr. 22, 2008 (JP) ................................. 2008-111047

(51) Int. Cl.
*H01L 23/48* (2006.01)
*H01L 23/52* (2006.01)
*H01L 29/40* (2006.01)

(52) U.S. Cl. ................. 257/782; 257/780; 257/E23.142

(58) Field of Classification Search .................. 257/780, 257/737, 738, 782
See application file for complete search history.

(56) References Cited

U.S. PATENT DOCUMENTS

| | | |
|---|---|---|
| 5,164,334 A | 11/1992 | Mizushima |
| 6,940,160 B1 | 9/2005 | Hanaoka et al. |
| 7,446,422 B1 * | 11/2008 | Paek et al. ..................... 257/779 |
| 2003/0116790 A1 | 6/2003 | Kikuchi et al. |
| 2004/0222487 A1 | 11/2004 | Tanabe et al. |
| 2005/0264965 A1 * | 12/2005 | Okamoto ....................... 361/56 |

FOREIGN PATENT DOCUMENTS

| | | |
|---|---|---|
| JP | 1-310560 A | 12/1989 |
| JP | 3-196662 A | 8/1991 |
| JP | 2002-305215 A | 10/2002 |
| JP | 2003-347471 A | 12/2003 |
| JP | 2004-031790 A | 1/2004 |
| JP | 2004-207268 A | 7/2004 |
| JP | 2004-214561 A | 7/2004 |
| JP | 2004207268 A * | 7/2004 |
| JP | 2006-303036 A | 11/2006 |
| WO | WO 00/55898 A1 | 9/2000 |

\* cited by examiner

*Primary Examiner* — Chuong A. Luu
*Assistant Examiner* — Nga Doan
(74) *Attorney, Agent, or Firm* — Nixon & Vanderhye P.C.

(57) ABSTRACT

A semiconductor device has a semiconductor chip provided with an insulating layer formed so as to be thinner in a first secondary-wire-free area than in a first secondary-wire-containing area. Further, the semiconductor chip has an edge extending further outward than a side wall, which severs as an edge of an upper insulating layer, in an extending direction of a circuit-forming surface of the semiconductor chip on which electrode pads are provided. This makes it possible to provide a semiconductor device capable of suppressing electromagnetic interference between a secondary wire and an electronic circuit of a semiconductor chip and the curvature of a wafer even in the case of overlap between the secondary wire and the electronic circuit, and of reducing the risk of occurrence of chipping in a dicing step.

7 Claims, 23 Drawing Sheets

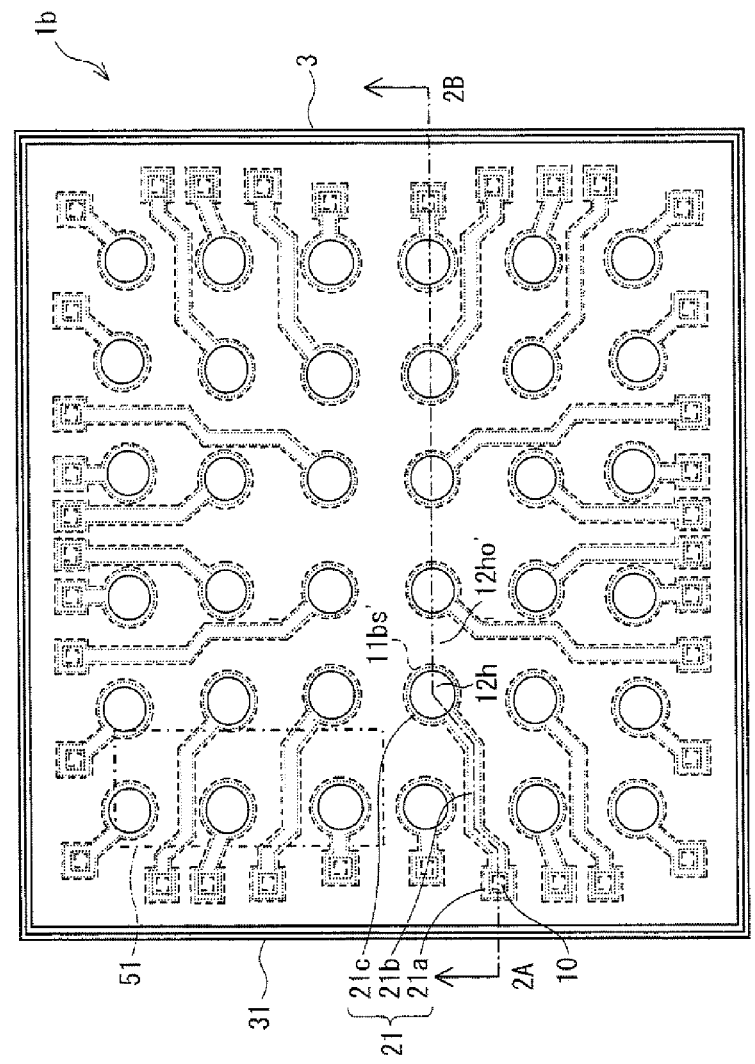
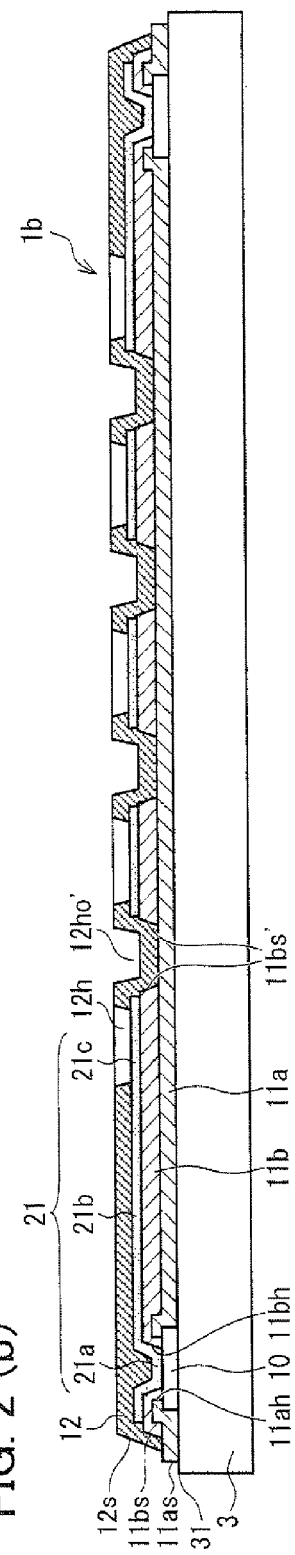
FIG. 2 (a)
FIG. 2 (b)

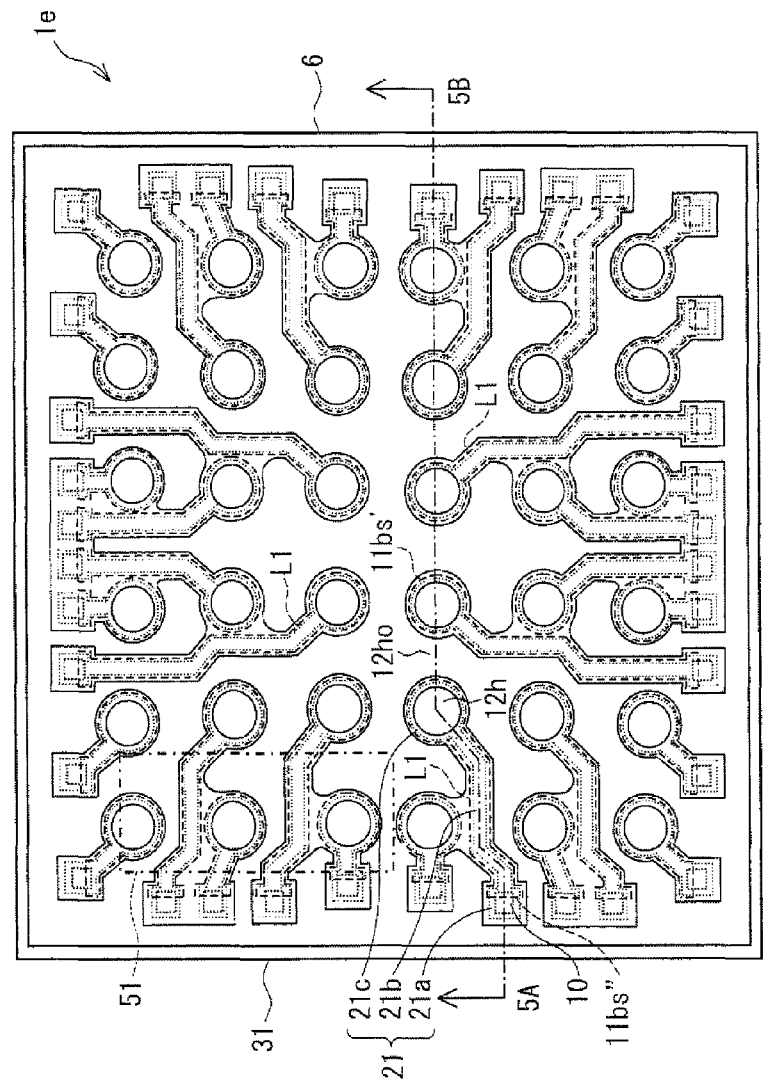
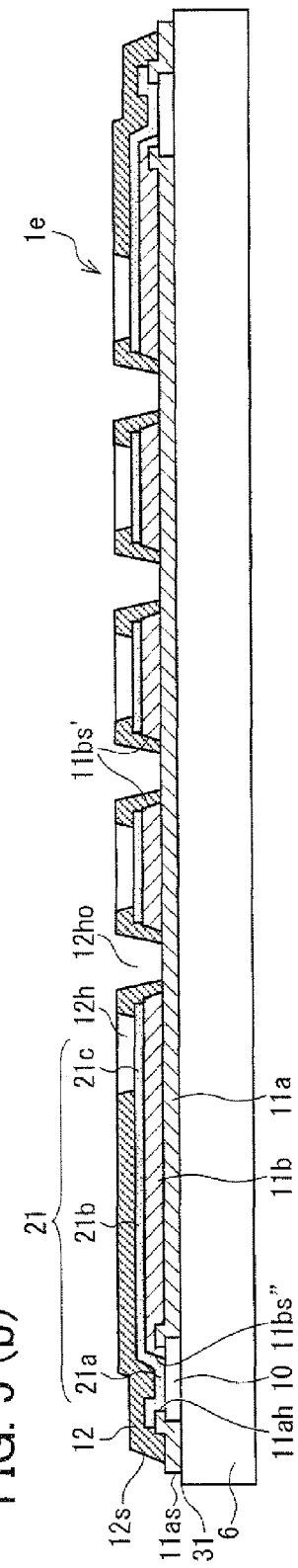
FIG. 5 (a)
FIG. 5 (b)

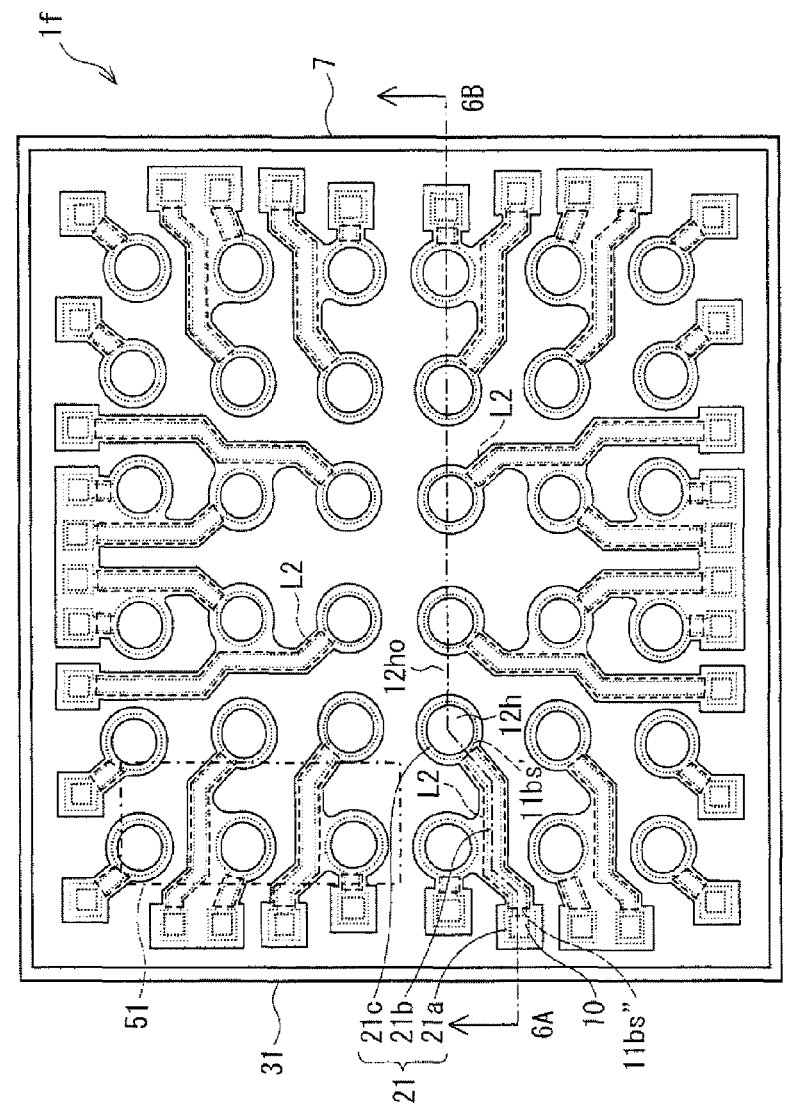
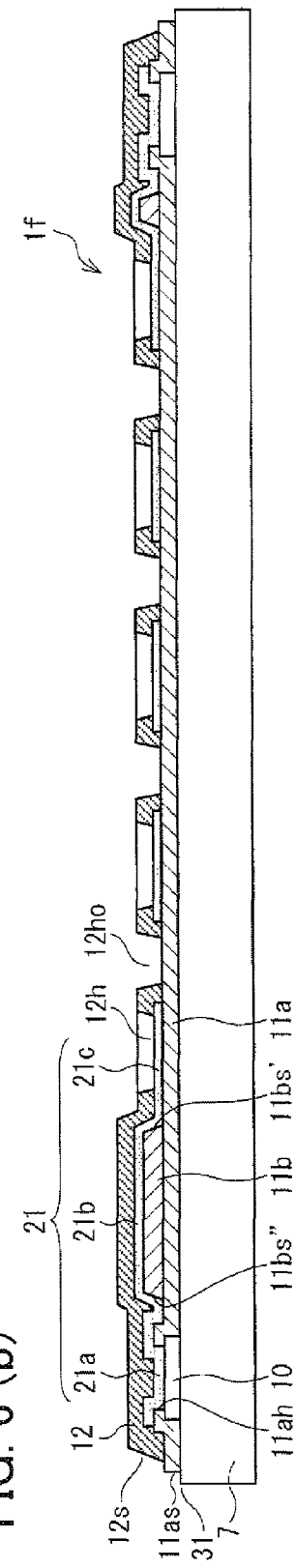
FIG. 6 (a)
FIG. 6 (b)

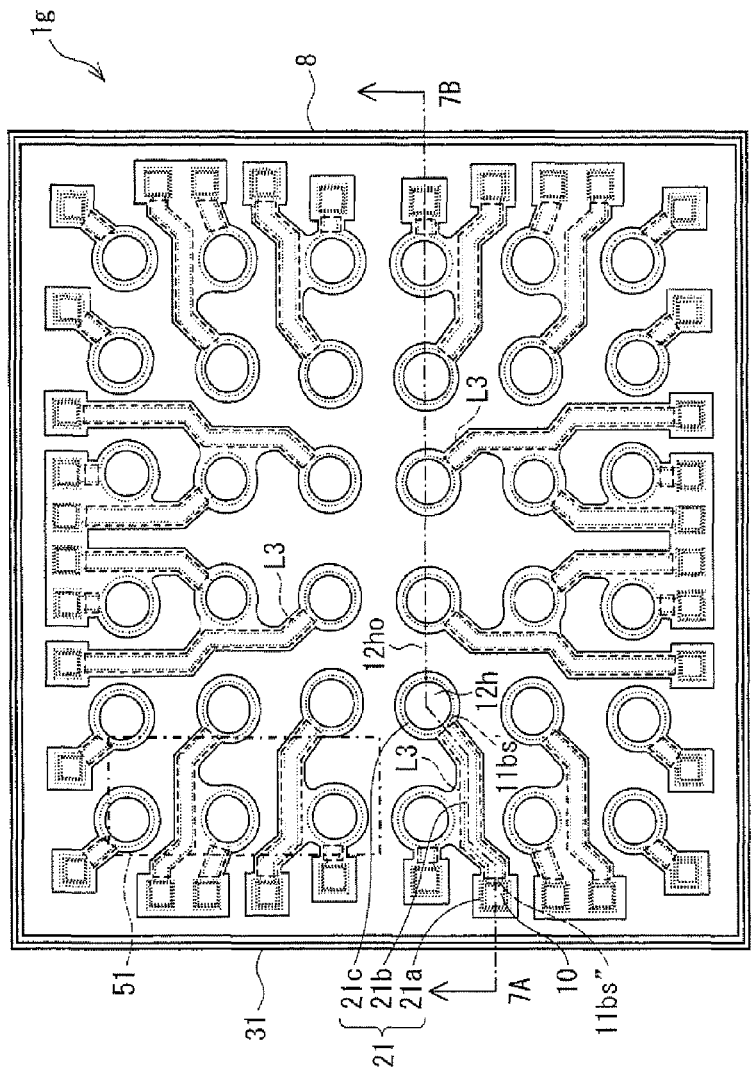
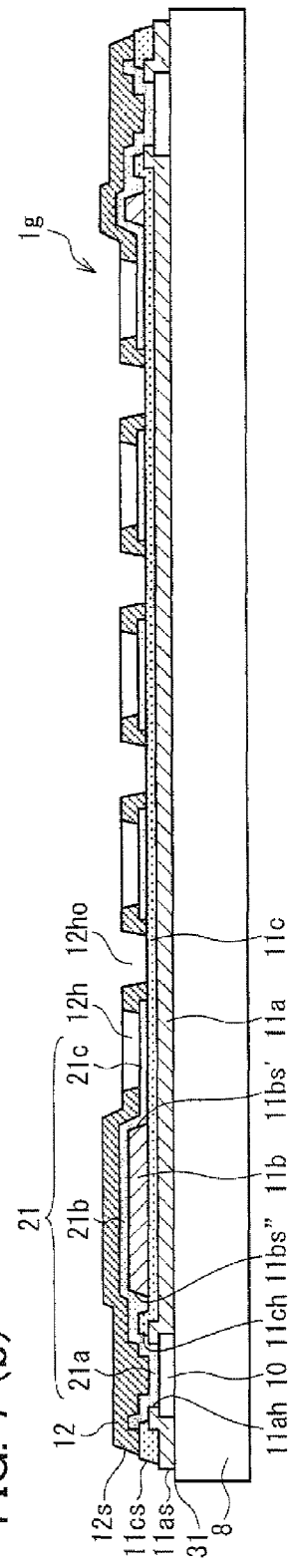
FIG. 7 (a)
FIG. 7 (b)

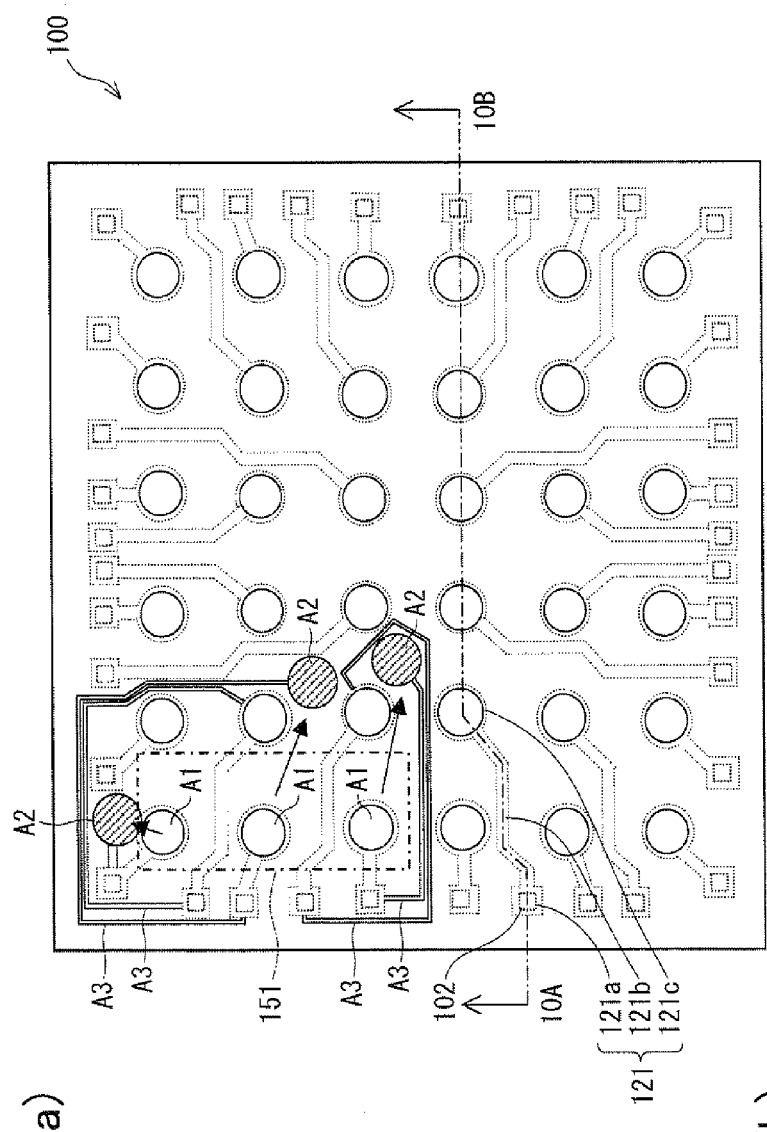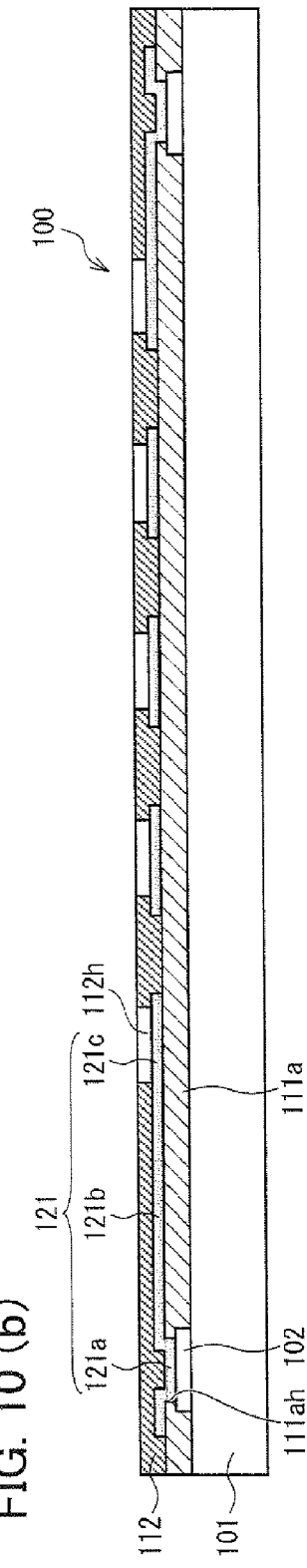
FIG. 10 (a)
FIG. 10 (b)

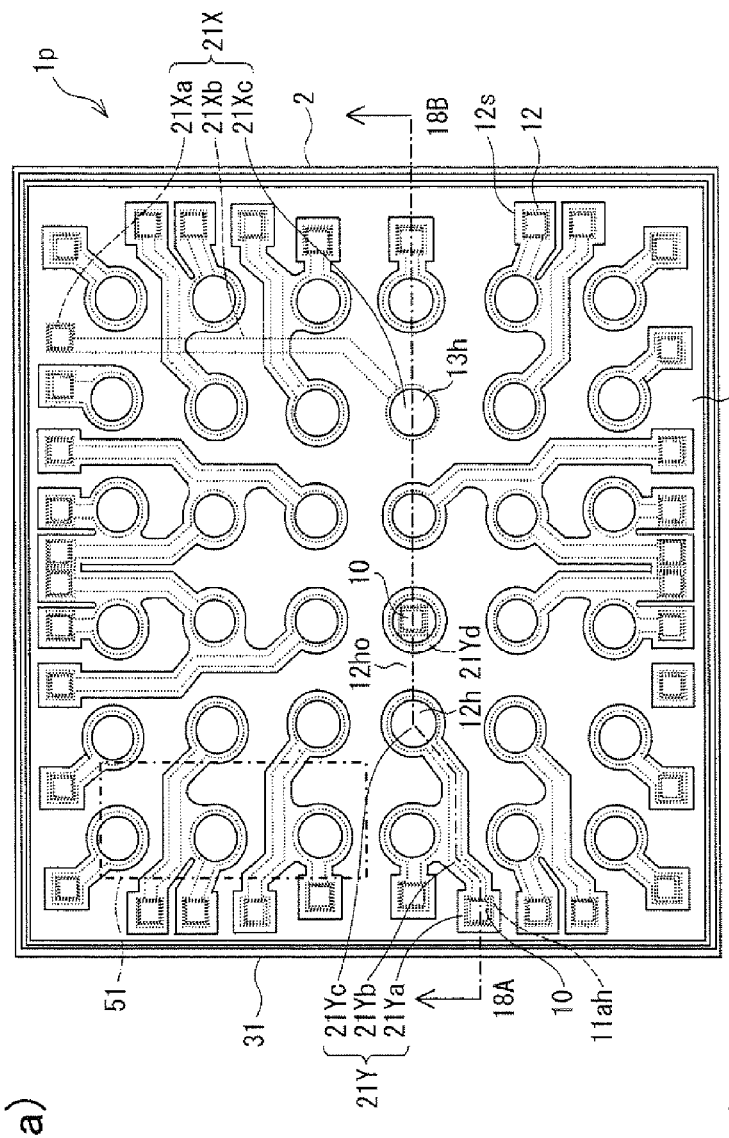
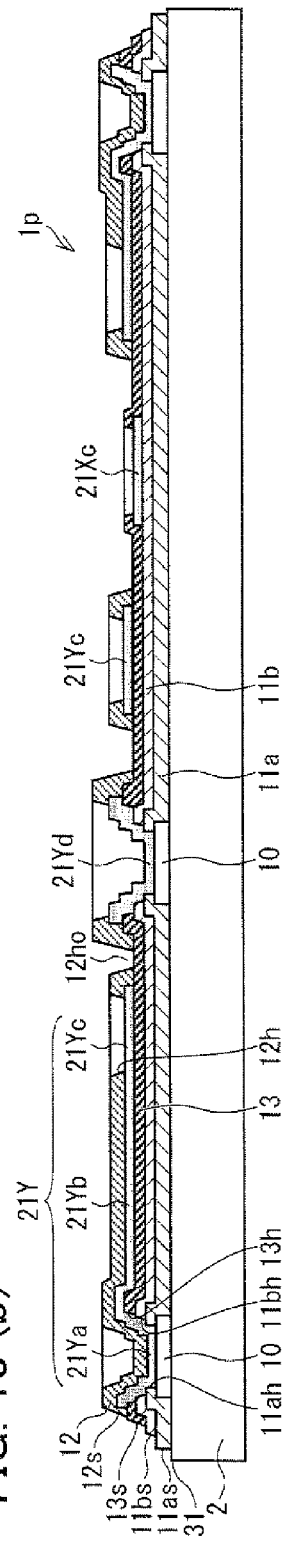
FIG. 18 (a)
FIG. 18 (b)

US 7,906,856 B2

SEMICONDUCTOR DEVICE AND METHOD FOR MANUFACTURING SEMICONDUCTOR DEVICE

This Nonprovisional application claims priority under 35 U.S.C. §119(a) on Patent Application No. 120202/2007 filed in Japan on Apr. 27, 2007, Patent Application No. 029697/2008 filed in Japan on Feb. 8, 2008, Patent Application No. 111047/2008 filed in Japan on Apr. 22, 2008, the entire contents of which are hereby incorporated by reference.

FIELD OF THE TECHNOLOGY

The technology presented herein relates to (i) a semiconductor device including a semiconductor chip having electrode pads, external connection terminals, and secondary wires (i.e., rewiring layers) and (ii) a method for manufacturing a semiconductor device.

BACKGROUND

In recent years, there has existed a semiconductor device which, in order to be connected to a circuit formed outside thereof, includes a semiconductor chip having the following structure.

That is, the semiconductor chip has a circuit-forming surface provided with electrode pads, secondary wires, and external connection terminals to which the circuit is connected. Moreover, there exists a semiconductor chip that has such a structure that a secondary wire is so provided between an electrode pad and an external connection terminal as to connect the semiconductor chip to an external circuit.

Conventionally, this type of semiconductor device has been devised in various ways for suppressing electromagnetic interference between a secondary wire and an electronic circuit (hereinafter referred to simply as "electromagnetic interference"). It should be noted that the electromagnetic interference is a phenomenon in which noise (electrostatically induced noise or electromagnetically induced noise) produced when parasitic capacitance formed between a circuit-forming surface and a secondary wire is coupled to an electrical signal is superimposed onto the electronic circuit.

For example, according to a technique disclosed in Patent Document 1 (Japanese Unexamined Patent Application Publication No. 83894/2002 (Tokukai 2002-83894; published on Mar. 22, 2002)), such electromagnetic interference in a semiconductor chip is suppressed by disposing secondary wires so that the secondary wires do not overlap an electronic circuit (analog circuit section) provided on a circuit-forming surface.

However, according to the technique disclosed in Patent Document 1, in order to arrange the secondary wires so that they do not overlap the electronic circuit, it is necessary that secondary wires that conduct different signals be run so as not to intersect with each other. Therefore, the length of a secondary wire becomes very long depending on where it is formed. This may cause problems with delays in electrical signals inputted and outputted via electrode pads.

Further, in the case of disposition of secondary wires that circumvent the electronic circuit, it is necessary to run a large number of secondary wires between a plurality of external connection terminals. Especially, in cases where a plurality of external connection terminals are peripherally disposed, it is necessary to run a large number of secondary wires around the periphery of these electrode pads (i.e., on the edge of the semiconductor chip). Therefore, a plurality of secondary wires may come extremely close to each other depending on where they are formed, or external connection terminals may be placed at extremely narrow pitches. Moreover, this may cause a problem of inability to ensure a wire width appropriate for an electrical current required by the electronic circuit or a problem of deterioration in yield in the step of forming secondary wires.

Further, according to the technique disclosed in Patent Document 1, the proximity of the secondary wires to each other may cause electrical current leakage and crosstalk noise. Furthermore, according to the technique disclosed in Patent Document 1, as the distance between secondary wires shortens, the parasitic capacitance of an insulating layer existing between the secondary wires increases. This may cause wiring delays.

Further, Patent Document 3 (Japanese Unexamined Patent Application Publication No. 303036/2006 (Tokukai 2006-303036; published on Nov. 2, 2006)) discloses a semiconductor device whose sealing resin layer is so provided in an area free of a rewiring layer as to be in a pattern having holes that absorb stress.

However, the semiconductor device disclosed in Patent Document 3 suffers from a problem of high risk of occurrence of chipping in a dicing step.

That is, since the semiconductor device disclosed in Patent Document 3 is merely arranged such that the sealing resin layer is provided with the holes, the semiconductor device disclosed in Patent Document 3 becomes arranged such that an insulating layer having substantially the same thickness as an area provided with a rewiring layer is provided in an area near a scribe line. However, in cases where an insulating layer, or an organic insulating layer in particular, is formed thickly in an area near the scribe line, the formation of the insulating layer alone can be a factor that causes chipping in the dicing step. This is because the chipping is attributed to clogging of a dicing blade. The insulating layer has ductility, and the insulating layer has such properties, for example, that swarf therefrom is prone to adhere to the dicing blade. The formation of the insulating layer in an area near the scribe line causes the semiconductor device to have more incidence of clogging of the dicing blade.

Further, the semiconductor device disclosed in Patent Document 3 suffers from a problem with an increase in the curvature of a wafer.

That is, stress that affects the curvature of a wafer becomes very high in a peripheral portion of a joint surface, i.e., in an area of a semiconductor chip near a scribe line. Therefore, the technique disclosed in Patent Document 3 merely arranged such that the sealing resin layer is provided with the holes has difficulty in bringing about a sufficiently great effect of suppressing the curvature of a wafer. In order to obtain a sufficiently great wafer-curvature suppressing effect with use of the technique disclosed in Patent Document 3, it is conceivable that a large number of such holes are formed. However, the formation of a large number of such holes undesirably complicates the structure of the semiconductor device.

The problem with the curvature of a wafer will be described below in detail.

SUMMARY

It is an aspect of the example embodiment presented herein to provide a semiconductor device and a method for manufacturing a semiconductor device, both of which make it possible to suppress electromagnetic interference between a secondary wire and an electronic circuit and suppress the curvature of a wafer even in cases where the secondary wire and the electronic circuit overlap each other, and to reduce the risk of occurrence of chipping in a dicing step.

In order to solve the foregoing problems, a semiconductor device according to the present embodiment is a semiconductor device including: a semiconductor chip provided with an electrode pad; a lower insulating layer, covering the semiconductor chip, which is provided with an opening via which the electrode pad is partially exposed; a secondary wire including (i) a pad section for making an electrical connection to the electrode pad by making contact with an exposed portion of the electrode pad, (ii) a land section including an external connection terminal for making an electrical connection between the electrode pad and an external circuit provided outside of the semiconductor device, and (iii) a wiring section for making an electrical connection between the pad section and the land section; and an upper insulating layer, covering the secondary wire, which is provided with an opening via which at least the external connection terminal of the land section of the secondary wire is exposed, at least the wiring section of the secondary wire being provided on the lower insulating layer, a total thickness of insulating layers, provided in a secondary-wire-free area excluding a secondary-wire-containing area where at least the wiring section of the secondary wire is provided, which include at least the lower insulating layer being less than a total thickness of the lower insulating layer and the upper insulating layer in the secondary-wire-containing area, the semiconductor chip having an edge extending further outward than an edge of the upper insulating layer in an extending direction of a surface of the semiconductor chip on which the electrode pad is provided.

In other words, in order to solve the foregoing problems, a semiconductor device according to the present embodiment can be interpreted as being a semiconductor device including: a semiconductor chip provided with an electrode pad; a lower insulating layer, covering the semiconductor chip, which is provided with an opening via which the electrode pad is partially exposed; a secondary wire including (i) a pad section for making an electrical connection to the electrode pad by making contact with an exposed portion of the electrode pad, (ii) a land section including an external connection terminal for making an electrical connection between the electrode pad and an external circuit provided outside of the semiconductor device, and (iii) a wiring section for making an electrical connection between the pad section and the land section; and an upper insulating layer, covering the secondary wire, which is provided with an opening via which at least the external connection terminal of the land section of the secondary wire is exposed, at least the wiring section of the secondary wire being provided on the lower insulating layer, a total thickness of insulating layers, provided in a secondary-wire-free area excluding a secondary-wire-containing area where at least the wiring section of the secondary wire is provided, which include at least the lower insulating layer being less than a total thickness of the lower insulating layer and the upper insulating layer in the secondary-wire-containing area, the upper insulating layer being absent from an area placed at not more than a predetermined distance from an edge of the semiconductor chip in an extending direction of a surface of the semiconductor chip on which the electrode pad is provided.

It should be noted, in this specification, that the "edge of the semiconductor chip" means (i) the edge of a semiconductor chip separated from a wafer and (ii) that part of a semiconductor chip yet to be separated from a wafer which becomes the edge of the semiconductor chip when the semiconductor chip is separated later from the wafer.

According to the foregoing arrangement, in cases where the insulating layers including the upper insulating layer are made of organic matter whose coefficient of liner expansion is larger than the coefficient of liner expansion of inorganic matter, the insulating layers including at least the lower insulating layer are formed more thinly in the secondary-wire-free area than in the secondary-wire-containing area. It should be noted that the secondary-wire-free area means an area, excluding the area (secondary-wire-containing area) where at least the wiring section of the secondary wire is provided, where it is necessary to protect the secondary wire and suppress the electromagnetic interference. The insulating layers made of organic matter whose coefficient of liner expansion is large are formed more thinly in the secondary-wire-free area than in the secondary-wire-containing area, so that the curvature of a wafer can be better suppressed as compared with a conventional semiconductor device. Further, this makes it possible that the lower insulating layer is formed so thickly as to have a thickness minimally required for suppression of the electromagnetic interference.

Therefore, even in the case of overlap between a secondary wire and an electronic circuit of the semiconductor chip, the arrangement brings about an effect of suppressing electromagnetic interference between the secondary wire and the electronic circuit and suppressing the curvature of a wafer. Further, the suppression of the curvature of the wafer brings about an effect of suppressing a change in electrical characteristics of the semiconductor device.

Patent Document 2 (Japanese Unexamined Patent Application Publication No. 347471/2003 (Tokukai 2003-347471; published on Dec. 5, 2003) discloses an arrangement in which a warpage suppressing groove is provided in an appropriate portion of a semiconductor device including a wafer and a resin layer covering a part of the wafer.

However, the technique disclosed in Patent Document 2 is merely arranged such that the warpage suppressing groove is locally provided, for example, by notching a part of the thickness direction of an insulating resin layer (lower insulating layer). Therefore, in order to obtain a sufficiently great wafer-curvature suppressing effect in cases where the insulating layer is made of organic matter, it is necessary to provide a large number of such warpage suppressing grooves. Accordingly, the technique disclosed in Patent Document 2 suffers from such a problem that a sufficiently great wafer-curvature suppressing effect cannot be obtained without complicating the structure of the semiconductor device. For example, since it is necessary that a rewiring layer (secondary wire) be surely protected by a sealing resin layer (upper insulating layer), it is not preferable that the sealing resin layer in an area where the rewiring layer is provided be provided with a notch or a groove. Formation of a notch or a groove causes a crack in the sealing resin layer on the rewiring layer, thereby possibly causing corrosion of the rewiring layer. In order to obtain a wafer-curvature suppressing effect with use of the technique disclosed in Patent Document 2, it is conceivable, as shown in FIG. 4 of Patent Document 2, that the notches or grooves are provided in a reticular pattern or concentrically across substantially the entire surface of the semiconductor device. However, the arrangement cannot prevent the notches or grooves from traversing the area where the rewiring layer is provided, thereby easily causing corrosion of the rewiring layer.

Further, such a warpage suppressing groove is formed by laser exposure or a lithography step. However, in cases where the warpage suppressing groove is formed by laser exposure, the step of forming the warpage suppressing groove is made very cumbersome and complicated. Further, in cases where the warpage suppressing groove is formed by a lithography step, the warpage suppressing groove is in a very complicated pattern, so that the step of forming the warpage suppressing groove is made very cumbersome and complicated. That is, the technique disclosed in Patent Document 2 suffers from such a problem that it is necessary to take very cumbersome and complicated manufacturing steps, because a sufficiently great wafer-curvature suppressing effect is obtained by complicating the structure of the semiconductor device. As shown in FIG. 4 of Patent Document 2, in order to form a notch or a groove in the sealing resin layer, it is necessary to very strictly set the allowable range of laser conditions and lithography conditions in each of an area containing the rewiring layer and an area free of the rewiring layer. This is because it is necessary to form a notch or a groove deeply in order to prevent the rewiring layer being exposed from the sealing resin layer and maximize the effect of suppressing the curvature of a wafer. Further, generally, in cases where the sealing resin layer has bases that vary from one area to another, i.e., in cases where Patent Document 2 has an area whose base is a rewiring layer and an area whose base is not a secondary wire, variations in the surface roughness of the bases, glossiness, and the like among the areas cause variations among the areas in the photosensitivity of the resin layers formed on the surfaces. This imposes stricter restrictions on the allowable range of lithography conditions. Further, in cases where the rewiring layer is formed by electrolytic plating, electroless plating, or the like, it is difficult to keep the depth of a notch or a groove constant. This is because it is necessary to consider the surface condition (particle size, glossiness, and the like) of a rewiring layer on the entire surface of a wafer, the number of wafers to be processed, a change in plating liquid with age, a change in photosensitive resin with age, and the like and it is very difficult to keep them constant.

Meanwhile, in the semiconductor device according to the present embodiment, the insulating layers are formed more thinly in the whole secondary-wire-free area than in the secondary-wire-containing area. Therefore, in cases where the lower insulating layer and the upper insulating layer are made of organic matter, the semiconductor device can bring about a sufficiently great wafer-curvature suppressing effect with a very simple structure. Further, this makes it possible to obtain a sufficiently great wafer-curvature suppressing effect by taking very simple steps as described below in manufacturing the semiconductor device.

Furthermore, in the semiconductor device according to the present embodiment, the semiconductor chip has an edge extending further outward than an edge of the upper insulating layer (at least a part of the upper insulating layer) in an extending direction of a surface of the semiconductor chip on which the electrode pad is provided, i.e., in a direction parallel to the surface on which the electrode pad is provided. This makes it possible to remove an insulating layer, provided in an area around a scribe line, which possibly causes chipping in a dicing step. This brings about an effect of reducing the risk of occurrence of chipping in the dicing step.

Incidentally, in the case of formation of multiple layers of secondary wires, i.e., in the case of formation of multiple layers of secondary wires for which an inferior insulating layer has different thicknesses, it is necessary to form one or more insulating layers (i.e., middle insulating layers) be provided between a lower insulating layer below the lowermost secondary wire and each of the multiple layers of secondary wires. Therefore, in the case of formation of multiple layers of secondary wires, it is necessary that an insulating layer be formed so thickly that a large numbers of layers of secondary wires can be formed. For example, in the case of formation of two layers of secondary wires, it is necessary to provide one or more middle insulating layers in addition to the lower insulating layer and the upper insulating layer. In the case of formation of three layers of secondary wires, it is necessary to provide two groups of one or more middle insulating layers. As a result, the presence of an inferior insulating layer serving as a middle insulating layer causes a problem with an increase in the curvature of wafer.

In order to solve the foregoing problems, a semiconductor device according to the present embodiment is a semiconductor device including: a semiconductor chip provided with an electrode pad; a lower insulating layer, covering the semiconductor chip, which is provided with an opening via which the electrode pad is partially exposed; multiple layers of secondary wires each of which has a part electrically connected to the electrode pad by making contact with an exposed portion of the electrode pad and further includes a wiring section provided so as to be run from the electrode pad onto an inferior insulating layer including at least the lower insulating layer, the inferior insulating layer having different thicknesses for the multiple layers of secondary wires; and a superior insulating layer covering at least a wiring section of an uppermost one of the multiple layers of secondary wires, a total thickness of insulating layers, provided in a secondary-wire-free area excluding an area where at least a wiring section of any one of the multiple layers of secondary wires is provided, which include at least the lower insulating layer being less than a total thickness of the inferior insulating layer and the superior insulating layer in a secondary-wire-containing area where at least the wiring section of the uppermost secondary wire is provided.

According to the foregoing arrangement, in cases where the insulating layers including the superior insulating layer are made of organic matter whose coefficient of liner expansion is larger than the coefficient of liner expansion of inorganic matter, the insulating layers are formed more thinly in the secondary-wire-free area than in the secondary-wire-containing area. It should be noted that the secondary-wire-free area means an area, excluding the area where the wiring section of at least any one of the multiple layers of secondary wires is provided, where it is necessary to protect the multiple layers of secondary wires for which the inferior insulating layer has different thicknesses and suppress the electromagnetic interference. Further, the secondary-wire-containing area means an area where at least the wiring section of the uppermost secondary wire is provided. The insulating layers made of organic matter whose coefficient of liner expansion is large are formed more thinly in the secondary-wire-free area than in the secondary-wire-containing area, so that the curvature of a wafer can be better suppressed as compared with a conventional semiconductor device. Further, this makes it possible that the lower insulating layer as well as the inferior insulating layer is formed so thickly as to have a thickness minimally required for suppression of the electromagnetic interference.

Therefore, even in the case of overlap between a specific secondary wire and an electronic circuit of the semiconductor chip, the arrangement brings about an effect of suppressing electromagnetic interference between the specific secondary wire and the electronic circuit and suppressing the curvature of a wafer. Further, the suppression of the curvature of the wafer brings about an effect of suppressing a change in electrical characteristics of the semiconductor device.

In order to solve the foregoing problems, a semiconductor device according to the present embodiment is a semiconductor device including: a semiconductor chip provided with an electrode pad; a lower insulating layer, covering the semiconductor chip, which is provided with an opening via which the electrode pad is partially exposed; a secondary wire having a part electrically connected to the electrode pad by making contact with an exposed portion of the electrode pad and further including a wiring section provided so as to be run onto the lower insulating layer; and an upper insulating layer covering at least the wiring section of the secondary wire, a total thickness of insulating layers, provided in a secondary-wire-free area excluding at least a secondary-wire-containing area where the wiring section of the secondary wire is provided, which include at least the lower insulating layer being less than a total thickness of the lower insulating layer and the upper insulating layer in the secondary-wire-containing area, the semiconductor chip having an edge extending further outward than an edge of the upper insulating layer in an extending direction of a surface of the semiconductor chip on which the electrode pad is provided.

In other words, in order to solve the foregoing problems, a semiconductor device according to the present embodiment can be interpreted as being a semiconductor device including: a semiconductor chip provided with an electrode pad; a lower insulating layer, covering the semiconductor chip, which is provided with an opening via which the electrode pad is partially exposed; a secondary wire having a part electrically connected to the electrode pad by making contact with an exposed portion of the electrode pad and further including a wiring section provided so as to be run onto the lower insulating layer; and an upper insulating layer covering at least the wiring section of the secondary wire, a total thickness of insulating layers, provided in a secondary-wire-free area excluding at least a secondary-wire-containing area where the wiring section of the secondary wire is provided, which include at least the lower insulating layer being less than a total thickness of the lower insulating layer and the upper insulating layer in the secondary-wire-containing area, the upper insulating layer being absent from an area placed at not more than a predetermined distance from an edge of the semiconductor chip in an extending direction of a surface of the semiconductor chip on which the electrode pad is provided.

According to the foregoing arrangement, in cases where the insulating layers including the upper insulating layer are made of organic matter whose coefficient of liner expansion is larger than the coefficient of liner expansion of inorganic matter, the insulating layers are formed more thinly in the secondary-wire-free area than in the secondary-wire-containing area. It should be noted that the secondary-wire-free area means an area, excluding at least the area where the wiring section of the secondary wire is provided, where it is necessary to protect the secondary wire and suppress the electromagnetic interference. Further, the secondary-wire-containing area means an area where at least the wiring section of the secondary wire is provided. The insulating layers made of organic matter whose coefficient of liner expansion is large are formed more thinly in the secondary-wire-free area than in the secondary-wire-containing area, so that the curvature of a wafer can be better suppressed as compared with a conventional semiconductor device. Further, this makes it possible that the lower insulating layer is formed so thickly as to have a thickness minimally required for suppression of the electromagnetic interference.

Therefore, even in the case of overlap between a secondary wire and an electronic circuit of the semiconductor chip, the arrangement brings about an effect of suppressing electromagnetic interference between the secondary wire and the electronic circuit and suppressing the curvature of a wafer. Further, the suppression of the curvature of the wafer brings about an effect of suppressing a change in electrical characteristics of the semiconductor device.

Furthermore, in the semiconductor device according to the present embodiment, the semiconductor chip has an edge extending further outward than an edge of the upper insulating layer (at least a part of the upper insulating layer) in an extending direction of a surface of the semiconductor chip on which the electrode pad is provided, i.e., in a direction parallel to the surface on which the electrode pad is provided. This makes it possible to sufficiently remove an insulating layer, formed in an area around a scribe line, which possibly causes chipping in a dicing step. This brings about an effect of reducing the risk of occurrence of chipping in the dicing step.

Additional features, and strengths of the present embodiment will be made clear by the description below. Further, the advantages of the present embodiment will be evident from the following explanation in reference to the drawings.

BRIEF DESCRIPTION OF THE DRAWINGS

FIG. 2(a), showing another embodiment is a plan view showing an arrangement of a semiconductor device.

FIG. 2(b) is a cross-sectional view taken along the line 2A-2B of FIG. 2(a).

FIG. 5(a), showing another embodiment is a plan view showing an arrangement of a semiconductor device.

FIG. 5(b) is a cross-sectional view taken along the line 5A-5B of FIG. 5(a).

FIG. 6(a), showing another embodiment is a plan view showing an arrangement of a semiconductor device.

FIG. 6(b) is a cross-sectional view taken along the line 6A-6B of FIG. 6(a).

FIG. 7(a), showing another embodiment is a plan view showing an arrangement of a semiconductor device.

FIG. 7(b) is a cross-sectional view taken along the line 7A-7B of FIG. 7(a).

FIG. 10(a), showing an embodiment is a plan view showing an arrangement of a conventional semiconductor device.

FIG. 10(b) is a cross-sectional view taken along the line 10A-10B of FIG. 10(a).

FIG. 18(a), showing another embodiment is a plan view showing an arrangement of a semiconductor device.

FIG. 18(b) is a cross-sectional view taken along the line 18A-18B of FIG. 18(a).

DESCRIPTION OF THE EMBODIMENTS

Figure 1:
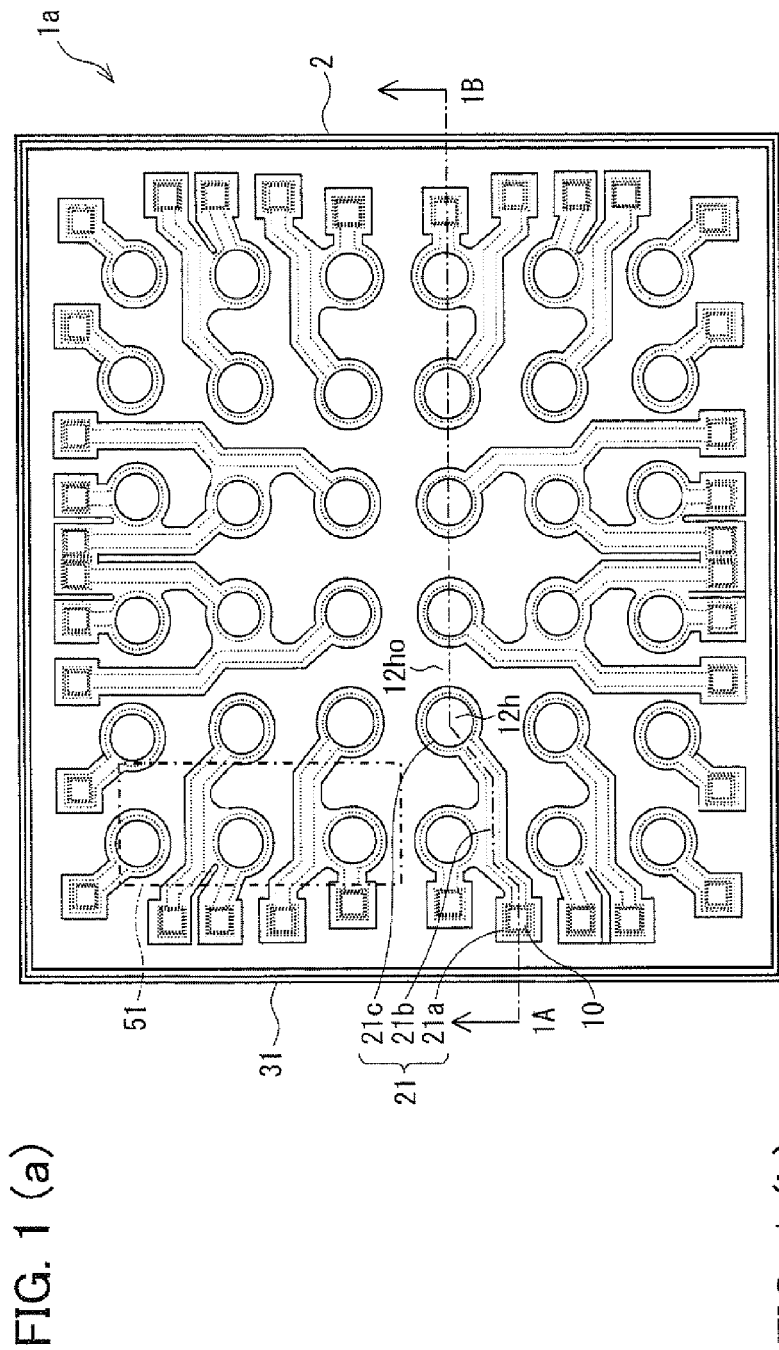
FIG. 1(a), showing an embodiment is a plan view showing an arrangement of a semiconductor device.
FIG. 1(b) is a cross-sectional view taken along the line 1A-1B of FIG. 1(a).
Figure 1:
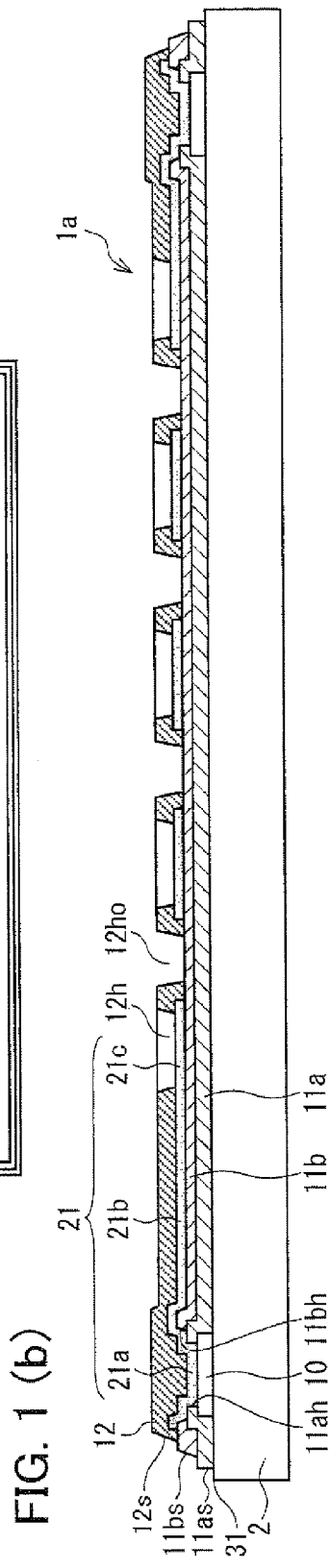

The following describes a conventional semiconductor device with reference to FIGS. 10(a) and 10(b).

FIG. 10(a) is a plan view of a conventional semiconductor device 100. Further, FIG. 10(b) is a cross-sectional view taken along the line 10A-10B of FIG. 10(a).

The semiconductor device 100 of FIGS. 10(a) and 10(b) has a semiconductor chip 101 provided with electrode pads 102, an insulating layer 111a having an opening 111ah, an insulating film 112 having an opening 112h, and secondary wires 121. Each of the secondary wires 121 includes a pad section 121a (see FIG. 10(b)), a wiring section 121b, and a land section 121c. Further, the semiconductor chip 101 has an electronic circuit section 151 provided on a circuit-forming surface on which the electrode pads 102 are provided. Furthermore, in FIG. 10(a), A1, A2, and A3 indicate a land section 121c that overlaps the electronic circuit section 151, a land section 121c that does not overlap the electronic circuit section 151, and a wiring section 121b that does not overlap the electronic circuit section 151, respectively.

As evidenced by FIG. 10(a), the wiring section A3 is disposed so as to circumvent the electronic circuit section 151 not to overlap the electronic circuit section 151. Further, the wiring sectionA3 connects the land sectionA2 to an electrode pad 102.

Specifically, as shown in FIG. 10(b), the semiconductor device 100 is has the following arrangement.

That is, the semiconductor chip 101 has the electrode pads 102 and the insulating layer 111a provided on the circuit-forming surface thereof. It should be noted that the insulating layer 111a has the opening 111ah via which an electrode pad 102 is partially exposed.

Further, the secondary wire 121 is provided on top of the electrode pad 102 and the insulating layer 111a. Specifically, the pad section 121a of the secondary wire 121 is provided on top of the electrode pad 102 so as to make contact with the electrode pad 102 and bury the opening 111ah. Further, the wiring section 121b and the land section 121c are provided on top of the insulating layer 111a so as to make contact with the insulating layer 111a.

Furthermore, the insulating film 112 is provided on the secondary wire 121. The insulating film 112 is arranged so as to have the opening 112h provided above the land section 121c.

Incidentally, the semiconductor chip 101 of FIGS. 10(a) and 10(b) is provided with a plurality of peripherally-disposed electrode pads 102. Moreover, a total of 36 land sections 121c serving as external connection terminals are provided in an area surrounded by the electrode pads 102 (i.e., in an area that is closer to the center of the semiconductor chip than is each of the electrode pads 102).

It should be noted that the maximum number of terminals, i.e., the maximum number of land sections 121c in the semiconductor chip 101 is determined in the following manner.

That is, as the pitch between one land sections 121c and another is narrowed, such problems occurs as an increase in the cost of a member such as a substrate on which to mount the semiconductor chip 101 (such a substrate being hereinafter referred to as "mounting substrate") and a technical difficulty of mounting the semiconductor chip 101. Therefore, in consideration of mountability, the maximum number of terminals is determined in accordance with the size of the semiconductor chip 101. That is, the maximum number of terminals is the maximum possible number of land sections 121c that can be disposed in cases where the land sections 121c are disposed in a matrix manner on the circuit-forming surface of the semiconductor chip 101 and the terminal pitch between neighboring land sections 121c is as short a distance as possible, i.e., a minimum terminal pitch to such an extent that the semiconductor chip 101 can be mounted (i.e., to such an extent that problems with an increase in the cost of a mounting substrate or technical limits of manufacture of a mounting substrate and with mounting of the semiconductor chip 101 do not occur, or within the manufacturing limits of the pitch between terminals in the semiconductor device). At present, the minimum terminal pitch allowed, for example, by mounting with a reflow furnace is approximately 0.4 mm. That is, for example, in cases where the circuit-forming surface of the semiconductor chip 101 is in the shape of a square whose sides are 2.5 mm long, the maximum number of terminals is supposed to be 6×6=36.

However, on the semiconductor chip 101, the wiring sections A3 cannot be run to the land sections A1 that overlap the electronic circuit 151. Therefore, the maximum number of terminals is 33, which is obtained by subtracting, from the 36 terminals, the three terminals indicated by the land sections A1 in FIG. 10(a).

It should be noted here that in cases where a total of 36 external connections terminals are disposed on the semiconductor chip 101 of FIG. 10(a) so as not to overlap the electronic circuit section 151, the land sections A1 are substituted by land sections A2 as shown in FIG. 10(a).

However, in this case, as evidenced by FIG. 10(a), the terminals are placed at extremely narrow pitches around the land sections A2.

Further, even in cases where the terminals are placed at extremely narrow pitches, a secondary wire for causing a land section A2 to be conductive, i.e., a wiring section A3 of a secondary wire 121 needs to be formed around the periphery of electrode pads 102. For example, it is necessary to form two wiring sections A3 around the periphery of electrode pads 102 on the semiconductor chip 101 (see FIG. 10(a)).

Generally, in cases where a secondary wire is formed by a plating method, it is necessary to ensure that a wiring section A3 has a width of at least approximately 15 μm and that one wiring section A3 is placed at a distance of at least approximately 15 μm from another, so that a portion around the periphery of an electrode pad needs to have a width of at least approximately 75 μm.

Furthermore, when a secondary wire approaches a scribe line (i.e., a line along which semiconductor chips are parted from each other), such a problem occurs that the secondary wire is made susceptible to an electrically open defect by being affected by chipping in a dicing step of separating an semiconductor device from a wafer.

Further, in cases where the electronic circuit section 151 has a wide area, the number of secondary wires to be formed so as to circumvent the electronic circuit section 151 increases, so that it is necessary to ensure a large space around the periphery of an electrode pad 102. This naturally causes the width of a wiring section A3 to be very narrow.

It should be noted here that another example of the arrangement for reducing the influence of electromagnetic interference is an arrangement in which an insulating layer underneath a secondary wire is formed thickly on a circuit-forming surface of a semiconductor chip including an electronic circuit. Such an arrangement makes it possible to suppress the electromagnetic interference without forming a secondary wire that circumvents the electronic circuit section.

In the case of such an arrangement, it is preferable for the following two reasons that the insulating layer underneath the secondary wire be made of an organic material.

That is, the first reason is that whereas an organic film such as a silicon oxide film or a nitride film has a relative permittivity of approximately 4 or 7, an organic film has a smaller relative permittivity (e.g., a polyimide film has a relative permeability of approximately 3.5; a PBO (polybenzooxazole) or BCB (benzocyclobutene) film has a relative permeability of approximately 3). Moreover, the second reason is that an organic insulating layer can be easily formed so as to have a thickness that varies from several micrometers to several hundred micrometers, depending on manufacturing processes such as a spin-coating method, a printing method, and lamination of an organic film.

Further, it is also necessary to form an insulating layer on a secondary wire for the purpose of protecting the secondary wire against external chemical damage and external physical damage. Especially, in cases where an external connection terminal such as a solder bump is provided on a part of a secondary wire, it is necessary to form a solder limiting layer as an insulating layer to prevent an outflow of solder on the secondary wire. Since it is necessary to compensate for a step between a protecting layer (solder limiting layer) of a secondary wire and a plated wire in accordance with the thickness of the plated wire, it is usual to form the protecting layer by an insulating layer made of organic matter that can be easily shaped into a thick film.

However, in cases where organic insulating layers are formed on the top and bottom of a secondary wire across the entire surface of a wafer on which semiconductor chips are formed, such a problem arises that the curvature of the wafer increases.

The above problem will be described below in detail.

Generally, each material forming a semiconductor device has unique properties; therefore, different materials differ from one another in coefficient of linear expansion, coefficient of elasticity, and the like.

Assume here that the different materials are joined at an extraordinary temperature, e.g., at a high temperature of not less than 300, or that a first material is firmly fixed to a second material by coating the second material with the first material and then hardening the first material.

In this case, when the different materials return to an ordinary temperature after the joining (fixing), such a phenomenon occurs that the material of the larger coefficient of linear expansion stretches the material of the smaller coefficient of liner expansion toward the center of the joint surface. The phenomenon is caused by attraction that becomes stronger in a peripheral portion of the joint surface as the joint surface covers a larger amount of space. Further, curvature by the attraction becomes larger as the material of the smaller coefficient of liner expansion becomes thinner, because the attraction is met with lower durability as the material of the smaller coefficient of liner expansion becomes thinner.

Moreover, the curvature of a wafer occurs when the attraction is generated in the wafer, between the wafer and a material joined to the wafer, or between different materials joined to each other on the wafer.

Generally, the wafer is made of inorganic matter (e.g., silicon). On the other hand, the lower insulating layer formed at the bottom of the secondary wire and the upper insulating layer formed on the top of the secondary wire are made of organic matter. Moreover, the coefficient of liner expansion of inorganic matter is smaller than the coefficient of liner expansion of organic matter. For example, the coefficient of liner expansion of organic matter such as PBO or polyimide usually ranges from 30 ppm/K to 60 ppm/K. On the other hand, as compared with the coefficient of liner expansion of organic matter, the coefficient of liner expansion of inorganic matter is small; for example, silicon, copper, nickel, gold, and chromium have coefficients of liner expansion of 2.4 ppm/K, 16 ppm/K, 13 ppm/K, 14 ppm/K, and 8.4 ppm/K, respectively. It should be noted here that metal materials such as copper, nickel, gold, and chromium can be used as materials for secondary wires.

Thus, the degree of the curvature of the wafer becomes larger as the wafer becomes thinner, and becomes larger as the lower insulating layer and/or the upper insulating layer become(s) thicker.

See an example where, in the case of a silicon wafer whose circuit-forming surface has a diameter of 8 inches, PBO layers having openings formed in areas around scribe lines are formed as a lower insulating layer and an upper insulating layer, respectively, and secondary wires are formed from copper (Cu). In this case, when the thickness of the wafer is 300 μm to 725 μm, the curvature of the wafer is not more than several millimeters. However, as soon as the thickness of the wafer becomes not more than 300 μm, the curvature rapidly increases. In cases where the thickness of the wafer is 150 μm, the curvature of the wafer is approximately 10 mm.

Usually, when the curvature of the wafer is not less than several millimeters in a dicing step or the like, there is a rise in the frequency of transport errors and wafer breakages in semiconductor devices.

Furthermore, a semiconductor chip having an analog circuit serving as an electronic circuit section suffers from a problem with a change in electrical characteristics due to an increase in membrane stress on the surface. The main possible reason for this is as follows: the membrane stress widens the lattice pitch of the semiconductor, thereby facilitating the movement of holes and electrons.

The following describes a semiconductor device and a method for manufacturing a semiconductor device, both of which make it possible to suppress electromagnetic interference between a secondary wire and an electronic circuit section and suppress the curvature of a wafer even in cases where the secondary wire and the electronic circuit section overlap each other, and to reduce the risk of occurrence of chipping in a dicing step.

Embodiment 1

A semiconductor device according to an embodiment will be described below with reference to FIGS. 1(a) and 1(b).

FIG. 1(a), showing an embodiment, is a plan view showing an arrangement of a semiconductor device 1a. Further, FIG. 1(b) is a cross-sectional view taken along the line 1A-1B of FIG. 1(a).

The semiconductor device 1a of FIG. 1(a) includes a semiconductor chip 2 having a circuit-forming surface, having an electronic circuit section (electronic circuit) 51 formed thereon, on which a plurality of peripherally-disposed electrode pads 10 are provided. It should be noted that the semiconductor chip 2 and the semiconductor chips 3 to 9 described below are members having the same functions. The electrode pads 10 make an electrical connection between the electronic circuit section 51 formed on the semiconductor chip 2 and an externally-connected circuit, and are connected via primary wires (not shown) provided inside of the semiconductor chip 2.

On the circuit-forming surface of the semiconductor chip 2, the electrode pads 10 peripherally disposed in an outer portion of the semiconductor chip 2 are electrically connected to external connection terminals via secondary wires 21 electrically connected to the electrode pads 10 in the outer portion of the semiconductor chip 2. Further, each of the secondary wires 21 has a pad section 21a connected to an electrode pad 10, a land section 21c that is used as an external connection terminal, and a wiring section 21 that electrically connects the pad section 21a to the land section 21c. That is, the electrode pad 10 is connected the pad section 21a of the secondary wire 21 on the circuit-forming surface of the semiconductor chip 2, and the pad section 21a is connected via the wiring section 21b of the secondary wire 21 to that land section 21c of the secondary wire 21 which serves as an external connection terminal. This makes it possible to electrically connect the electrode pad 10 to a circuit connected to the land section 21c.

Further provided in an area provided with a secondary wire 21 (first secondary-wire-containing area) and an area therearound is an upper insulating layer 12. The upper insulating layer 12 will be described below in detail.

Provided between the secondary wire 21 and the circuit-forming surface of the semiconductor chip 2 are two lower insulating layers 11a and 11b. The lower insulating layer 11a is made of an oxide film so as to have a thickness of 1 µm, and the lower insulating layer 11b is made of polyimide, which is organic matter, so as to have a thickness of 5 µm.

The lower insulating layer 11a is made of an oxide film because an oxide film is lower in permittivity than a nitride film. However, in cases where the organic lower insulating layer 11b is sufficiently thicker than the lower insulating layer 11a (having a thickness of 1 µm in the present embodiment), e.g., in cases where the lower insulating layer 11b has a thickness of 4 µm or greater, the lower insulating layer 11a exerts a minor influence on the entire semiconductor device 1a. Therefore, in this case, the lower insulating layer 11a may be made of a nitride film having a high permittivity, or may be omitted.

The oxide film serving as the lower insulating layer 11a has an opening 11ah, provided above a back surface of the electrode pad 10 opposite to a surface of the electrode pad 10 in contact with the circuit-forming surface, via which the back surface is partially exposed.

Further, it is preferable that the lower insulating layer 11a have a side wall 11as provided in the vicinity of a scribe line. The semiconductor device 1a of FIG. 1(b) is arranged by the side wall 11as such that the semiconductor chip 2 has an edge 31 extending further outward than the side wall 11as, which serves as an edge of the lower insulating layer 11a, in extending directions of the circuit-forming surface of the semiconductor ship 2 on which the electrode pad 10 is provided (i.e., in a direction across FIG. 1(b) and a direction perpendicular to FIG. 1(b)). That is, the semiconductor device 1a of FIG. 1(b) is arranged such that the lower insulating layer 11a is omitted from that portion of the semiconductor chip 2 which is closer to the edge 31 than is the side wall 11as. It should be noted that the side wall 11as is provided at a distance of approximately 5 µm to 60 µm from the edge 31.

It should be noted here the lower insulating layer 11a is a silicon oxide film or a silicon nitride film. In cases where the wafer (semiconductor chip) is made of silicon, the lower insulating layer 11a is closer in properties (such as hardness and ductility) to the wafer material than is an organic insulating layer. In this case, the influence of chipping on the wafer by the lower insulating layer 11a becomes relatively small. Therefore, the side wall 11as of the lower insulating layer 11a can be omitted by means of an appropriate dicing method, an appropriate dicing blade material, an appropriate dicing condition, and the like.

The formation of the side wall 11as in the vicinity of a dicing line along which the wafer is cut into a plurality of semiconductor chips 2 makes it possible to reduce chipping in a dicing step.

The polyimide, provided as the lower insulating layer 11b on top of the lower insulating layer 11a, which is organic matter has an opening 11bh, provided above the opening 11ah of the lower insulating layer 11a, which is larger in size than the opening 11ah of the lower insulating layer 11a.

Further, it is preferable that, as with the lower insulating layer 11a, the lower insulating layer 11b have a side wall 11bs provided in the vicinity of the scribe line. The side wall 11bs is provided so as to be further inward (i.e., closer to the center of the semiconductor chip 2) than is the side wall 11as with respect to the circuit-forming surface of the semiconductor chip 2, or so as to be in substantially the same position as the side wall 11as. That is, the side wall 11bs is provided above the semiconductor chip 2 so as to be closer to the center of the semiconductor chip 2 than is the side wall 11as. However, since it is necessary to consider how the side wall 11bs is positioned with respect to the secondary wire 21, i.e., since the secondary wire 21 may not be sufficiently protected when the side wall 11bs is provided so as to be too close to the center of the semiconductor chip 2, the side wall 11bs is preferably provided at a distance of approximately 5 µm to 80 µm from the edge 31. It should be noted that the numerical value indicates that the side wall 11bs is positioned at the shortest distance from the edge 31. That is, in an area free of a secondary wire 21, the side wall 11bs may or may not be formed so as to be much closer to the center of the semiconductor chip 2, i.e., so as to be further away from the edge 31. The same applies to the respective side walls 11bs of the semiconductor devices 2 to 9 described below. Moreover, the semiconductor device 1a of FIG. 1(b) is arranged by the side wall 11bs such that the edge 31 extends further outward than the side wall 11bs, which serves as an edge of the lower insulating layer 11b, in the extending directions of the circuit-forming surface of the semiconductor ship 2. That is, the semiconductor device 1a of FIG. 1(b) is arranged such that the lower insulating layer 11b is omitted from that portion of the semiconductor chip 2 which is closer to the edge 31 than is the side wall 11bs.

The further formation of the side wall 11bs in the vicinity of the dicing line makes it possible to reduce chipping in a dicing step and to suppress the curvature of the wafer.

It should be noted that the present embodiment is arranged such that the lower insulating layers 11a and 11b protect the semiconductor chip 2.

The secondary wire 21, which has a base material (not shown), the pad section 21a, the wiring section 21, and the land section 21c, is provided so as to have a thickness of 10 μm.

In cases where the secondary wire 21 is made of Cu and the electrode pad 10 is made of an alloy of aluminum and silicon (Al—Si) or an alloy of aluminum and copper (Al—Cu), the base material of the secondary wire 21 is titanium (Ti), an alloy of titanium and tungsten (Ti—W), chromium, or the like. The base material of the secondary wire 21 functions as a barrier metal layer to the electrode pad 10 and functions as a layer that adheres to the lower insulating layer 11b.

Further, the upper insulating layer 12 is provided on the secondary wire 21 so as to have a thickness of approximately 8 μm. Even in cases where the secondary wire 21 has a step (of 10 μm in the present embodiment), the upper insulating layer 12 needs to surely protect the secondary wire 21 by sufficiently covering upper and side surfaces of the secondary wire 21. Therefore, it is preferable that the upper insulating layer 12 be made of a material that can be easily formed into a thick film. Further, in cases where the secondary wire 21 is made of Cu, the upper insulating layer 12 may be made of any organic material that does not react chemically with Cu. However, it is preferable that the upper insulating layer 12 be made of PBO, which is relatively low in permittivity and water absorbency among organic materials and high in tensile elongation and heat resistance.

It should be noted that the present embodiment is not arranged such that the upper insulating layer 12 is made of the polyimide of which the lower insulating layer 11b is made of. This is because common polyimide has such a problem that a film made thereof becomes fragile by reacting chemically with Cu when hardened. However, in recent years, a large number of polyimide materials, such as a polyimide material obtained by imidizing polyamic acid varnish, that do not react chemically with Cu have been developed. Such a polyimide material can be used as the upper insulating layer 12. Of course, in cases where at least the surfaces (e.g., upper and side surfaces) of the secondary wire 21 are made of a conductive material other than Cu, the upper insulating layer 12 may be made of common polyimide.

As with the lower insulating layers 11a and 11b, the upper insulating layer 12 has a side wall (edge of the upper insulating layer) 12s provided in the vicinity of the scribe line. The side wall 12s is provided above the semiconductor chip 2 so as to be closer to the center of the semiconductor chip 2 than are the side walls 11as and 11bs, or so as to be in substantially the same position as the side wall 11as or 11bs. However, since it is necessary to consider how the side wall 12s is positioned with respect to the secondary wire 21, i.e., since the secondary wire 21 may not be sufficiently protected when the side wall 12s is provided so as to be too close to the center of the semiconductor chip 2, the side wall 12s is preferably provided at a distance of approximately 5 μm to 100 μm from the edge 31. However, in cases where the upper insulating layer 12 is provided in the first secondary-wire-containing area and the area therearound, the side wall 12s may be provided at a distance of approximately more than 100 μm from the edge 31. In this case, the side wall 12s is preferably provided at a distance of approximately 5 μm to 500 μm from the edge 31. It should be noted that the numerical value indicates that the side wall 11bs is positioned at the shortest distance from the edge 31. That is, in an area free of a secondary wire 21, the side wall 12s may be formed so as to be much closer to the center of the semiconductor chip 2, i.e., so as to be further away from the edge 31. Alternatively, in an area free of a secondary wire 21, the side wall 11bs may not be formed in some positions. The same applies to the respective side walls 12s of the semiconductor devices 2 to 9 described below.

Figure 11:
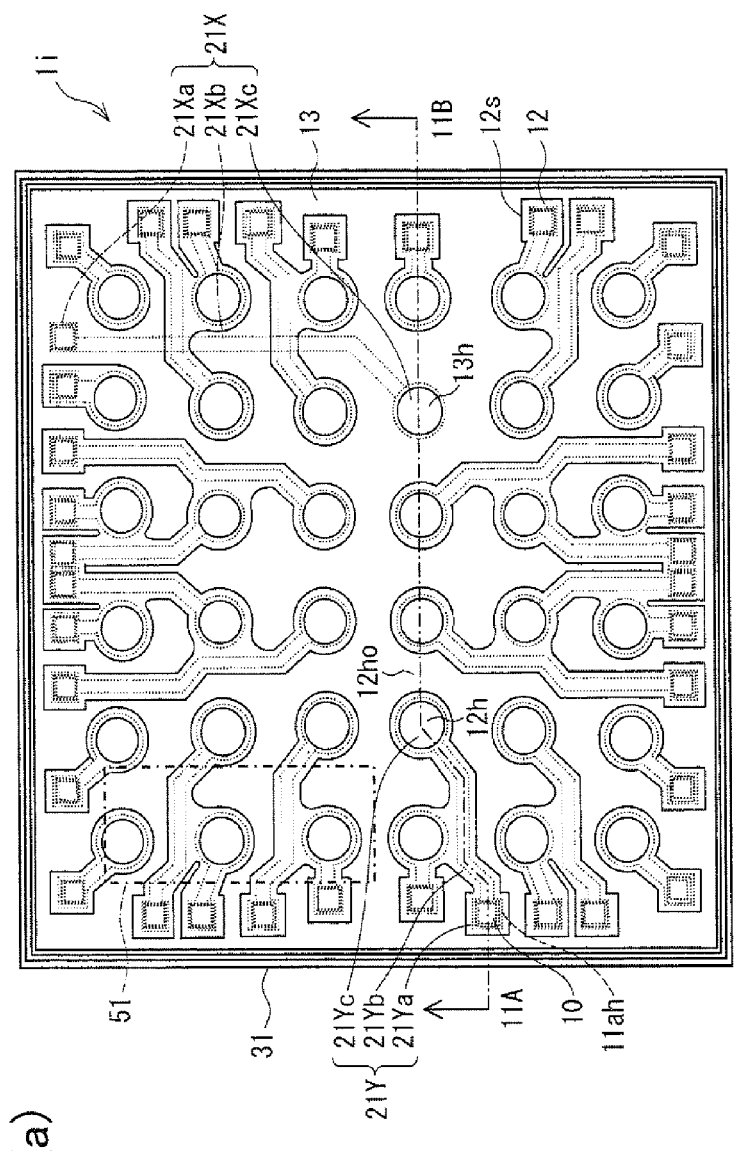
FIG. 11(a), showing another embodiment is a plan view showing an arrangement of a semiconductor device.
FIG. 11(b) is a cross-sectional view taken along the line 11A-11B of FIG. 11(a).
Figure 11:
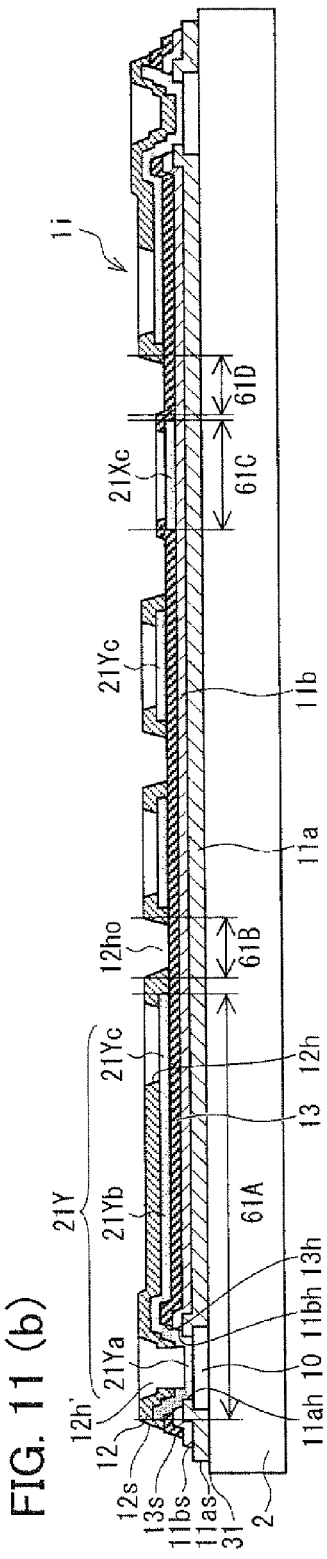
Figure 12:
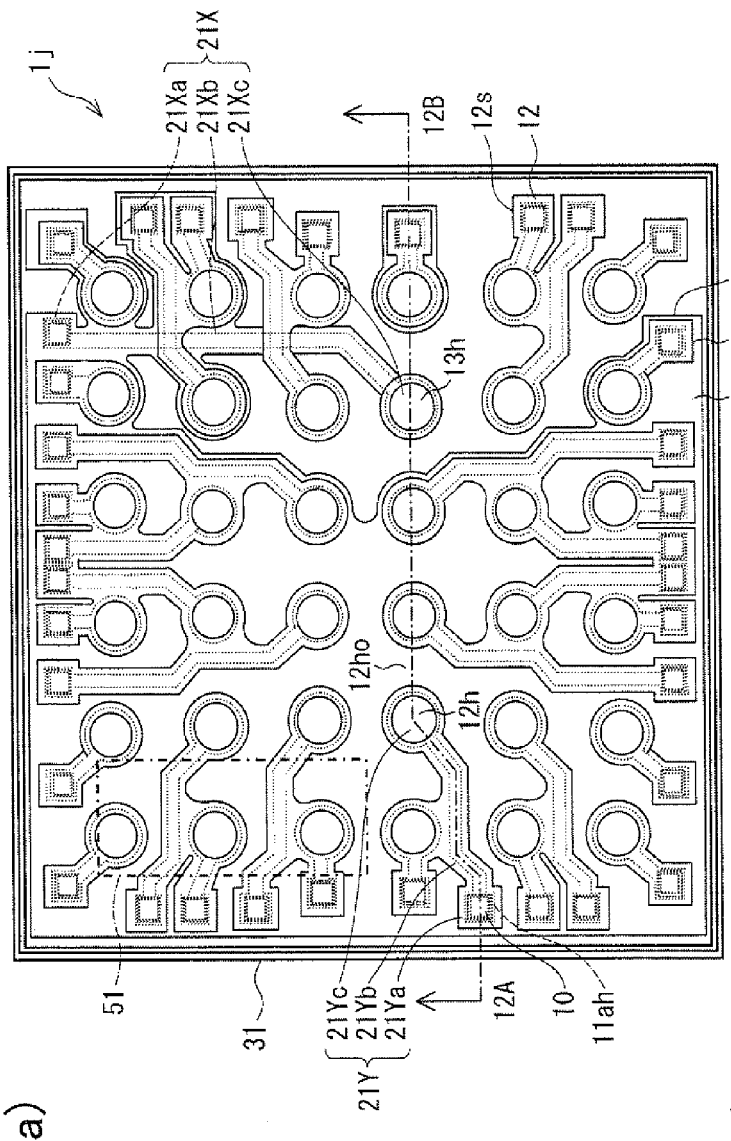
FIG. 12(a), showing another embodiment is a plan view showing an arrangement of a semiconductor device.
FIG. 12(b) is a cross-sectional view taken along the line 12A-12B of FIG. 12(a).
Figure 12:
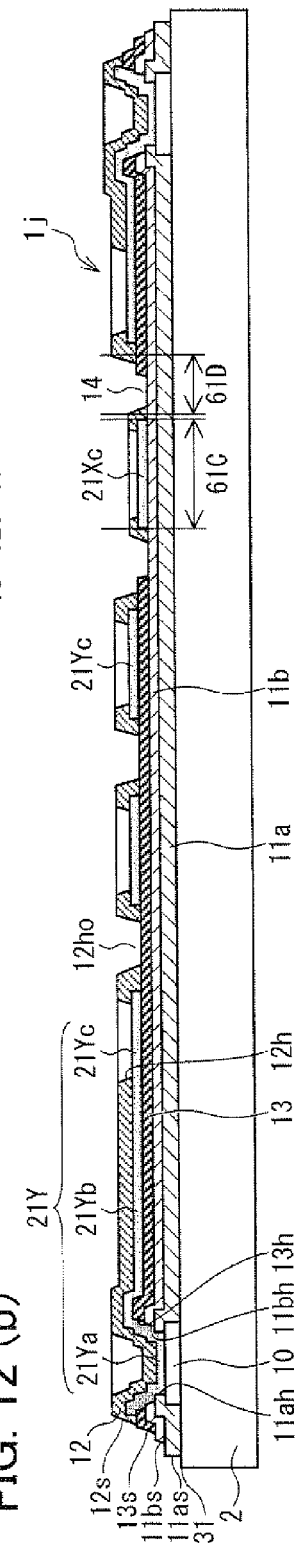
Figure 13:
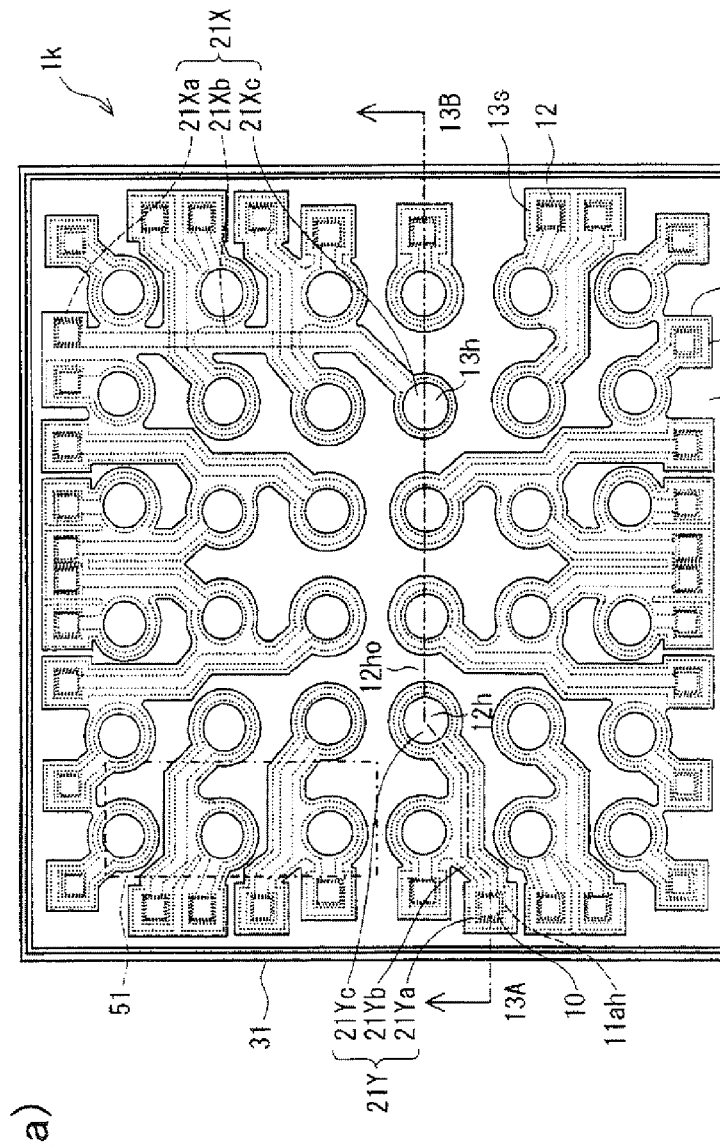
FIG. 13(a), showing another embodiment is a plan view showing an arrangement of a semiconductor device.
FIG. 13(b) is a cross-sectional view taken along the line 13A-13B of FIG. 13(a).
Figure 13:
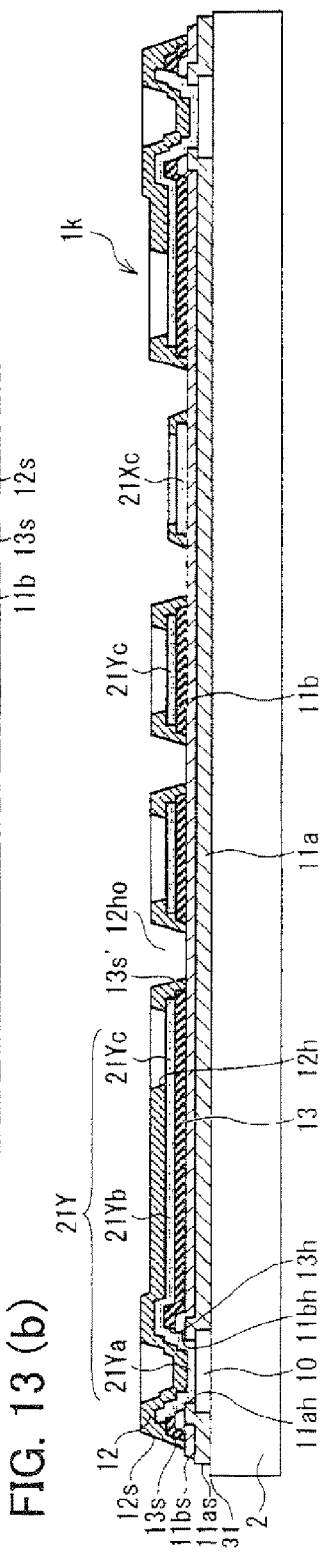
Figure 14:
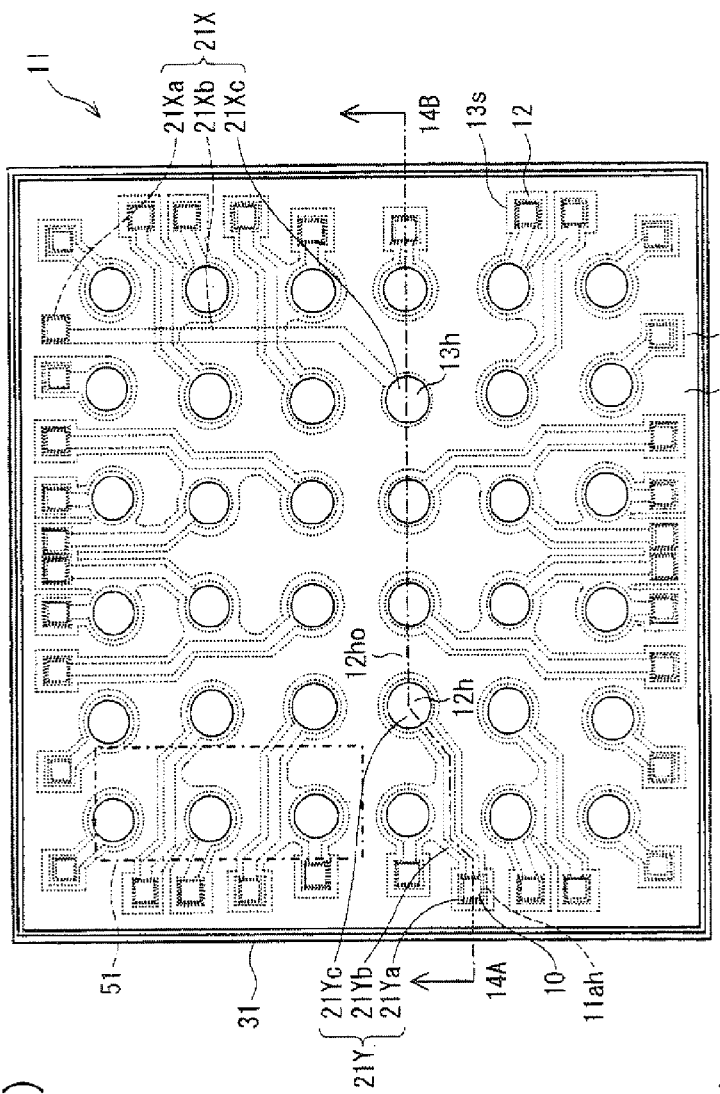
FIG. 14(a), showing another embodiment is a plan view showing an arrangement of a semiconductor device.
FIG. 14(b) is a cross-sectional view taken along the line 14A-14B of FIG. 14(a).
Figure 14:
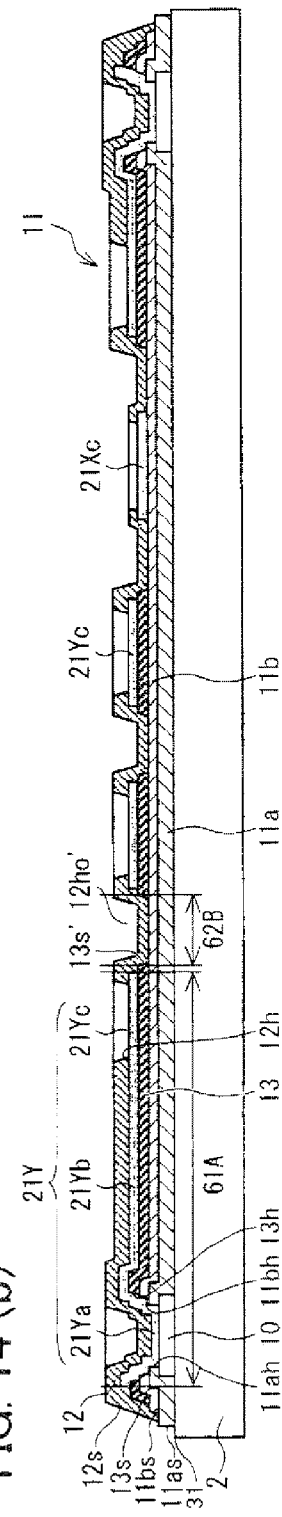
Figure 15:
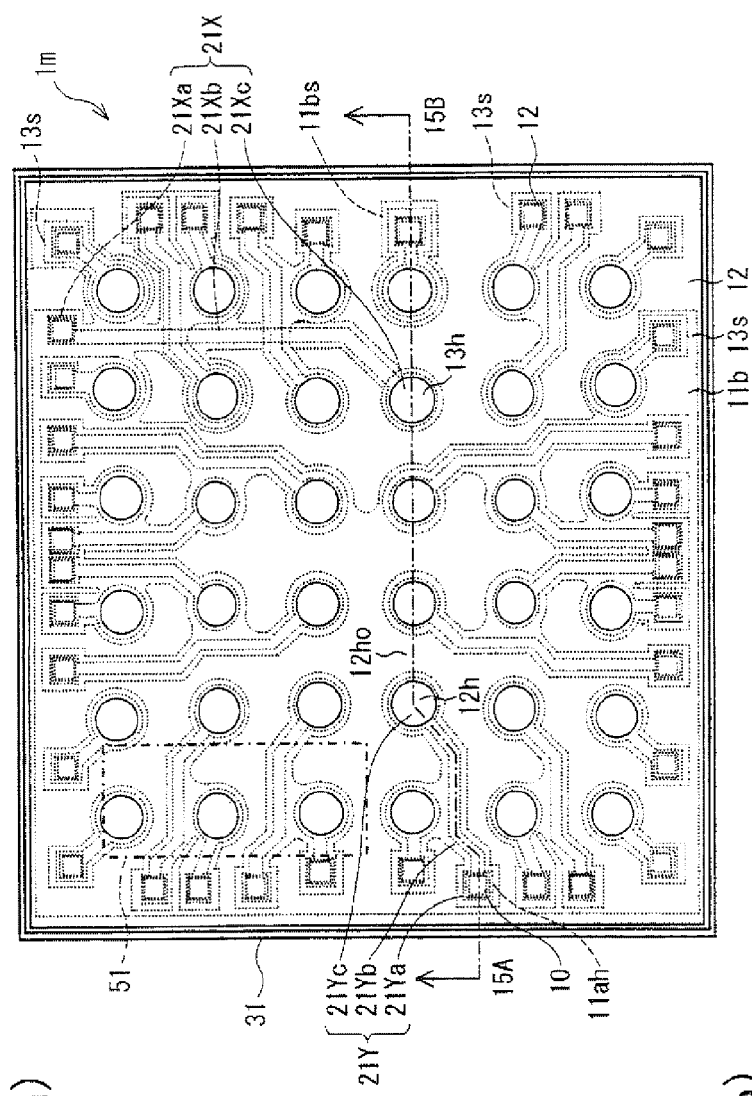
FIG. 15(a), showing another embodiment is a plan view showing an arrangementof a semiconductor device.
FIG. 15(b) is a cross-sectional view taken along the line 15A-15B of FIG. 15(a).
Figure 15:
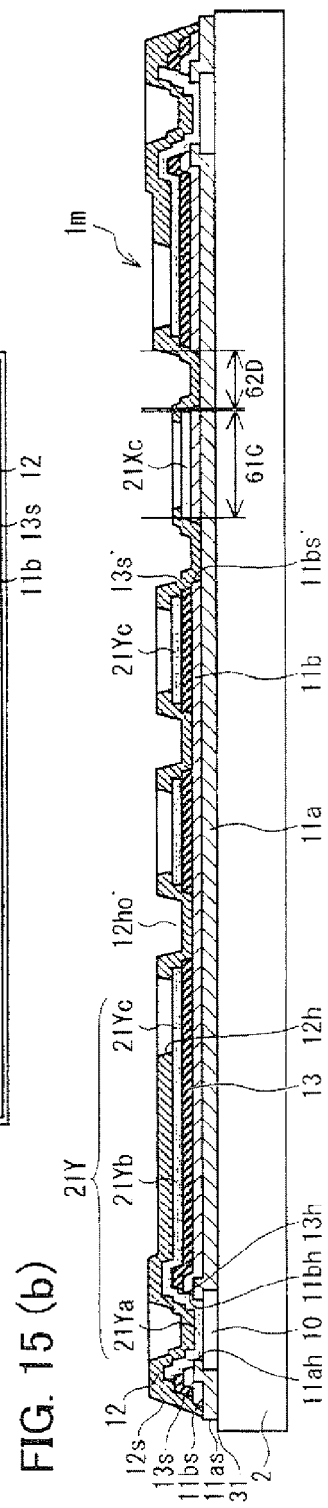

Further, in order to protect an element (not shown) provided on the semiconductor chip, at least the lower insulating layer 11a is provided so as to cover an area where at least the element is provided. Furthermore, it is preferable that at least one of the lower insulating layer 11b, the upper insulating layer 12, the lower insulating layer 11c described below (e.g., see FIG. 7(b)), the middle insulating layer 13 described below (e.g., see FIG. 11(b)) be provided so as to cover that area of the semiconductor chip where the element is provided. The inorganic lower insulating layer 11a is mainly suitable to protection from chemical damage, and the organic insulating layers (e.g., lower insulating layers 11b and 11c, upper insulating layer 12, middle insulating layer 13) are mainly suitable to protection from physical damage.

Moreover, the semiconductor device 1a of FIG. 1(b) is arranged by the side wall 12s such that the edge 31 extends further outward than the side wall 12s in the extending directions of the circuit-forming surface of the semiconductor chip 2. That is, the semiconductor device 1a of FIG. 1(b) is arranged such that the upper insulating layer 12 is omitted from that portion of the semiconductor chip 2 which is closer to the edge 31 than is the side wall 12s.

Further, the upper insulating layer 12 has an opening 12h provided above the land section 21c.

Furthermore, the upper insulating layer 12 has a depression 12ho provided in an area (first secondary-wire-free area) excluding the first secondary-wire-containing area and the area therearound. In the present embodiment, the formation of the depression 12ho causes the insulating layers to be thinner in the first secondary-wire-free area than in the first secondary-wire-containing area. This makes it possible to protect the secondary wire 21 from chemical damage and physical damage and to suppress the curvature of the wafer.

The following describes an area corresponding to the first secondary-wire-free area.

In order to protect the secondary wire 21, the depression 12ho needs to be provided at a distance of approximately several micrometers to 20 μm from the first secondary-wire-containing area. That is, the area corresponding to the first secondary-wire-free area is an "area excluding the first secondary-wire-containing area and an area falling within a distance of several micrometers to 20 μm from the first secondary-wire-containing area".

If an area of adhesion between the upper insulating layer 12 provided with the depression 12ho and the base (lower insulating layer 11b in FIG. 1(b)) can be ensured to such an extent that the first secondary-wire-containing area is sufficiently covered and can withstand changes in external temperature and humidity, it is preferable that the area of adhesion be formed as narrowly as possible. In other words, it is preferable that the distance between the secondary wire 21 and the depression 12*ho* be as short as possible. The shorter the distance is, the more greatly the curvature of the wafer can be suppressed.

Further, in order to ensure adhesion between the lower insulating layer 11*b* and the upper insulating layer 12 and to prevent the lower insulating layer 11*b* and the upper insulating layer 12 from delaminating from each other, it is preferable that the area of adhesive be not less than 5 μm.

Further, in a portion where the distance between neighboring secondary wires 21, or between neighboring wiring sections 21*b* in particular, is shortest, the depression 12*ho* is made to occupy an area corresponding to approximately a third of the distance, so that a void portion (i.e., that portion of the upper insulating layer 12 which has been removed by the depression 12*ho*) can be surely formed in the upper insulating layer 12 between the neighboring secondary wires 21. For example, in cases where the distance between the neighboring secondary wires 21 is 15 μm, it is desirable that the area of adhesion occupy 5 μm for each of the neighboring secondary wires 21 and the depression 12*ho* occupy the remaining 5 μm. However, in the case of a combination of neighboring secondary wires 21 that exert only a minor influence on each other (e.g., a combination that does not include a terminal for processing a minute electric current or a combination that does not process a high-frequency signal), only a few problems arise even if the void portion (i.e., that portion of the upper insulating layer 12 which has been removed by the depression 12*ho*) is omitted between the secondary wires 21.

In the present embodiment, it is desirable that the upper insulating layer 12 be made of a positive-type photosensitive material. Since the positive-type material is excellent in accuracy of position, the depression 12*ho* of the upper insulating layer 12 can be formed with high accuracy.

The formation of the depression 12*ho* in the upper insulating layer 12 prevents the upper insulating layer 12 from being formed in the first secondary-wire-free area. Further, the total thickness of the organic upper insulating layer 12 (having a thickness of 0 μm) and the organic lower insulating layer 11*b* (having a thickness of 5 μm) in the first secondary-wire-free area (i.e., the thickness of the lower insulating layer 11*b*, 5 μm) is less than the total thickness (i.e., 13 μm) of the organic upper insulating layer 12 (having a thickness of 8 μm) and the organic lower insulating layer 11*b* (having a thickness of 5 μm) in the first secondary-wire-containing area. Further, the thickness of the lower insulating layer 11*a* does not vary between the first secondary-wire-containing area and the first secondary-wire-free area.

Therefore, the total thickness of the insulating layers, provided in the first secondary-wire-free area excluding the first secondary-wire-containing area, which include at least the lower insulating layers is less than the total thickness of the lower insulating layers and the upper insulating layer in the first secondary-wire-containing area.

Further, between a specific secondary wire 21 and a secondary wire 21 adjacent thereto, the upper insulating layer 12 supposed to be formed of organic matter (PBO here) whose relative permittivity is approximately 3 is not formed across a thickness range from lower to upper surfaces of the secondary wire 21. Therefore, in an area from which the upper insulating layer 12 has been removed, there exists air, whose relative permittivity is 1 plus.

Therefore, since the increase in the parasitic capacitance can be suppressed by reducing the permittivity of the area between the neighboring secondary wires 21, a wiring delay can be reduced. Especially, the formation of the void portion between the neighboring secondary wires 21 makes it possible to prevent a wiring delay from being caused by the parasitic capacitance. This is because a longer range where current paths are substantially parallel to each other means that the parasitic capacitance exerts a greater influence.

It should be noted that the semiconductor device 1*a* of FIG. 1(*a*) is not arranged such that the void portion is provided between all secondary wires 21. However, in the case of the semiconductor chip 2 and the semiconductor chips 3 to 9 described below that are required to operate at high speeds, the void portion needs to be provided between secondary wires 21, or between wiring sections 21*b* in particular. The void portion also needs to be provided between neighboring secondary wires 21 formed at a narrow pitch and between neighboring secondary wires 21 that exert great influence on each other.

As described above, the semiconductor device according to the present embodiment is arranged such that the upper insulating layer 12 is removed from the area excluding the first secondary-wire-containing area and the area therearound, i.e., from the first secondary-wire-free area. Moreover, the semiconductor device according to the present invention is thereby arranged such that the insulating layers are formed thickly in the first secondary-wire-containing area and thinly in the first secondary-wire-free area. With this, even in the case of overlap between a secondary wire and an electronic circuit section of a semiconductor chip, it becomes possible to suppress electromagnetic interference between the secondary wire and the electronic circuit section and to suppress the curvature of the wafer.

Further, the formation of the void portion between neighboring secondary wires 21, or between neighboring wiring sections 21*b* in particular, makes it possible to reduce the parasitic capacitance. This makes it possible to reduce wiring delays.

Furthermore, the insulating layers are formed thinly in the first secondary-wire-free area than in the first secondary-wire-containing area. With this, even in cases where the semiconductor chip 2 has an electronic circuit section 51 serving as an analog circuit, stress on the electronic circuit section 51 can be reduced, so that a change in electrical characteristics can be suppressed.

It should be noted that the semiconductor device 1*a* of FIGS. 1(*a*) and 1(*b*) is arranged such that the upper insulating layer 12 is provided so as not to be in the depression 12*ho*.

However, the semiconductor device 1*a* of FIGS. 1(*a*) and 1(*b*) is not limited to such an arrangement.

That is, the semiconductor device 1*a* of FIGS. 1(*a*) and 1(*b*) only needs to be arranged such that the total thickness of the insulating layers provided in the first secondary-wire-free area so as to include at least the lower insulating layers 11*a* and 11*b* is less than the total thickness of the lower insulating layers 11*a* and 11*b* and the upper insulating layer 12 in the first secondary-wire-containing area. Moreover, as long as the arrangement is satisfied, it does not matter whether the upper insulating layer 12 is present or absent in the depression 12*ho*. The same applies to a depression 12*ho* of an embodiment described below.

Embodiment 2

A semiconductor device according to another embodiment will be described below with reference to FIGS. 2(*a*) and 2(*b*).

FIG. 2(*a*), showing an embodiment, is a plan view showing an arrangement of a semiconductor device 1*b*. Further, FIG. 2(*b*) is a cross-sectional view taken along the line 2A-2B of FIG. 2(*a*).

The semiconductor chip 2 of the semiconductor device 1*a* of FIGS. 1(*a*) and 1(*b*) is arranged such that the depression 12*ho* of the upper insulating layer 12 is provided in the first secondary-wire-free area excluding the first secondary-wire-containing area and the area therearound.

Meanwhile, the semiconductor chip 3 of the semiconductor device 1*b* of FIGS. 2(*a*) and 2(*b*) is provided with a side wall 11*bs'* of the lower insulating layer 11*b* instead of the depression 12*ho*.

The lower insulating layer 11*b* is made of PBO so as to have a thickness of 10 μm. Further, the opening 11*bh* is provided above the opening 11*ah* of the lower insulating layer 11*a* so as to be smaller in size than the opening 11*ah* of the lower insulating layer 11*a*.

Moreover, the side wall 11*bs'* is formed at a distance of approximately 0 μm to 200 μm from the first secondary-wire-containing area. Further, on the assumption that a predetermined secondary wire 21 is in a reference position, the lower insulating layer 11*b* is completely removed from a place located further away from a secondary wire 21 adjacent to the predetermined secondary wire than from the side wall 11*bs'* (i.e., in a specific place where the "distance between the secondary wire 21 and the side wall 11*bs'*" is shorter than the "distance between the secondary wire 21 and the specific place"). That is, an area located further away from the predetermined secondary wire 21 than is the side wall 11*bs'* becomes a secondary-wire-free area from which the lower insulating layer 11*b* is completely removed.

That is, in the present embodiment, the formation of the side wall 11*bs'* removes the lower insulating layer 11*b* from substantially the whole secondary-wire-free area (second secondary-wire-free area) excluding at least the first secondary-wire-containing area.

In order to bring the side wall 11*bs'* into closest possible contact with the secondary wire 21, it is preferable that the lower insulating layer 11*b* be made of a photosensitive material.

Further, in cases where the influence on the curvature of a wafer is preferentially suppressed, it is preferable that the lower insulating layer 11*b* be made of a positive-type material that excels in accuracy of position. In this case, it is preferable that the lower insulating layer 11*b* have a thickness of not more than 40 μm. Meanwhile, in cases where the influence on the electromagnetic interference is preferentially suppressed, the lower insulating layer 11*b* is preferably formed with use of a negative-type material that can be formed into a thick film, or formed by a printing method or the like with use of a nonphotosensitive material or the like. When the lower insulating layer 11*b* is formed with use of a negative-type material, the lower insulating layer 11*b* can be formed so as to have a thickness of approximately 100 μm. Alternatively, when the lower insulating layer is formed by a printing method or the like with use of a nonphotosensitive material or the like, the lower insulating layer 11*b* can be more suitably formed so as to have a thickness of not less than 100 μm.

Even in the case of use of a photosensitive material, the lower insulating layer 11*b* can be formed thickly by repeating a photo step more than once. However, such a method undesirably causes an increase in the number of steps.

Further, the upper insulating layer 12 has a thickness of 8 μm in the first secondary-wire-containing area and has a thickness of 10 μm in the second secondary-wire-free area. In the second secondary-wire-free area, the upper insulating layer 12 covers the side wall 11*bs'* in addition to the whole second secondary-wire-free area.

The upper insulating layer 12 varies in thickness between the first secondary-wire-containing area and the second secondary-wire-free area for the following reason.

That is, in cases where the upper insulating layer 12 is formed by a spin-coating method with use of the varnish, the second secondary-wire-free area formed so as to be lower than the first secondary-wire-containing area is coated with a larger amount of resin than is the first secondary-wire-containing area. Therefore, in the first secondary-wire-containing area, the upper insulating layer 12 has a thickness of 8 μm so as to be thinner than the lower insulating layer 11*b*.

In the present embodiment, the second secondary-wire-free area is free of a 10-μm-thick lower insulating layer 11*b* and a 10-μm-thick secondary wire 21. Further, as described above, the upper insulating layer 12 has a thickness of 10 μm in the second secondary-wire-free area and has a thickness of 8 μm in the first secondary-wire containing area. Therefore, when the upper insulating layer 12 covers the side wall 11*bs'* and the whole second secondary-wire-free area, the upper insulating layer 12 has a depression 12*ho'* formed above the second secondary-wire-free area. It should be noted that the depth of the depression 12*ho'* can be appropriately set in consideration of the thickness of the lower insulating layer 11*b*, the thickness of the upper insulating layer 12, the thickness of the secondary wire 21, and the like.

In cases where the upper insulating layer 12 is formed by a spin-coating method so as to be in the first secondary-wire-containing area and the second secondary-wire-free area, it is advisable to set conditions such as the viscosity of the upper insulating layer 12 in varnish form and the number of spin rotations so that the thickness of the upper insulating layer 12 in the second secondary-wire-free area is not more than the thickness of the lower insulating layer 11*b* in the first secondary-wire-containing area.

The semiconductor device 1*b* of FIGS. 2(*a*) and 2(*b*) is identical in other arrangements to the semiconductor device 1*a* of FIGS. 1(*a*) and 1(*b*), and therefore will not be fully described below.

According to the foregoing arrangement, the insulating layers are formed thickly in the first secondary-wire-containing area and thinly in the area free of a secondary wire 21. With this, even in the case of overlap between a secondary wire and an electronic circuit section of a semiconductor chip, it becomes possible to suppress electromagnetic interference between the secondary wire and the electronic circuit section and to suppress the curvature of the wafer.

Furthermore, the insulating layers are formed more thinly in the second secondary-wire-free area than in the first secondary-wire-containing area. With this, even in cases where the semiconductor chip 3 has an electronic circuit section 51 serving as an analog circuit, stress on the electronic circuit section 51 can be reduced, so that a change in electrical characteristics can be suppressed.

Further, the lower insulating layer 11*b* has a thickness of 10 μm in the first secondary-wire-containing area, and the lower insulating layer 11*b* and the upper insulating layer 12 have a thickness of 0 μm and a thickness of 10 μm, respectively, in the second secondary-wire-free area. Therefore, the total thickness of the organic insulating layers is 10 μm. That is, the thickness of the upper insulating layer 12 in the second secondary-wire-free area is not more than the thickness of the lower insulating layer 11*b* in the first secondary-wire-containing area.

Therefore, the formation of the void portion between neighboring secondary wires 21, or between neighboring wiring sections 21*b* in particular, makes it possible to reduce the parasitic capacitance. This makes it possible to reduce wiring delays.

It should be noted that the semiconductor device 1b of FIGS. 2(a) and 2(b) is arranged such that the lower insulating layer 11b is provided so as not to be in the second secondary-wire-free area.

However, the semiconductor device 1b of FIGS. 2(a) and 2(b) is not limited to such an arrangement.

That is, the semiconductor device 1b of FIGS. 2(a) and 2(b) only needs to be arranged such that the total thickness of the insulating layers provided in the first secondary-wire-free area so as to include at least the lower insulating layers 11a and 11b is less than the total thickness of the lower insulating layers 11a and 11b and the upper insulating layer 12 in the first secondary-wire-containing area. Moreover, as long as such an arrangement is satisfied, it does not matter whether the lower insulating layer 11b is present or absent in the second secondary-wire-free area. The same applies to a second secondary-wire-free area of an embodiment described below.

Embodiment 3

Figure 3:
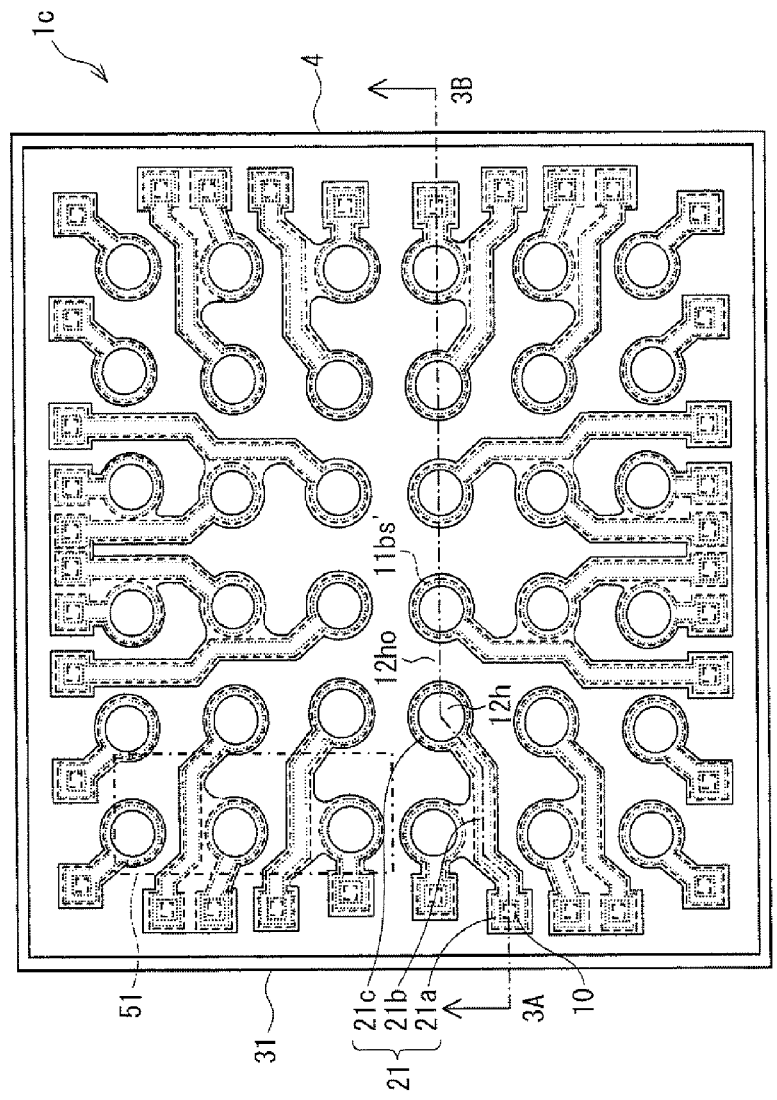
FIG. 3(a), showing another embodiment is a plan view showing an arrangement of a semiconductor device.
FIG. 3(b) is a cross-sectional view taken along the line 3A-3B of FIG. 3(a).
Figure 3:
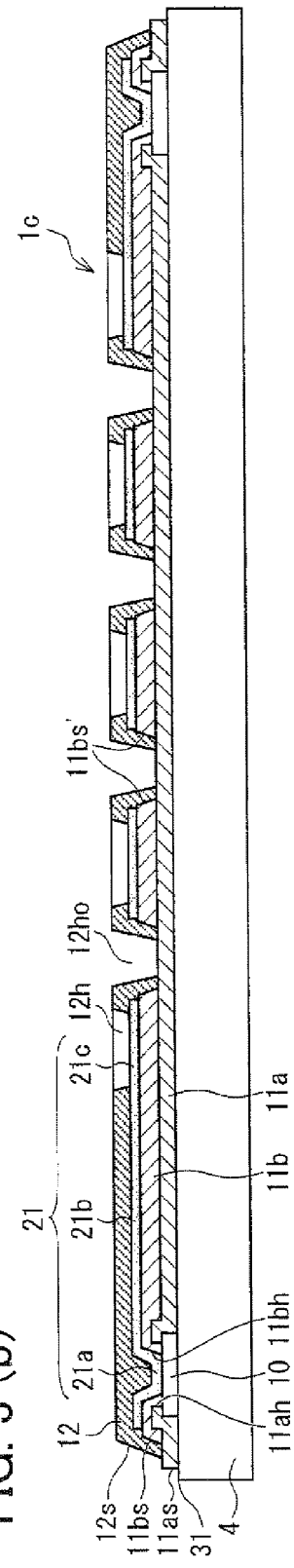

A semiconductor device according to another embodiment will be described below with reference to FIGS. 3(a) and 3(b).

FIG. 3(a), showing an embodiment, is a plan view showing an arrangement of a semiconductor device 1c. Further, FIG. 3(b) is a cross-sectional view taken along the line 3A-3B of FIG. 3(a).

The semiconductor device 1c of FIGS. 3(a) and 3(b) includes a semiconductor chip 4 provided with lower insulating layers 11a and 11b and secondary wires 21 that are made of the same materials as, and formed as thickly as, those of the semiconductor device 1b of FIGS. 2(a) and 2(b), and is arranged such that the lower insulating layer 11b is provided with a side wall 11bs'. Further, the semiconductor device 1c of FIGS. 3(a) and 3(b) is arranged such that the semiconductor chip 4 is provided with an upper insulating layer 12 that is made of the same material as, and formed as thickly as, in the semiconductor device 1a of FIGS. 1(a) and 1(b), and that the upper insulating layer 12 is provided with a depression 12ho.

That is, the semiconductor chip 4 of the semiconductor device 1c of FIGS. 3(a) and 3(b) is arranged such that the side wall 11bs' of the lower insulating layer 11b and the depression 12ho of the upper insulating layer 12 are both provided.

Further, as shown in FIG. 3(b), in the present embodiment, the lower and upper insulating layers 11b and 12 each made of organic matter are completely removed from the first secondary-wire-free area. Therefore, the semiconductor device 1c of FIGS. 3(a) and 3(b) is not provided with a depression 12ho'.

Further, in the present embodiment, the side wall 12s is provided so as to be further away from the center of the semiconductor chip 4 than is the side wall 11bs of the lower insulating layer 11b. Specifically, the side wall 12s is provided so as to be between the side wall 11as of the lower insulating layer 11a and the side wall 11bs of the lower insulating layer 11b, or in substantially the same position as the side wall 11as. In this case, the side wall 12s is provided at a distance of approximately 5 μm to 100 μm from the edge 31.

However, a semiconductor device according to the present embodiment, as well as the present embodiment, is not particularly limited in terms of whether the side wall 12s is provided so as to be closer to the center of the semiconductor chip 4 than is the side wall 11bs or further away from the center of the semiconductor chip 4 than is the side wall 11bs.

According to the foregoing arrangement, even in the case of overlap between a secondary wire and an electronic circuit section of a semiconductor chip, it becomes possible to suppress electromagnetic interference between the secondary wire and the electronic circuit section and to suppress the curvature of the wafer.

Further, the formation of the void portion between neighboring secondary wires 21, or between neighboring wiring sections 21b in particular, makes it possible to reduce the parasitic capacitance. This makes it possible to reduce wiring delays.

Furthermore, the insulating layers are formed more thinly in the second secondary-wire-free area than in the first secondary-wire-containing area. With this, even in cases where the semiconductor chip 4 has an electronic circuit section 51 serving as an analog circuit, stress on the electronic circuit section 51 can be reduced, so that a change in electrical characteristics can be suppressed.

Embodiment 4

A semiconductor device according to another embodiment will be described below with reference to FIGS. 4(a) and 4(b).

FIG. 4(a), showing an embodiment, is a plan view showing an arrangement of a semiconductor device 1d. Further, FIG. 4(b) is a cross-sectional view taken along the line 4A-4B of FIG. 4(a).

The semiconductor device 1d of FIGS. 4(a) and 4(b) is arranged so as to have a nonperipherally-disposed electrode pad 10 provided at a predetermined external connection terminal (third external connection terminal as counted from the left and from the bottom in FIG. 4(a)) in the arrangement of the semiconductor device 1c of FIGS. 3(a) and 3(b).

Further, the nonperipherally-disposed electrode pad 10 is arranged in the same manner as the peripherally-disposed electrode pads 10, or may be arranged in a different manner. Further, the lower insulating layer 11a has an opening 11ah, provided above a back surface of the electrode pad 10 opposite to a surface of the electrode pad 10 in contact with the circuit-forming surface, via which the back surface is partially exposed, and the lower insulating layer 11b has an opening 11bh, provided above the opening 11ah of the lower insulating layer 11a, which is smaller in size than the opening 11ah of the lower insulating layer 11a.

The secondary wire 21 further includes a land section 21d. The land section 21d is connected to the electrode pad 10 via the opening 11bh, and the lower insulating layers 11a and 11b are provided between the land section 21d and the electrode pad 10.

Further, the upper insulating layer 12 has an opening 12h, provided above the land section 21d, via which a semiconductor chip 5 is electrically connected to an external circuit.

Furthermore, the semiconductor chip 5 of the semiconductor device of FIGS. 4(a) and 4(b) is arranged such that the side wall 11bs' of the lower insulating layer 11b and the depression 12ho of the upper insulating layer 12 are both provided in the second secondary-wire-free area. Further, as shown in FIG. 4(b), in the present embodiment, the lower and upper insulating layers 11b and 12 each made of organic matter are completely removed from the first secondary-wire-free area.

The upper insulating layer 12 provided on the land section 21d protects the land section 21d from chemical damage and physical damage, and functions as a so-called limiting layer to prevent an outflow of a connection material supplied to a connection area.

According to the foregoing arrangement, even in the case of overlap between a secondary wire and an electronic circuit section of a semiconductor chip, it becomes possible to suppress electromagnetic interference between the secondary wire and the electronic circuit section and to suppress the curvature of the wafer.

Further, the formation of the void portion between neighboring secondary wires 21, or between neighboring wiring sections 21b in particular, makes it possible to reduce the parasitic capacitance. This makes it possible to reduce wiring delays.

Furthermore, the insulating layers are formed more thinly in the second secondary-wire-free area than in the first secondary-wire-containing area. With this, even in cases where the semiconductor chip 5 has an electronic circuit section 51 serving as an analog circuit, stress on the electronic circuit section 51 can be reduced, so that a change in electrical characteristics can be suppressed.

It should be noted that the present embodiment can suppress the electromagnetic interference and suppress the curvature of the wafer even in cases where only either the depression 12ho or the side wall 11bs' is provided.

Further, although the present embodiment is arranged so as to have the nonperipherally-disposed electrode pad 10 provided only at the specific external connection terminal (at which the land section 21d is provided), the present embodiment is not limited to such an arrangement. That is, such nonperipherally-disposed electrode pads 10 may be provided at two or more of the external connection terminals. Furthermore, such nonperipherally-disposed electrode pads 10 may be provided at all the external connection terminals provided on the semiconductor chip 5.

Embodiment 5

A semiconductor device according to another embodiment will be described below with reference to FIGS. 5(a) and 5(b).

FIG. 5(a), showing an embodiment, is a plan view showing an arrangement of a semiconductor device 1d. Further, FIG. 5(b) is a cross-sectional view taken along the line 5A-5B of FIG. 5(a).

The semiconductor device 1e of FIGS. 5(a) and 5(b) is arranged such that the lower insulating layer 11b has a side wall 11bs''', provided on the electrode pad 10, which replaces the opening 11bh and the side wall 11bs of the lower insulating layer 11b in the arrangement of the semiconductor device 1c of FIGS. 3(a) and 3(b).

The side wall 11bs''' of the lower insulating layer 11b is provided on the electrode pad 10 so as to be closer to the center of a semiconductor chip 6 than is the opening 11ah of the lower insulating layer 11a. That is, the lower insulating layer 11b is provided only in that portion of the secondary wire 21 which is surrounded by a dotted line L1 in FIG. 5(a). At this time, the side wall 11bs''' is provided at a distance of approximately 50 μm to 500 μm from the edge 31.

That is, as compared with the arrangement of the semiconductor device of FIGS. 3(a) and 3(b), the semiconductor device 1e of FIGS. 5(a) and 5(b) is arranged such that the lower insulating layer 11b is omitted from that portion of the semiconductor chip 6 which is closer to the edge 31 than is the side wall bs''' provided on the electrode pad 10.

The semiconductor device 1e of FIGS. 5(a) and 5(b) is identical in other arrangements to the semiconductor device of FIGS. 3(a) and 3(b), and therefore will not be fully described below.

According to the foregoing arrangement, even in the case of overlap between a secondary wire and an electronic circuit section of a semiconductor chip, it becomes possible to suppress electromagnetic interference between the secondary wire and the electronic circuit section and to suppress the curvature of the wafer.

Further, the formation of the void portion between neighboring secondary wires 21, or between neighboring wiring sections 21b in particular, makes it possible to reduce the parasitic capacitance. This makes it possible to reduce wiring delays.

Furthermore, the insulating layers are formed more thinly in the second secondary-wire-free area than in the first secondary-wire-containing area. With this, even in cases where the semiconductor chip 6 has an electronic circuit section 51 serving as an analog circuit, stress on the electronic circuit section 51 can be reduced, so that a change in electrical characteristics can be suppressed.

Furthermore, as compared with the semiconductor device 1c of FIGS. 3(a) and 3(b), the semiconductor device 1e of FIGS. 5(a) and 5(b) is arranged such that the lower insulating layer 11b is provided within a narrower range. Therefore, in cases where a circuit susceptible to the influence of an electromagnetic field does not exist around the electrode pad 10, the semiconductor device 1e of FIGS. 5(a) and 5(b) desirably brings about a greater effect of suppressing the curvature of a wafer than does the semiconductor device 1c of FIGS. 3(a) and 3(b).

Embodiment 6

A semiconductor device according to another embodiment will be described below with reference to FIGS. 6(a) and 6(b).

FIG. 6(a), showing an embodiment, is a plan view showing an arrangement of a semiconductor device 1f. Further, FIG. 6(b) is a cross-sectional view taken along the line 6A-6B of FIG. 6(a).

As compared with the arrangement of the semiconductor device of FIGS. 5(a) and 5(b), the semiconductor device 1f of FIGS. 6(a) and 6(b) is arranged such that the side wall 11bs' of the lower insulating layer 11b is provided so as to be further away from the center of a semiconductor chip 7 than is the land section 21c, and that the side wall 11bs''' of the lower insulating layer 11b is provided so as to be closer to the center of the semiconductor chip 7 than is the pad section 21a.

That is, the semiconductor device 1f of FIGS. 6(a) and 6(b) is arranged such that the lower insulating layer 11b is provided only in an area of the secondary wire 21 where the wiring section 21b is provided (i.e., in that portion of the secondary wire 21 which is surrounded by a dotted line L2 in FIG. 6(a)).

With this, the semiconductor device 1f of FIGS. 6(a) and 6(b) is arranged such that, in a secondary-wire-free area (third secondary-wire-free area) excluding a secondary-wire-containing area (second secondary-wire-containing area) where at least the wiring section 21b of the secondary wire 21 is provided, the lower insulating layers 11a and 11b and the upper insulating layer 12 are formed more thinly than in the second secondary-wire-containing area.

Generally, electromagnetic interference between a secondary wire and an electronic circuit section is likely to occur between current paths substantially parallel to each other. Especially, in the case of a secondary wire 21 provided in a semiconductor device according to the present invention, the wiring section 21b and the electronic circuit section 51 often form current paths substantially parallel to each other.

Meanwhile, the pad section 21a and the land section 21c supply electrical currents in a direction substantially perpendicular to the electronic circuit section 51. Therefore, the pad section 21a and the land section 21 are not greatly affected by electromagnetic interference with the electronic circuit section 51.

Therefore, the present embodiment is arranged such that the lower insulating layer 11b is provided only underneath the wiring section 21b, which is minimally required for suppression of the electromagnetic interference.

According to the foregoing arrangement, even in the case of overlap between a secondary wire and an electronic circuit section of a semiconductor chip, it becomes possible to suppress electromagnetic interference between the secondary wire and the electronic circuit section and to suppress the curvature of the wafer.

Further, the formation of the void portion between neighboring secondary wires 21, or between neighboring wiring sections 21b in particular, makes it possible to reduce the parasitic capacitance. This makes it possible to reduce wiring delays.

Furthermore, the insulating layers are formed more thinly in the third secondary-wire-free area than in the second secondary-wire-containing area. With this, even in cases where the semiconductor chip 7 has an electronic circuit section 51 serving as an analog circuit, stress on the electronic circuit section 51 can be reduced, so that a change in electrical characteristics can be suppressed.

Furthermore, as compared with the semiconductor device 1c of FIGS. 3(a) and 3(b) and the semiconductor device 1e of FIGS. 5(a) and 5(b), the semiconductor device 1f of FIGS. 6(a) and 6(b) is arranged such that the lower insulating layer 11b is provided within a narrower range. Therefore, the semiconductor device 1f of FIGS. 6(a) and 6(b) desirably brings about a greater effect of suppressing the curvature of a wafer than do the semiconductor device 1c of FIGS. 3(a) and 3(b) and the semiconductor device 1e of FIGS. 5(a) and 5(b).

It should be noted that the preset embodiment is arranged such that the lower insulating layer 11b is provided only underneath the wiring section 21b of the secondary wire 21. That is, the total thickness of the lower insulating layers 11a and 11b is smaller in the pad section 21a and the land section 21c of the secondary wire 21 than in the wiring section 21b of the secondary wire 21.

However, in the present embodiment, in cases where the electromagnetic interference around the pad section 21a of the secondary wire 21 needs to be further suppressed, the second secondary-wire-containing area may be a secondary-wire-containing area where the pad section 21a and the wiring section 21b of the secondary wire 21 are provided. That is, the semiconductor device 1f of FIGS. 6(a) and 6(b) may be arranged such that, in a third secondary-wire-free area excluding the second secondary-wire-containing area where the pad section 21a and the wiring section 21b of the secondary wire 21 are provided, the lower insulating layers 11a and 11b and the upper insulating layer 12 are formed more thinly than in the second secondary-wire-containing area.

Furthermore, in cases where the electromagnetic interference around the land section 21c of the secondary wire 21 needs to be further suppressed, the second secondary-wire-containing area may be a secondary-wire-containing area where the wiring section 21b and the land section 21c of the secondary wire 21 are provided. That is, the semiconductor device 1f of FIGS. 6(a) and 6(b) may be arranged such that, in a third secondary-wire-free area excluding the second secondary-wire-containing area where the wiring section 21b and the land section 21c of the secondary wire 21 are provided, the lower insulating layers 11a and 11b and the upper insulating layer 12 are formed more thinly than in the second secondary-wire-containing area.

It should be noted that, in each of the embodiments shown in FIGS. 2(a) and 2(b), FIGS. 5(a) and 5(b), and FIGS. 6(a) and 6(b), the side walls of the organic lower insulating layer (e.g., the side walls 11bs, 11bs', and 11bs" of the lower insulating layer 11b) are completely covered with the upper insulating layer 12.

According to this arrangement, the number of exposed interfaces between insulating layers can be reduced by completely covering the side walls of the lower insulating layer with the upper insulating layer 12. This makes it possible to prevent water and/or chemical components from entering the semiconductor device. Moreover, this makes it possible to prevent delamination of the interfaces and corrosion of the electronic circuit section (including the primary wires) of the semiconductor chip.

Embodiment 7

A semiconductor device according to another embodiment will be described below with reference to FIGS. 7(a) and 7(b).

FIG. 7(a), showing an embodiment, is a plan view showing an arrangement of a semiconductor device 1g. Further, FIG. 7(b) is a cross-sectional view taken along the line 7A-7B of FIG. 7(a).

As shown in FIG. 7(b), the semiconductor device 1g of FIGS. 7(a) and 7(b) is arranged such that the arrangement of the semiconductor device 1f of FIGS. 6(a) and 6(b) further includes a third lower insulating layer, i.e., a lower insulating layer 11c provided between the lower insulating layers 11a and 11b, the lower insulating layer 11c being made of a polyimide film, which is organic matter.

In FIG. 7(b), the lower insulating layer 11c covers substantially the whole area of a semiconductor chip 8 except the electrode pad 10 and the scribe line area, and has an opening 11ch, provided above the electrode pad 10 and the lower insulating layer 11a, which is larger in size than the opening 11ah of the lower insulating layer 11a.

Further, as with the lower insulating layer 11a, it is preferable that the lower insulating layer 11c have a side wall 11cs provided in the scribe line area. The side wall 11cs is provided above the semiconductor chip 8 so as to be closer to the center of the semiconductor chip 8 than is the side wall 11as and further away from the center of the semiconductor chip 8 than is the side wall 12s, or so as to be in substantially the same position as the side wall 11as or 12s. However, since it is necessary to consider how the side wall 11cs is positioned with respect to the secondary wire 21, i.e., since the secondary wire 21 may not be sufficiently protected when the side wall 11cs is provided so as to be too close to the center of the semiconductor chip 8, the side wall 11cs is preferably provided at a distance of approximately 5 μm to 80 μm from the edge 31. However, in cases where the lower insulating layer 11c is provided only in the first secondary-wire-containing area and the area therearound, a side wall (not shown) may be provided instead of the side wall 11cs so as to be more distant from the edge 31, for example, at a distance of approximately 5 μm to 500 μm from the edge 31. It should be noted that the numerical value indicates that the side wall 11cs is positioned at the shortest distance from the edge 31. That is, in an area free of a secondary wire 21, there can exist a place where the side wall 11cs is provided so as to be closer to the center of the semiconductor chip, i.e., further away from the edge 31, or a place where the side wall 11cs is not provided. The same applies to a side wall 11cs of an embodiment described below.

Moreover, the semiconductor device 1g of FIG. 7(b) is arranged by the side wall 11cs such that the edge 31 extends further outward than the side wall 11cs, which serves as an edge of the lower insulating layer 11c, in an extending direction of a circuit-forming surface of the semiconductor ship 8. That is, the semiconductor device 1g of FIG. 7(b) is arranged such that the lower insulating layer 11c is omitted from that portion of the semiconductor chip 2 which is closer to the edge 31 than is the side wall 11cs.

As with the aforementioned embodiments, the semiconductor device 1g of FIGS. 7(a) and 7(b) is arranged such that the lower insulating layer 11b is provided only in an area where the wiring section 21b of the secondary wire 21 is provided (i.e., in that portion, of the secondary wire 21 which is surrounded by a dotted line L3 in FIG. 7(a)).

This arrangement makes sure to protect the semiconductor chip 8 from physical and chemical damage in the depression 12ho of the upper insulating layer 12. Further, the curvature of the wafer can be suppressed.

Furthermore, in cases where electromagnetic interference between the secondary wire 21 and the electronic circuit section 51 exerts a great influence, the electromagnetic interference can be suppressed by providing the lower insulating layer 11c around the periphery of the peripherally-disposed electrode pad 10.

In cases where the organic insulating layers (lower insulating layers 11b and 11c and the upper insulating layer 12) covers at least an electronic circuit section (not shown) of the semiconductor chip 8 which includes primary wires, the electronic circuit section 51 can be sufficiently protected from chemical damage and physical damage. Therefore, the semiconductor chip 8 may be arranged such that the nitride or oxide film serving as the lower insulating layer 11a is omitted.

Further, the opening 11ch of the lower insulating layer 11c may be provided in substantially the same position as the side wall 11bs'' of the lower insulating layer 11b.

As in the present embodiment, in a semiconductor device according to the present embodiment, it is possible to form two or more organic lower insulating layers and to increase the total number of lower insulating layers.

According to the foregoing arrangement, as compared with the arrangement of the semiconductor device 1f of FIGS. 6(a) and 6(b), the semiconductor device 1g is arranged such that the organic insulating layers are formed more thickly in a secondary-wire-containing area. Therefore, as compared with the semiconductor device 1f of FIGS. 6(a) and 6(b), the semiconductor device 1g brings about an improved effect of suppressing electromagnetic interference between a semiconductor chip and an electronic circuit section.

As described above, the semiconductor device according to the present embodiment is arranged such that the total thickness of the insulating layers are formed more thickly in the wiring section 21b than in an area other than the wiring section 21b by forming the side wall 11bs''' of the lower insulating layer 11b around the periphery of the wiring section 21b of the secondary wire 21. With this, even in the case of overlap between a secondary wire and an electronic circuit section of a semiconductor chip, it becomes possible to suppress electromagnetic interference between the secondary wire and the electronic circuit section and to suppress the curvature of the wafer.

Further, the formation of the void portion area between neighboring secondary wires 21, or between neighboring wiring sections 21b in particular, makes it possible to reduce the parasitic capacitance. This makes it possible to reduce wiring delays.

Further, the insulating layers are formed more thinly in the third secondary-wire-free area than in the second secondary-wire-containing area. With this, even in cases where the semiconductor chip 8 has an electronic circuit section 51 serving as an analog circuit, stress on the electronic circuit section 51 can be reduced, so that a change in electrical characteristics can be suppressed.

Embodiment 8

Figure 8:
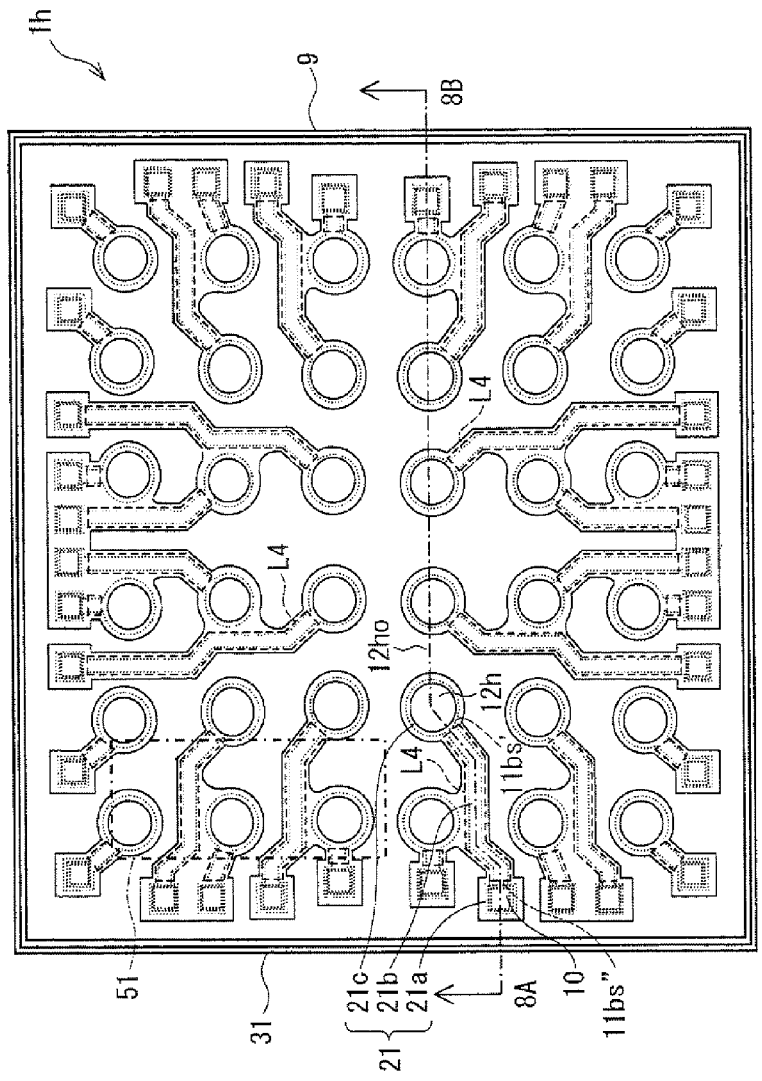
FIG. 8(a), showing another embodiment is a plan view showing an arrangement of a semiconductor device.
FIG. 8(b) is a cross-sectional view taken along the line 8A-8B of FIG. 8(a).
Figure 8:
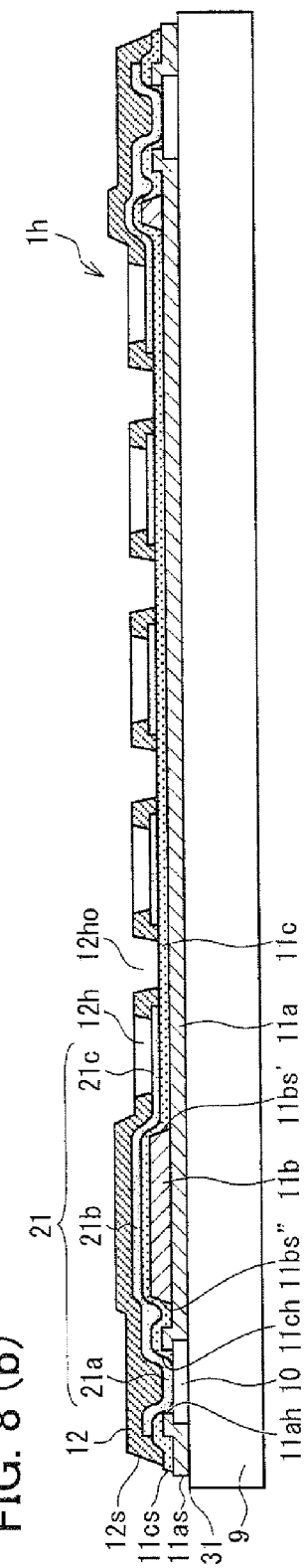
Figure 9:
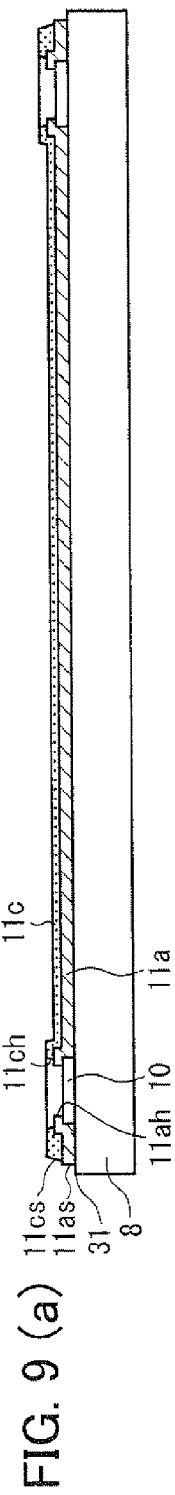
FIGS. 9(a) through 9(f), showing another embodiment show a method for manufacturing the semiconductor device of FIGS. 7(a) and 7(b).
Figure 9:
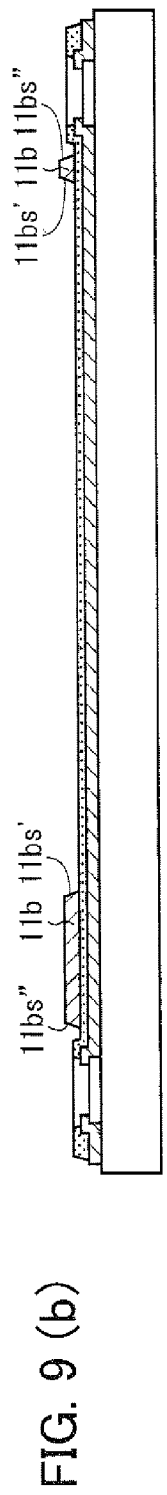
Figure 9:
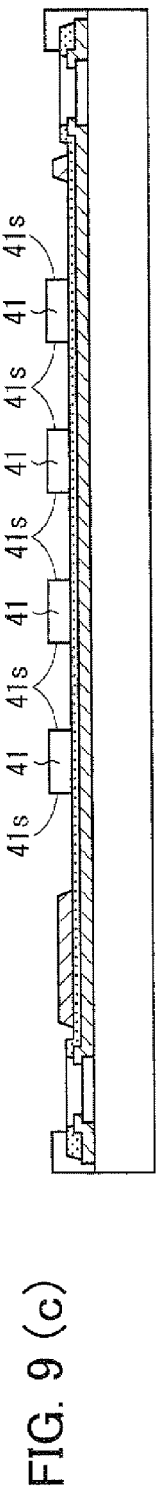
Figure 9:
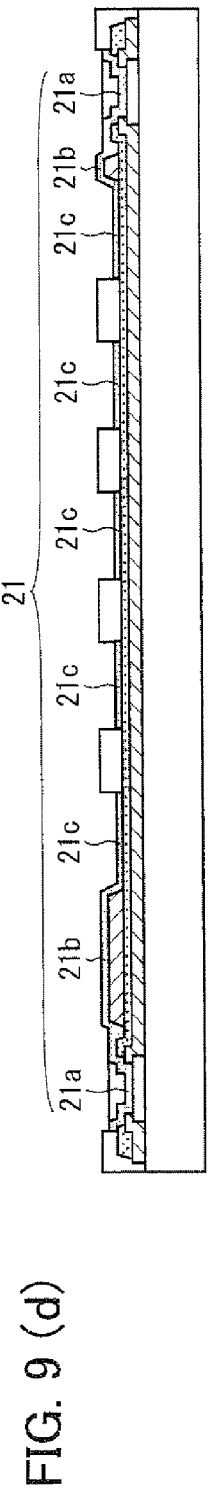
Figure 9:
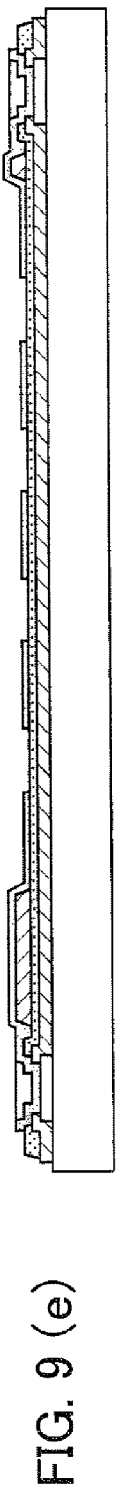
Figure 9:
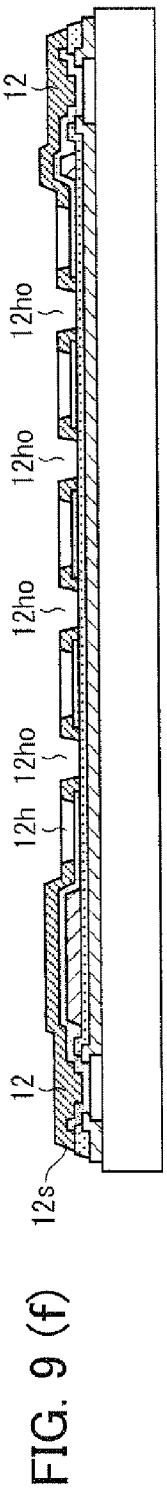

A semiconductor device according to another embodiment will be described below with reference to FIGS. 8(a) and 8(b).

FIG. 8(a), showing an embodiment, is a plan view showing an arrangement of a semiconductor device 1h. FIG. 8(b) is a cross-sectional view taken along the line 8A-8B of FIG. 8(a).

As shown in FIG. 8(b), the semiconductor device 1h of FIGS. 8(a) and 8(b) has a semiconductor chip 9 arranged such that the lower insulating layer 11c is provided on top of the lower insulating layer 11b, as compared with the arrangement of the semiconductor device 1g of FIGS. 7(a) and 7(b). In FIG. 8(b), the lower insulating layer 11c covers substantially the whole area of the semiconductor chip 9 except the electrode pad 10 and the scribe line area, and has an opening 11ch, provided above the electrode pad 10, which is smaller in size than the opening 11ah of the lower insulating layer 11a.

Further, as with the aforementioned embodiments, the semiconductor device 1h of FIGS. 8(a) and 8(b) is arranged such that the lower insulating layer 11b is provided only in an area where the wiring section 21b of the secondary wire 21 is provided (i.e., in that portion of the wiring section 21b which is surrounded by a dotted line L4 in FIG. 8(a)).

The foregoing arrangement makes it possible to free the lower insulating layer 11b of step portions (an angular place where the lower insulating layer 11b makes contact with the base and an angular boundary portion between upper and side surfaces of the lower insulating layer 11b). The reason for this is as follows: although the lower insulating layer 11b often has an angular side wall because of the type of material and a processing method, the lower insulating layer 11c is formed as a film from a varnish material by spin coating on top of the lower insulating layer 11b so as to cover the top of the lower insulating layer 11b, so that the angular step portions can be smoothed. This makes it possible, in addition to the functions and effects brought about by the semiconductor device 1g of FIGS. 7(a) and 7(b), to improve the coverage of the secondary wire 21, i.e., to increase the amount of space of adhesion between the secondary wire 21 and the lower insulating layers (lower insulating layers 11a to 11c). This makes it possible to reduce the risk of occurrence of an open defect in the secondary wire 21 and delamination of the secondary wire 21, thereby bringing about an effect of improving the reliability of the semiconductor device.

Each of the aforementioned embodiments is arranged such that the secondary wire 21, or at least the wiring section 21b of the secondary wire 21, is provided with the lower insulating layers (including the lower insulating layers 11b) for reducing electromagnetic interference between the secondary wire 21 and the electronic circuit section 51 of the semiconductor chip.

However, in each of the semiconductor devices 1a to 1h according to the present embodiment, the lower insulating layers may be provided in a place other than the place described above. For example, the lower insulating layers may be arranged so as to be provided for a secondary wire that traverses the electronic circuit section 51 or a part thereof, e.g., for a secondary wire 21 so provided on each of the semiconductor chips 2 to 9 respectively corresponding to the semiconductor devices 1a to 1h as to be positioned directly above the electronic circuit section 51. The term "secondary wire 21 that traverses the electronic circuit section 51 or a part thereof" here means a secondary wire 21 that traverses the whole electronic circuit section 51 or an area of the electronic circuit section 51 where the electromagnetic interference exerts a great influence. In the semiconductor device 1a of FIG. 1(a), examples of such a portion of a secondary wire 21 include that portion of a secondary wire 21 which is positioned directly above the electronic circuit section 51 (i.e., secondary wires 21 provided around the first to second external connection terminals as counted from the left and the first to third external connection terminals as counted from the top in FIG. 1(a)).

Furthermore, the lower insulating layers may be arranged so as to be provided more thickly only for a secondary wire 21 that overlaps the electronic circuit section 51 or only for a part of the secondary wire 21 that overlaps the electronic circuit section 51, as compared with an area other than the area.

It should be noted that, in cases where attention is focused on a specific secondary wire 21 that traverses the electronic circuit section 51, the term "secondary wire 21 that overlaps the electronic circuit section 51" means that portion of the secondary wire 21 which overlaps the electronic circuit section 51. In the semiconductor device 1a of FIG. 1(a), examples of such a portion of the secondary wire 21 include that portion of the secondary wire 21 which is directly above the electronic circuit section 51 and all secondary wires 21 positioned inside of the dotted line indicative of the electronic circuit section 51.

Further, in cases where attention is focused on a specific secondary wire 21 that traverses the electronic circuit section 51, the term "part of the secondary wire 21 that overlaps the electronic circuit section 51" means that portion of the secondary wire 21 which overlaps a place of the electronic circuit section 51 where the electromagnetic interference exerts a great influence. In the semiconductor device 1a of FIG. 1(a), examples of such a portion of the secondary wire 21 include that portion of the secondary wire 21 which is directly above the electronic circuit section 51 and a secondary wire 21, positioned inside of the dotted line indicative of the electronic circuit section 51, where the electromagnetic interference exerts a particularly great influence.

That is, the lower insulating layers may be formed thickly entirely for a "secondary wire 21 that overlaps the electronic circuit portion 51", or may be formed thickly only in an area that overlaps the electronic circuit section 51 or a part thereof.

The foregoing arrangement makes it possible to further narrow an area where the lower insulating layers are provided, thereby further suppressing the curvature of the wafer.

It should be noted here that a circuit to be provided as the electronic circuit section 51 is mainly an analog circuit. Examples of such an analog circuit include a constant-voltage circuit and a power supply circuit. Especially, examples of a circuit to be provided in the power supply circuit include various circuits, such as a trans-conductance amplifier (gm amplifier), an operational amplifier, a comparator, an RF (radio-frequency) signal receiving apparatus, an RF synthesizer, and a D/A converter, which process an analog signal. These circuits have a feature of being susceptible to an external factor such as the electromagnetic interference or noise (especially susceptible to such an external factor attributable to conduction of a digital signal). Therefore, it is preferable that a semiconductor device according to the present invention have such an arrangement. The same applies also in cases where a circuit to be provided as the electronic circuit section 51 is a digital circuit.

In the present embodiment, the effect of suppressing the electromagnetic interference is enhanced by appropriately determining the thickness of a lower insulating layer with respect to the electronic circuit section 51, connected to an analog-signal processing circuit, which further includes a primary wire via which an analog signal is transmitted.

That is, because the primary wire via which an analog signal is transmitted is as susceptible to an external factor as the analog circuit, it is preferable to thickly form a lower insulating layer for a secondary wire 21 or, especially, for a secondary wire 21 via which a digital signal is carried.

Further, the degree of influence of the electromagnetic interference on the analog circuit varies depending, for example, on the strength and frequency of an electrical signal that is processed by the semiconductor device according to the present invention. Therefore, the influence of the electromagnetic interference and the influence of the curvature of the wafer can be minimized by changing, in accordance with the degree of influence of the electromagnetic interference, the thickness of a lower insulating layer that exists underneath a secondary wire 21.

The thickness of a lower insulating layer or the number of lower insulating layers may be appropriately changed for each secondary wire 21, for example, by providing only a lower insulating layer 11a for a secondary wire 21 provided in an area where the degree of influence of the electromagnetic interference is small or where no analog circuit exists, or by providing lower insulating layers 11a and 11b for a secondary wire 21 provided in an area where the degree of influence of the electromagnetic interference is large.

Further, the thickness of a lower insulating layer may be appropriately changed in accordance with the degree of influence of the electromagnetic interference even within a specific secondary wire 21. For example, the electromagnetic interference can be suppressed and the curvature of the wafer can be suppressed by arranging a lower insulating layer thickly only for a part of the wiring section 21b, for the whole area of the wiring section 21b and the land section 21c, or for the whole area of the wiring section 21b and a part of the pad section 21a.

The parasitic capacitance can be lowered by arranging a lower insulating layer so that the lower insulating layer has a thickness that varies between neighboring secondary wires 21 or between a part of a secondary wire 21 such as a wiring section 21b and the rest of the secondary wire 21 and so that the neighboring secondary wires 21 are provided on different planes or the part of the secondary wire 21 and the rest of the secondary wire 21 are provided on different planes.

Thus, the semiconductor device according to the present embodiment makes it possible to suppress the electromagnetic interference and to suppress the curvature of the wafer.

It is necessary that the edge 31 extend further outward than the side wall 12s, which serves as an edge of the upper insulating layer 12, in the extending directions of the surface of the semiconductor chip on which the electrode pads 10 are provided. However, from a standpoint of the thickness of the lower insulating layers and the upper insulating layer, in each of the present embodiment and the aforementioned embodiments, it is only necessary to satisfy such a condition that the total thickness of at least the lower insulating layers (total thickness of the lower insulating layers or the total thickness of the lower insulating layers and the upper insulating layer) in each of the secondary-wire-free areas respectively corresponding to the embodiments is less than the total thickness of the lower insulating layers and the upper insulating layer in each of the secondary-wire-containing areas respectively corresponding to the embodiments. Therefore, as long as the condition is satisfied, it does not matter whether the lower insulating layers 11a to 11c and the upper insulating layer 12 are present or absent in each of the secondary-wire-containing areas and each of the secondary-wire-free areas and how thick the lower insulating layers 11a to 11c and the upper insulating layer 12 are in each of the secondary-wire-containing areas and each of the secondary-wire-free areas.

Embodiment 9

A method according to an embodiment for manufacturing a semiconductor device will be described below with reference to FIGS. 9(a) through 9(f).

FIGS. 9(a) through 9(f), showing a method for manufacturing a semiconductor device according to an embodiment, are diagrams showing, as an example of the manufacturing method, steps of manufacturing the semiconductor device of FIGS. 7(a) and 7(b) as seen from the same surface as in FIG. 7(b). Steps of manufacturing the semiconductor devices 1a to 1f and 1h of FIGS. 1(a) and 1(b) through 6(a) and 6(b) and FIGS. 8(a) and 8(b) will not be fully described, and only steps different from the steps of manufacturing the semiconductor device 1g of FIGS. 7(a) and 7(b) will be described.

First, the step of FIG. 9(a) of manufacturing the semiconductor device 1g will be described.

The semiconductor chip 8 of the semiconductor device 1g is provided with an electronic circuit section 51 (see FIG. 7(a)) for processing an analog signal, and is provided with electrode pads 10 for electrically connecting one electronic circuit section 51 to another and electrically connecting the semiconductor chip 8 to the outside via primary wires (not shown).

Electrode pads 10 are peripherally disposed on surfaces of semiconductor chips 8 regularly disposed in rows and columns on a wafer (not shown). It should be noted that the semiconductor chip 5 of the semiconductor device 1d of FIGS. 4(a) and 4(b) has an electrode pad 10 disposed in a portion corresponding to a predetermined external connection terminal.

Formed on the surface of a semiconductor chip 8 is a lower insulating layer 11a for protecting the electronic circuit section 51, the primary wires, and the like. The lower insulating layer 11a is provided with an opening 11ah via which an electrode pad 10 is partially exposed and a side wall 11as provided around a scribe line area.

As described above, the lower insulating layer 11a is preferably made, for example, of an oxide film, which is inorganic matter, but may be made of a nitride film or may be omitted.

Further, although not shown, in order to prevent chipping in dividing the wafer into separate semiconductor devices 1g in a later dicing step, it is preferable that the lower insulating layer 11a have an opening further provided in a dicing line area. In this case, the step of forming the opening 11ah for an electrode pad 10 and the step of forming the opening for the dicing line area are preferably carried out simultaneously.

Furthermore, as for the semiconductor devices 1g and 1h of FIGS. 7(a) and 7(b) and FIGS. 8(a) and 8(b), the lower insulating layer 11c is formed on top of the lower insulating layer 11a. The stage of forming the lower insulating layer 11c is taken before the step of FIG. 9(b) in the case of the semiconductor device 1g, and is taken after the step of FIG. 9(c) in the case of the semiconductor device 1h.

The lower insulating layer 11c has an opening 11ch, formed on top of the electrode pad 10 and the lower insulating layer 11a, which is larger in size than the opening 11ah of the lower insulating layer 11a. The purpose of forming such an opening 11ch is to sufficiently ensure a current path in cases where a strong electrical current is processed.

As for the semiconductor device 1h of FIGS. 8(a) and 8(b), the lower insulating layer 11c has an opening 11ch, formed on top of the electrode pad 10, which is smaller in size than the opening 11ah of the lower insulating layer 11a. As with the purpose of smoothing angular step portions of the lower insulating layer 11b in the embodiment of FIGS. 8(a) and 8(b), the purpose of forming such an opening 11ch is to improve the coverage of the secondary wire 21 by covering the opening 11ah, which is a step portion of the lower insulating layer 11a, with the lower insulating layer 11a, i.e., to increase the amount of space of adhesion between the secondary wire 21 and the lower insulating layers 11a to 11c. However, a step of a step portion of the inorganic lower insulating layer 11a, i.e., a step of a side-wall portion of the opening 11ah, is often much lower than a step of a step portion of the organic lower insulating layer 11b, i.e., a step of a side-wall portion of the side wall 11bs' or 11bs". Moreover, for example, when the step of the step portion of the lower insulating layer 11a has a height of not more than 1 μm, it is preferable, for the purpose of processing a strong electrical current, that the opening 11ch be formed so as to be larger in size than the opening 11ah.

Further, the lower insulating layer 11c has a side wall 11cs formed in a scribe line area. However, the side wall 11cs is formed on top of the semiconductor chip 8 so as to be closer to the center of the semiconductor chip 8 than is the side wall 11as, or so as to be in substantially the same position as the side wall 11as. The purpose of forming such a side wall 11cs is to reduce the risk if chipping by sufficiently ensuring a dicing area.

As for the semiconductor device 1a, shown in FIGS. 1(a) and 1(b), in which the lower insulating layer 11b is formed on the lower insulating layer 11a, an opening 11bh of the lower insulating layer 11b is formed above the electrode pad 10 and the lower insulating layer 11a so as to be larger in size than the opening 11ah of the lower insulating layer 11a. The purpose of forming such an opening 11bh is to sufficiently ensure a current path in cases where a strong electrical current is processed.

Further, the lower insulating layer 11b has a side wall 11bs formed in a scribe line area. However, the side wall 11bs is formed on top of the semiconductor chip 2 so as to be closer to the center of the semiconductor chip 2 than is the side wall 11as, or so as to be in substantially the same position as the side wall 11as. The purpose of forming such a side wall 11bs is to reduce the risk of chipping by sufficiently ensuring a dicing area.

However, in order to protect the electronic circuit section 51 formed on the semiconductor chip, it is preferable that, as shown in each of FIGS. 7(b) and 8(b), the lower insulating layer 11c be formed in substantially the whole area of the semiconductor chip 8 (semiconductor chip 9) except the electrode pads 10.

Further, in cases where the influence on the curvature of a wafer is preferentially suppressed, the periphery of the electrode pads 10 peripherally disposed on the semiconductor chip 8 and the like may not be greatly affected by the electromagnetic interference even without forming the lower insulating layer 11c. Also in this case, the formation of the lower insulating layer 11a makes it possible to sufficiently protect the electronic circuit section 51 from chemical damage and physical damage.

Furthermore, each of the semiconductor devices 1g and 1h of FIGS. 7(a) and 7(b) and FIGS. 8(a) and 8(b) has the lower insulating layer 11a for protecting, from physical damage and chemical damage, the electronic circuit section 51 formed on the semiconductor chip 8 (semiconductor chip 9). Therefore, each of the semiconductor devices 1g and 1h of FIGS. 7 and 8 may be arranged such that the lower insulating layer 11c covers only an area of the semiconductor chip 8 (semiconductor chip 9) where the electronic circuit section 51 is formed, and may be further arranged such that the lower insulating layer 11c covers only a secondary-wire-containing area (first or second secondary-wire-containing area). It should be noted that this arrangement is convenient for suppression of the curvature of a wafer.

In the following, the step of FIG. 9(b) of manufacturing the semiconductor device 1g will be described.

Underneath a secondary wire 21 (see FIG. 9(d)) to be formed later on the semiconductor chip 8 and an area around the secondary wire 21, a lower insulating layer 11b provided with side walls 11bs' and 11bs" is formed so as to be slightly larger in size than the secondary wire 21 (i.e., so as to be slightly wider than the secondary wire 21). The lower insulating layer 11b is made slightly larger in size than the secondary wire 21 for the following two reasons.

That is, the first reason is to surely keep the electronic circuit section 51 of the semiconductor chip 8 and the secondary wire 21 away from each other. Further, the second reason is that an attempt to form the lower insulating layer 11b and the secondary wire 21 in identical sizes makes it necessary to strictly consider the accuracy of size of the side walls 11bs' and 11bs" in aligning the lower insulating layer 11 and the secondary wire 21 with accuracy and in using a photo step or the like.

In cases where the lower insulating layer 11b is made of a photosensitive material, it is possible to reduce the area around a secondary-wire-containing area.

Further, it is preferable that the lower insulating layer 11b be made of a positive-type material whose exposed portion is removed. The reason for this is as follows: a further improvement in the accuracy makes it possible to further reduce the area around a second secondary-wire-containing area, thereby making it possible to greatly suppress the curvature of the wafer.

However, the lower insulating layer 11b needs to be formed very thickly on a semiconductor chip that processes a high-frequency signal. Therefore, in this case, the lower insulating layer 11b can be formed by a printing method or sheet mounting with use of a negative-type photosensitive resin or a nonphotosensitive resin.

Furthermore, for the purpose of suppressing the curvature of the wafer, each of the semiconductor devices 1f to 1h of FIGS. 6(a) and 6(b) through 8(a) and 8(b) is arranged such that the lower insulating layer 11b is formed only in an area excluding the pad section 21a and the land section 21c of the secondary wire 21, i.e., an area where the wiring section 21b is formed. This is because the wiring section 21b whose signal path is parallel to the electronic circuit section 51 of the semiconductor chip 7 (semiconductor chip 8, semiconductor chip 9) is more greatly affected by the electromagnetic interference.

Furthermore, in order to suppress the curvature of the wafer and to suppress the electromagnetic interference, it is desirable that the lower insulating layer 11b be formed in advance so that the thickness of the lower insulating layer 11b varies depending on where the secondary wire 21 is formed later. The relationship between the secondary wire 21 and an area where the lower insulating layer 11b is formed has been described in the aforementioned embodiment, therefore will not be fully described below.

In the following, the step of FIG. 9(c) of manufacturing the semiconductor device 1g will be described.

Although not shown, in the step of FIG. 9(c) of manufacturing the semiconductor device 1g, as preparations for formation of secondary wires 21 by electroplating, a thin film, such as Ti, Ti—W, or chromium (Cr), which has a barrier effect against the electrode pads 10 is formed all over the wafer, and a thin film made of the same material as the secondary wires 21 is further formed.

For example, in cases where the secondary wires 21 are made of Cu, or in cases where the secondary wires 21 are made of multiple layers of materials and the undermost layer is made of Cu, a thin film of Cu is preferably formed all over the wafer as a base for the secondary wires 21. The thin film of Cu functions as a conducting layer for use in electroplating and as a layer of adhesion between the secondary wires 21 and the barrier layer.

Next, on the thin film that has a barrier effect and an adhesive effect with respect to the electrode pads 10, a photoresist 41 is formed all over the wafer so as to have side walls 41s formed in portions in contact with first secondary-wire-containing areas.

In the following, the step of FIG. 9(d) of manufacturing the semiconductor device 1g will be described.

In the step of FIG. 9(d) of manufacturing the semiconductor device 1g, secondary wires 21, made of Cu for example, each of which includes a pad section 21a, a wiring section 21b, and a land section 21c are formed by electroplating so as to have a thickness of approximately 1 μm to 20 μm.

In cases where multiple layers are electroplated, it is only necessary to form other materials by electroplating continuously in areas surrounded by the side walls 41 of the photoresist 41. Also in this case, in order to improve the coverage in forming an upper insulating layer 12 in a later step, it is preferable that the secondary wires 21 have a thickness of not more than 20 μm. In the present embodiment, Cu-single-layer secondary wires 21 are formed so as to have a thickness of 10 μm.

In the following, the step of FIG. 9(e) of manufacturing the semiconductor device 1g will be described.

In the step of FIG. 9(e) of manufacturing the semiconductor device 1g, the photoresist 40 formed in the aforementioned step is removed by remover, ashing, or the like, and the Cu thin film and the Ti, Ti—W, or Cr thin film are removed as unnecessary by etching.

Finally, the step of FIG. 9(f) of manufacturing the semiconductor device 1g will be described.

In the step of FIG. 9(f) of manufacturing the semiconductor device 1g, the upper insulating layer 12 is formed so as to cover upper and side surfaces of each of the secondary wires 21, and the upper insulating layer 12 has an opening 12h formed above the land section 21c. In the present embodiment, in order to surely protect the secondary wires 21 and to suppress the curvature of the wafer, the upper insulating layer 12 is made of PBO, which is positive-type photosensitive organic matter.

The upper insulating layer 12 has such a thickness as to surely protect the secondary wires 21. That is, for example, it is preferable that the upper insulating layer 12 be formed so as to be approximately 0.5 to 1.5 times as thick as the secondary wires 21. However, since such a thickness is to be obtained after the upper insulating layer 12 becomes hardened, the upper insulating layer 12 is approximately 1 to 3 times as thick as the secondary wires 21 before hardening and shrinkage, i.e., after spin coating, or after drying. A greater thickness of the upper insulating layer 12 improves the effect of protecting the secondary wires 21, but undesirably strengthens the degree of curvature of the wafer.

When the upper insulating layer 12 is formed extremely thinly by a spin-coating method, it becomes difficult, depending on the viscosity of varnish or the spin speed, to sufficiently cover the secondary wires 21 with the upper insulating layer 12.

Therefore, in the present embodiment, the upper insulating layer 12 is formed with use of PBO in varnish form by a spin-coating method so as to have a thickness of approximately 8 μm on the secondary wires 21. In this case, it is necessary to appropriately adjust the viscosity of PBO in varnish form and the spin rotation speed.

Further, the upper insulating layer 12 only needs to be formed in such an area as to cover at least the upper and side surfaces of each of the secondary wires 21. However, in consideration of adhesion to the lower insulating layer, it is preferable to ensure an area of 5 μm to 200 μm.

Further, in the case of a combination of neighboring secondary wires 21 or, neighboring wiring sections 21b in particular, that affect each other to a large degree, it is necessary to form a portion void of an insulating layer between the secondary wires 21, or between the wiring sections 21b in particular. The present embodiment forms the void portion by forming a depression 12ho in the upper insulating layer 12.

In order to suppress the curvature of the wafer and the risk of a chipping defect at the time of dicing, it is preferable that the upper insulating layer 12 have a side wall 12s formed in a scribe line area. In the semiconductor device 1b of FIGS. 2(a) and 2(b), it is only necessary to form an opening 12h only above the land section 21c. Also in the semiconductor device 1b, the curvature of the wafer and the chipping can be reduced by further forming a side wall 12s in a scribe line area of the semiconductor chip 3.

After these steps, if necessary, substrate mounting is facilitated by forming a bump with use of a material, such as solder, which forms a joint in a liquid phase. At this time, in a semiconductor device manufactured by the manufacturing method of FIGS. 9(a) through 9(f), since the upper insulating layer 12 has an opening 12h formed above the land section 21c of each of the secondary wires 21, such a risk is greatly reduced that the material which forms a joint in a liquid phase flows out to the wiring section 21b and the like. Further, in making, instead of providing the land section 21c with a bump, an electrical connection to a mounting substrate with use of a material, such as solder, which forms a joint in a liquid phase, the formation of the opening 12h in a semiconductor device manufactured by the manufacturing method of FIGS. 9(a) through 9(f) prevents the material, which forms a joint in a liquid phase, from flowing out to the wiring section 21b and the like.

Semiconductor devices 1g thus completed in wafer form are cut along scribe lines into separate semiconductor devices 1g.

In FIGS. 9(a) through 9(f), attention is focused on a single semiconductor device. However, as described above, it is efficient to complete a single semiconductor device by manufacturing a plurality of semiconductor devices in wafer form and by dividing the wafer in the final stage. Further, in the manufacturing stage, a semiconductor device according to the present invention has external connection terminals facing upward as shown in FIGS. 9(a) through 9(f). However, as a finished product, the semiconductor device is used with the external connection terminals facing downward.

A semiconductor device thus completed by the method can suppress the electromagnetic interference and reduce wiring delays.

Further, in a stage prior to separating semiconductor devices manufactured by the manufacturing method of FIGS. 9(a) through 9(f), for example, in cases where the semiconductor devices are prepared on a silicon wafer whose circuit-forming surface has a diameter of 8 inches, the curvature of the wafer can be kept not more than several millimeters even in the case of a thickness of 300 μm to 150 μm.

Furthermore, in a dicing step or the like, it becomes possible to suppress such problems as a transport error in the electrical signal and the breakage of the wafer.

As with the case of use of a wafer of another size or a wafer made of a substance other than silicon, the degree of suppression of the curvature varies; however, the same effect is brought about as the effect of suppressing the curvature. Further, even in the case of the wafer, made of silicon, whose circuit-forming surface has a diameter of 8 inches, the degree of suppression of the curvature varies depending on the difference in process of manufacturing a semiconductor device; however, the same effect is brought about as the effect of suppressing the curvature. Moreover, a semiconductor device thus separated can minimize a change in electrical characteristics.

Embodiment 10

A semiconductor device according to another embodiment will be described below with reference to FIGS. 11(a) and 11(b) through 15(a) and 15(b).

FIG. 11(a), showing an embodiment, is a plan view showing an arrangement of a semiconductor device 1i. FIG. 11(b) is a cross-sectional view taken along the line 11A-11B of FIG. 11(a).

The semiconductor device 1a of FIGS. 1(a) and 1(b) is arranged such that the upper insulating layer 12 has a depression 12ho formed in a first secondary-wire-free area excluding a first secondary-wire-containing area and an area therearound. That is, the semiconductor device 1a of FIGS. 1(a) and 1(b) is arranged such that the upper insulating layer 12, which is greater in height than a secondary wire 21 above a circuit-forming surface of the semiconductor chip 2 in an area where the secondary wire 21 is provided, is provided with a depression 12ho. Further, in other words, the lower insulating layers 11a and 11b here can be said to be less in height than a secondary wire 21 above the circuit-forming surface of the semiconductor chip 2 in an area where the secondary wire 21 is provided. Hereinafter, an upper insulating layer and a middle insulating layer (described below in detail) that exist in a higher position than a specific secondary wire above a circuit-forming surface of a semiconductor chip in an area where the specific secondary wire is provided are referred to as "superior insulating layers". Further, hereinafter, an middle insulating layer and a lower insulating layer that exist in a lower position than a specific secondary wire above a circuit-forming surface of a semiconductor chip in an area where the specific secondary wire is provided are referred to as "inferior insulating layers".

The semiconductor device 1i of FIGS. 11(a) and 11(b) is provided with multiple layers of secondary wires 21X and 21Y. That is, the semiconductor device 1i of FIGS. 11(a) and 11(b) is provided with a secondary wire 21X and a secondary wire (uppermost secondary wire) 21Y that differ from each other in height above the circuit-forming surface of the semiconductor chip 2, i.e., that differ from each other in thickness of inferior insulating layers. The secondary wire 21X includes a pad section 21Xa, a wiring section 21Xb, and a land section 21Xc. Further, the secondary wire 21Y includes a pad section 21Ya, a wiring section 21Yb, and a land section 21Yc. It should be noted here that the pad sections 21Xa and 21Ya are members having the same function as the pad section 21a of the secondary wire 21, that the wiring sections 21Xb and 21Yb are members having the same function as the wiring section 21b of the secondary wire 21, and that the land sections 21Xc and 21Yc are members having the same function as the land section 21c of the secondary wire 21.

An arrangement, such as the semiconductor device 1i of FIGS. 11(a) and 11(b), in which multiple layers of secondary wires are provided has the following advantages over an arrangement in which only single-layer secondary wires are provided.

That is, as the number of secondary wires' land sections, serving as external connection terminals, which form a matrix increases, for example, to 56 (7×7) or 64 (8×8), it becomes difficult to run the secondary wires from electrode pads toward the center of a semiconductor device. Needless to say, the wiring is difficult when the matrix is a full matrix. In cases where the external connection terminals are placed at wide intervals or in cases where the secondary wires can be formed at narrow pitches, an increase in the matrix does not cause too much trouble. However, in either case, there is a limit on the degree to which the wiring is facilitated. It should be noted that the degree to which the secondary wires can be formed at narrow pitches varies depending, for example, on how the secondary wires are formed. Therefore, as in the case of the semiconductor device 1i of FIGS. 11(a) and 11(b), the use of multiple layers of secondary wires eases restrictions on the wiring.

The present embodiment describes a semiconductor device, having multiple layers of secondary wires different in thickness of inferior insulating layers from each other, which is arranged so to be capable of suppressing electromagnetic interference and suppressing the curvature of a wafer.

In the semiconductor device 1i of FIGS. 11(a) and 11(b), the secondary wire 21X has the lower insulating layers 11a and 11b serving as inferior insulating layers, and has a middle insulating layer 13 serving as an superior insulating layer. Although not shown in FIGS. 11(a) and 11(b), the secondary wire 21X may further has the upper insulating layer 12 serving as a superior insulating layer.

The secondary wire 21Y has the lower insulating layers 11a and 11b and the middle insulating layer 13 serving as inferior insulating layers, and has the upper insulating layer 12 serving as a superior insulating layer.

The middle insulating layer 13 has a side wall 13s provided in a scribe line area. The side wall 13s is provided on top of the semiconductor chip 2 so as to be closer to the center of the semiconductor chip 2 than is the side wall 11bs and further away from the center of the semiconductor chip 2 than is the side wall 12s, or so as to be in substantially the same position as the side wall 11bs and/or the side wall 12s. However, since it is necessary to consider how the side wall 13s is positioned with respect to the secondary wires 21X and 21Y, i.e., since the secondary wires 21X and 21Y may not be sufficiently protected when the side wall 13s is provided so as to be too close to the center of the semiconductor chip 2, the side wall 13s is provided at a distance of approximately 5 µm to 100 µm from the edge 31. However, the middle insulating layer 13 only needs to be arranged so as to be capable of providing insulation between multiple layers of secondary wires, provided on the top and bottom of the middle insulating layer 13, which should be insulated from each other. Therefore, for example, in cases where the middle insulating layer 13 is provided only in an area where the secondary wire 21X is provided, an area therearound, and an area where the secondary wire 21Y is provided, the side wall 13s may be arranged so as to be provided at a distance of approximately more than 100 µm from the edge 31, e.g., at a distance of approximately 5 µm to 100 µm from the edge 31. It should be noted that the numerical value indicates that the side wall 13s is positioned at the shortest distance from the edge 31. That is, in an area free of a secondary wire 21X or 21Y, the side wall 13s can be formed so as to be much closer to the center of the semiconductor chip 2, i.e., further away from the edge 31, or the side wall 13s may not be formed. Further, the middle insulating layer 13 has an opening 13h, formed above the pad section 21Ya of the secondary wire 21Y, which is larger in size than the opening 11bh of the lower insulating layer 11b.

The upper insulating layer 12 has a depression 12ho formed in a secondary-wire-free area 61B excluding a secondary-wire-containing area 61A where the secondary wire 21Y is provided and an area therearound. Further, as shown in FIG. 11(b), the upper insulating layer 12 may have an opening 12h' formed above the pad section 21Ya of the secondary wire 21Y.

The secondary wire 21X is substantially entirely covered with the middle insulating layer 13, excluding the land section 21Xc. That portion of the secondary wire 21X which intersects with the secondary wire 21Y is further covered with the upper insulating layer 12 (see FIG. 11(a)).

In the semiconductor device 1i of FIGS. 11(a) and 11(b), the upper insulating layer 12 has the depression 12ho formed in the secondary-wire-free area 61B. Therefore, the total thickness of the insulating layers provided in the secondary-wire-free area 61B so as to include at least the lower insulating layers is the total thickness of the lower insulating layers 11a and 11b and the middle insulating layer 13. Meanwhile, the total thickness of the inferior insulating layers and the superior insulating layer in the secondary-wire-containing area 61A is the total thickness of the lower insulating layers 11a and 11b, the middle insulating layer 13, and the upper insulating layer 12. Moreover, the total thickness of the insulating layers provided in the secondary-wire-free area 61B so as to include at least the lower insulating layers is less than the total thickness of the inferior insulating layers and the superior insulating layer in the secondary-wire-containing area 61A. Further, the depression 12h is formed between a specific secondary wire 21Y and a secondary wire 21Y adjacent thereto. Therefore, since an increase in parasitic capacitance can be suppressed by reducing the permittivity of an area between the neighboring secondary wires 21Y, wiring delays can be reduced.

Meanwhile, the secondary wire 21X has the following relationship established in a secondary-wire-free area 61D excluding a secondary-wire-containing area 61C where the secondary wire 21X is provided and an area therearound. That is, the insulating layers in the secondary-wire-containing area 61C and the secondary-wire-free area 61D have substantially the same total thickness as the insulating layers provided in the secondary-wire-free area 61B. The reason for this is as follows: In cases where neighboring secondary wires 21X are not close to each other or in the case of a combination of neighboring secondary wires 21X that do not greatly affect each other, the number of problems to be caused by omitting the void portion (i.e., depression) between the secondary wires 21X is small. Examples of the "combination of neighboring secondary wires 21X that do not greatly affect each other" include a combination of neighboring secondary wires 21 that does not include a terminal for processing a minute electric current or that does not process a high-frequency signal.

The lower insulating layer 11b is made of 5-µm-thick polyimide. In the present embodiment, the lower insulting layer 11b only needs to be arranged so as to have a side wall 11bs formed in a scribe line area and have an opening 11bh formed above an electrode pad 10; therefore, the lower insulating layer 11b does not need to be patterned with high accuracy. Therefore, the lower insulating layer 11b may be made of a nonphotosensitive material. However, the lower insulating layer 11b may of course be made of a photosensitive material, or may be made of another resin such as PBO.

The semiconductor device 1l of FIGS. 11(a) and 11(b) is identical in other arrangements to the semiconductor device 1a of FIGS. 1(a) and 1(b), and therefore will not be fully described below.

According to the foregoing arrangement, a semiconductor device having multiple layers of secondary wires different from each other in thickness of inferior insulating layers brings about the same effect as the aforementioned embodiments.

FIG. 12(a), showing an embodiment of the present invention, is a plan view showing an arrangement of a semiconductor device 1j. FIG. 12(b) is a cross-sectional view taken along the line 12A-12B of FIG. 12(a).

The semiconductor device 1i of FIGS. 11(a) and 11(b) is arranged such that the insulating layers in the secondary-wire-free area 61D and the insulating layers in the secondary-wire-containing area 61C have substantially the same total thickness.

The semiconductor device 1j of FIGS. 12(a) and 12(b) is arranged such that the secondary wire 21 is covered with the upper insulating layer 12 and the upper insulating layer 12 has a depression 14 formed in the secondary-wire-free area 61D. Such an arrangement can suppress a problem to be caused by a combination of neighboring secondary wires 21X that are close to each other and greatly affect each other. Examples of the "combination of neighboring secondary wires 21X that greatly affect each other" include a combination of neighboring secondary wires 21 that includes a terminal for processing a minute electric current or that processes a high-frequency signal.

Instead of being arranged as described above, the semiconductor device 1j of FIGS. 12(a) and 12(b) may be arranged such that the secondary wire 21X is covered with the middle insulating layer 13 and the middle insulating layer 13 has a depression (not shown), formed in the secondary-wire-free area 61D, which corresponds to the depression 14.

Further, although not shown in FIG. 12(b), the upper insulating layer 12 may have an opening (corresponding to the opening 12h' of FIG. 11(b)) above the pad section 21Ya of the secondary wire 21Y. Further, as shown in FIG. 12(b), the middle insulating layer 13 may be omitted from the secondary-wire-free area 61D.

The semiconductor device 1j of FIGS. 12(a) and 12(b) is identical in other arrangements to the semiconductor device 1i of FIGS. 11(a) and 11(b), and therefore will not be fully described below.

As compared with the semiconductor device 1i of FIGS. 11(a) and 11(b), the semiconductor device 1j of FIGS. 12(a) and 12(b) brings about a more improved effect of suppressing the curvature of a wafer.

FIG. 13(a), showing an embodiment of the present invention, is a plan view showing an arrangement of a semiconductor device 1k. FIG. 13(b) is a cross-sectional view taken along the line 13A-13B of FIG. 13(a).

The semiconductor device 1k of FIGS. 13(a) and 13(b) is arranged such that the middle insulating layer 13 has a side wall 13s' formed in addition to the depression 12ho in the arrangement of the semiconductor device 1j of FIGS. 12(a) and 12(b).

That is, the semiconductor device 1k of FIGS. 13(a) and 13(b) can be interpreted as being obtained by applying, to the arrangement of the semiconductor device 1j of FIGS. 12(a) and 12(b), an arrangement in which the middle insulating layer 13 is provided with the side wall 13s' corresponding in shape to the side wall 11bs' of the semiconductor device 1c of FIGS. 3(a) and 3(b).

In the cross-sectional view shown in FIG. 13(b), the side wall 12s is closer to the edge 31 of the semiconductor chip 2 than is the side wall 13s. However, the side wall 12s is not limited to this. The side wall 12s may be closer to the center of the semiconductor chip 2 than is the side wall 13s. However, exclusively in terms of the positional relationship between the side walls 12s and 13s around the scribe line, the effect of reducing the curvature of a wafer is more profound when the side wall 12s is closer to the center of the semiconductor chip 2 than is the side wall 13s as shown in FIG. 12(b).

As compared with the semiconductor device 1j of FIGS. 12(a) and 12(b), the semiconductor device 1k of FIGS. 13(a) and 13(b) brings about a more improved effect of suppressing the curvature of a wafer.

FIG. 14(a), showing an embodiment of the present embodiment, is a plan view showing an arrangement of a semiconductor device 1l. FIG. 14(b) is a cross-sectional view taken along the line 14A-14B of FIG. 14(a).

The semiconductor device 1i of FIGS. 11(a) and 11(b) is arranged such that the upper insulating layer 12 has the depression 12ho formed in the secondary-wire-free area 61B.

Meanwhile, the semiconductor device 1l of FIGS. 14(a) and 14(b) is arranged such that the depression 12ho is replaced by a side wall 13' formed by the middle insulating layer 13 serving as an inferior insulating layer underneath the secondary wire 21Y. In the present embodiment, the middle insulating layer 13 is made of 10-μm-thick PBO.

Moreover, the side wall 13s' is formed at a distance of approximately 0 μm to 200 μm from the secondary-wire-containing area 61A.

Further, on the assumption that a predetermined secondary wire 21Y is in a reference position, the middle insulating layer 13 is completely removed from an area located further away from a secondary wire 21 adjacent to the predetermined secondary wire than from the side wall 13s' (i.e., in a specific place where the "distance between the secondary wire 21Y and the side wall 13s'" is shorter than the "distance between the secondary wire 21Y and a specific place").

That is, an area located further away from the predetermined secondary wire 21Y than is the side wall 13s' becomes a secondary-wire-free area 62B from which the middle insulating layer 13 is completely removed.

That is, in the present embodiment, the formation of the side wall 13s' removes the middle insulating layer 13 from substantially the whole secondary-wire-free area 62B excluding at least the secondary-wire-containing area 61A.

In order to bring the side wall 13s' into closest possible contact with the secondary wire 21Y, it is desirable that the middle insulating layer 13 be made of a photosensitive material.

Further, in cases where the influence on the curvature of a wafer is preferentially suppressed, it is preferable that the middle insulating layer 13 be made of a positive-type material that excels in accuracy of position. Further, in this case, it is preferable that the middle insulating layer 13 have a thickness of not more than 40 μm. Meanwhile, in cases where the influence on the electromagnetic interference is preferentially suppressed, the middle insulating layer 13 is preferably formed with use of a negative-type material that can be formed into a thick film, or formed by a printing method or the like with use of a nonphotosensitive material or the like. When the middle insulating layer 13 is formed with use of a negative-type material, the middle insulating layer 13 can be formed so as to have a thickness of approximately 100 μm.

Alternatively, when the middle insulating layer 13 is formed by a printing method or the like with use of a nonphotosensitive material or the like, the middle insulating layer 13 can be more suitably formed so as to have a thickness of not less than 100 µm. Even in the case of use of a photosensitive material, the middle insulating layer 13 can be formed thickly by repeating a photo step more than once. However, such a method undesirably causes an increase in the number of steps.

Further, for example, the upper insulating layer 12 has a thickness of 8 µm in the secondary-wire-containing area 61A, and has a thickness of 10 µm in the secondary-wire-free area 62B. In the secondary-wire-free area 62B, the upper insulating layer 12 covers the side wall 13s' and the whole second secondary-wire-free area 62B.

The upper insulating layer 12 varies in thickness between the secondary-wire-containing area 61A and the secondary-wire-free area 62 B for the following reason.

That is, in cases where the upper insulating layer 12 is formed by a spin-coating method with use of varnish, the secondary-wire-free area 62B formed so as to be lower than the secondary-wire-containing area 61A is coated with a larger amount of resin than is the secondary-wire-containing area 61A. Therefore, in the secondary-wire-containing area 61A, the upper insulating layer 12 has a thickness of 8 µm so as to be thinner than the middle insulating layer 13.

Further, the secondary-wire-free area 62B is free of a 10-µm-thick middle insulating layer 13 and an 8-µm-thick secondary wire 21Y.

Further, as described above, the upper insulating layer 12 has a thickness of 10 µm in the secondary-wire-free area 62B, and has a thickness of 8 µm in the secondary-wire-containing area 61A. Therefore, when the upper insulating layer 12 covers the side wall 13s' and the whole secondary-wire-free area 62B, the upper insulating layer 12 has a depression 12ho' formed above the secondary-wire-free area 62B.

It should be noted that the depth of the depression 12ho' can be appropriately set in consideration of the thickness of the upper insulating layer 12, the thickness of the middle insulating layer 13, the thickness of the secondary wire 21Y, and the like.

In cases where the upper insulating layer 12 is formed by a spin-coating method so as to be in the first secondary-wire containing area and the second secondary-wire-free area, it is advisable to set conditions such as the viscosity of the upper insulating layer 12 in varnish form and the number of spin rotations so that the thickness of the upper insulating layer 12 in the secondary-wire-free area 62B is not more than the thickness of the middle insulating layer 13 in the secondary-wire-containing area 61A.

The semiconductor device 1l of FIGS. 14(a) and 14(b) is identical in other arrangements to the semiconductor device 1i of FIGS. 11(a) and 11(b), and therefore will not be fully described below.

According to the foregoing arrangement, the insulating layers are formed thickly in the secondary-wire-containing area 61A and thinly in the area free of a secondary wire 21Y. With this, even in the case of overlap between a secondary wire 21Y and the electronic circuit section 51 of the semiconductor chip 2, it becomes possible to suppress electromagnetic interference between the secondary wire 21Y and the electronic circuit section 51 and to suppress the curvature of the wafer.

Furthermore, the insulating layers are formed more thinly in the secondary-wire-free area 62B than in the secondary-wire-containing area 61A. With this, even in cases where the semiconductor chip 2 has an electronic circuit section 51 serving as an analog circuit, stress on the electronic circuit section 51 can be reduced, so that a change in electrical characteristics can be suppressed.

Further, in the semiconductor device 1l of FIGS. 14(a) and 14(b), the middle insulating layer 13 has a thickness of 10 µm in the secondary-wire-containing area 61A, and the middle insulating layer 13 and the upper insulating layer 12 have a thickness of 0 µm and a thickness of 10 µm, respectively, in the secondary-wire-free area 62B. Further, the thickness of the lower insulating layer 11b does not vary between the secondary-wire-containing area 61A and the secondary-wire-free area 62B. Therefore, the total thickness of the organic insulating layers does not vary between the secondary-wire-containing area 61A and the secondary-wire-free area 62B. That is, the total thickness of the insulating layers in the secondary-wire-free area 62B is not more than the total thickness of the inferior insulating layers in the secondary-wire-containing area 61A.

Therefore, the formation of the void portion area between neighboring secondary wires 21, or between neighboring wiring sections 21b in particular, makes it possible to reduce the parasitic capacitance. This makes it possible to reduce wiring delays.

It should be noted that the semiconductor device 1l of FIGS. 14(a) and 14(b) is arranged such that the lower insulating layer 13 is provided so as not to be in the secondary-wire-free area 62B. However, the semiconductor device 1l of FIGS. 14(a) and 14(b) is not limited to such an arrangement.

That is, the semiconductor device 1l of FIGS. 14(a) and 14(b) only needs to be arranged such that the total thickness of insulating layers in a secondary-wire-free area (i.e., secondary-wire-free area 62B) excluding a secondary-wire-containing area (i.e., secondary-wire-containing area 61A) where at least a secondary wire is provided is not more than the total thickness of inferior insulating layers in the secondary-wire-containing area. Moreover, as long as such an arrangement is satisfied, it does not matter whether the middle insulating layer 13 is present or absent in the secondary-wire-free area 62B.

However, in an area where at least an element (not shown) of the semiconductor chip 2 exists, the formation of the lower insulating layer 11a provides protection against external physical and chemical damage to some extent. Further, such an arrangement is possible that the lower insulating layer 11a is replaced by the lower insulating layer 11b alone. However, an arrangement in which only the lower insulating layer 11a made of an oxide film or a nitride film is provided is not sufficient in terms of protection against physical damage. Therefore, it is preferable to further provide an organic material such as the lower insulating layer 11b. Further, the lower insulating layer 11a may be replaced by the organic middle insulating layer 13 or the organic upper insulating layer 12. Similarly, it does not matter whether the lower insulating layer 11b is present or absent in the secondary-wire-free area 62B. However, it is necessary to provide an inferior insulating layer or a superior insulating layer at least in the area where the element of the semiconductor chip 2 exists, and it is safer to further provide any one of the organic insulating layers such as the lower insulating layer 11b, the middle insulating layer 13, and the upper insulating layer 12. The same applies to any semiconductor device according to the present invention.

FIG. 15(a), showing an embodiment of the present embodiment, is a plan view showing an arrangement of a semiconductor device 1m. FIG. 15(b) is a cross-sectional view taken along the line 15A-15B of FIG. 15(a).

In addition to the arrangement of the semiconductor device 1l of FIGS. 14(a) and 14(b), the semiconductor device 1m of FIGS. 15(a) and 15(b) is arranged such that the lower insulating layer 11b is further provided with a side wall 11bs'. In the semiconductor device 1m of FIGS. 15(a) and 15(b), the formation of the side wall 11bs' in the lower insulating layer 11b removes the lower insulating layer 11b from substantially the whole secondary-wire-free area 62D excluding the secondary-wire-containing area 61C where at least the secondary wire 21X is provided.

The semiconductor device 1m of FIGS. 15(a) and 15(b) is provided with a single secondary wire 21X. However, in cases where the semiconductor device 1m of FIGS. 15(a) and 15(b) is provided with two or more secondary wires 21X, parasitic capacitance can be reduced by providing a side wall 11bs' between neighboring secondary wires 21X, or between neighboring wiring sections 21Xb in particular. The present embodiment has an area where the lower insulating layer 11b exists between secondary wires 21Y (the leftmost secondary wire 21Y of FIG. 15(b) and the like). However, the lower insulating layer 11b may have a side wall 11bs' provided also in that area. With this, the total thickness of the insulating layers in the depression 12ho' can be reduced, so that the curvature of the wafer can be further suppressed.

The semiconductor device 1m of FIGS. 15(a) and 15(b) is identical in other arrangements to the semiconductor device 1l of FIGS. 14(a) and 14(b), and therefore will not be fully describe below.

According to the foregoing arrangement, the insulating layers are formed thickly in the secondary-wire-containing area 61A and thinly in the area free of secondary wires 21X and 21Y. With this, even in the case of overlap between secondary wires 21X and 21Y and the electronic circuit section 51 of the semiconductor chip 2, it becomes possible to suppress electromagnetic interference between each of the secondary wires 21X and 21Y and the electronic circuit section 51 and to suppress the curvature of the wafer.

An arrangement in which a semiconductor device according to the present embodiment has multiple layers of secondary wires is not limited to the arrangements shown in FIGS. 11(a) and 11(b) through 15(a) and 15(b), and may be combined, for example, with any one of the embodiments shown in FIGS. 1(a) and 1(b) through 8(a) and 8(b).

Examples of an arrangement in which a semiconductor device according to the present embodiment has multiple layers of secondary wires may include an arrangement in which a nonperipherally-disposed electrode pad 10 is provided at the bottom of a land section 21Yd of the secondary wire 21Y (and/or a land section formed in the secondary wire 21X so as to correspond to the land section 21Yd) so as to be electrically connected to the land section 21Yd of the secondary wire 21Y (and/or the land section formed in the secondary wire 21X so as to correspond to the land section 21Yd) (see the semiconductor device 1p of FIGS. 18(a) and 18(b)). That is, a semiconductor device of each of the present embodiment and the embodiment described below may be thus combined, for example, with the arrangement of the semiconductor device 1d of FIGS. 4(a) and 4(b).

Further, the semiconductor device according to the present embodiment may be such that the thickness of the inferior insulating layers is set for each specific area of the semiconductor chip 2 in accordance with the degree of electromagnetic interference between each of the secondary wires 21X and 21Y and the electronic circuit section 51.

In each of the semiconductor devices 1i to 1m each having an electronic circuit section 51, the degree of the electromagnetic interference varies depending on how the electronic circuit section 51 is positioned with respect to secondary wires 21X and 21Y. Therefore, it is preferable that the thickness of the inferior insulating layers be set for each specific area of the semiconductor chip 2 in accordance with the degree of the electromagnetic interference between each of the secondary wires 21X and 21Y and the electronic circuit section 51. For example, it is preferable that the thickness of the inferior insulating layers be greater in a place where the electromagnetic interference exerts a great influence than in a place where the electromagnetic interference exerts a minor influence. The same applies to secondary wires 21X and 21Y described below in an embodiment according to FIGS. 16, 18(a), and 18(b) and secondary wires 21 and 21' described below in an embodiment according to FIG. 17.

Embodiment 11

A semiconductor device according to another embodiment will be described below with reference to FIG. 16, FIG. 17, and FIGS. 18(a) and 18(b).

Figure 16:
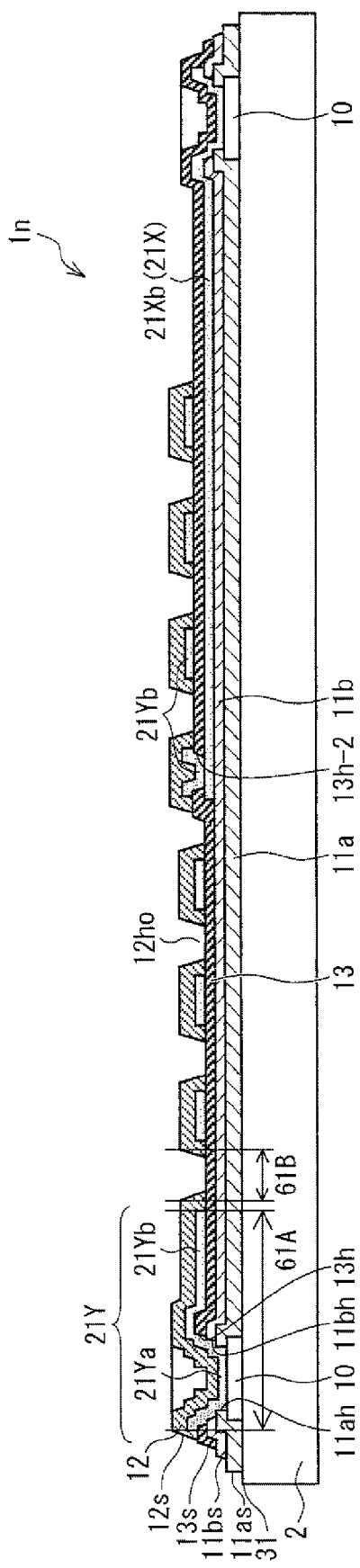
FIG. 16, showing another embodiment is a cross-sectional view showing an arrangement of a semiconductor device.

FIG. 16, showing an embodiment, is a cross-sectional view showing an arrangement of a semiconductor device 1n.

In the semiconductor device 1n of FIG. 16, the secondary wire 21X has a wiring section 21Xb electrically connected to a peripherally-disposed electrode pad 10 and run to the center of the semiconductor chip 2. The wiring section 21Xb is provided above the lower insulating layer 11a and on the lower insulating layer 11b. Furthermore, in the semiconductor device 1n of FIG. 16, the middle insulating layer 13 is provided on the wiring section 21Xb, and has an opening 13h-2 provided in a desired area of the middle insulating layer 13 which is on the wiring section 21Xb. The wiring section 21Xb is electrically connected to the secondary wire 21Y via the opening 13h-2.

The secondary wire 21Y is provided on the middle insulating layer 13. For example, the secondary wire 21Y forms a spiral inductor that winds in a direction substantially parallel to the surface of the semiconductor chip 2. The opening 13h-2 above the wiring section 21Xb serves as a center section (one end of the inductor) of the secondary wire 21Y serving as the spiral inductor. The wiring section 21Xb is electrically connected to the secondary wire 21Y via the opening 13h-2. The other end of the inductor is electrically connected to an electrode pad 10 via the openings 11ah, 11bh, and 13h.

Usually, an inductor to be mounted on a semiconductor device is used for an antenna, a filter, a power converter, or the like, and such an inductor is connected onto a mounting substrate while being externally attached to a semiconductor chip or formed inside of the semiconductor chip. Formation of an inductor by a secondary wire brings about the advantages of reducing an amount of space for mounting as compared with the case where an inductor is connected onto a mounting substrate while being externally attached to the semiconductor chip, and of ensuring a larger area for formation of an inductor as compared with the case where an inductor is formed inside of the semiconductor chip. Further, in a semiconductor device according to the present invention, the formation of a void portion (e.g., depression 12ho of FIG. 16) in a secondary wire serving as an inductor improves the characteristics of the secondary wire as an inductor.

In the embodiment according to FIG. 16, in order to electrically connect the secondary wire 21Y to the peripherally-disposed electrode pad 10 in the center of the spiral inductor formed by the secondary wire 21Y, the two layers of secondary wires 21X and 21Y are used so that one end of the secondary wire 21Y is connected to the electrode pad 10 and the other end of the secondary wire 21Y is connected to the wiring section 21Xb. However, although not shown, the secondary wire 21X may be omitted in cases where an electrode pad 10 connected to the other end of the inductor exists near the central portion of the spiral inductor.

Further, as in the embodiment according to FIG. 17 described below, a secondary wire serving as the inductor may be arranged such that only one end thereof is connected to an electrode pad. In such a case, the secondary wire only needs to be of a single layer. Also, in such a case, a semiconductor chip having an inductor formed by a secondary wire may be arranged such that an external connection terminal to be electrically connected to an electrode pad may be formed by another secondary wire that is not electrically connected to the secondary wire forming the inductor. Also in this case, two or more layers of secondary wires may be formed so that the secondary wire forming the external connection terminal and the secondary wire forming the inductor overlap each other. Further, two or more inductors may be formed.

Thus, the secondary wires 21X and 21Y forming an inductor are connected to electrode pads 10 at one end or both ends thereof.

The secondary wires 21X and 21Y may be electrically connected by providing a conductive post in a place where the secondary wires 21X and 21Y are connected. However, in order not to increase the number of manufacturing steps, the semiconductor device 1n of FIG. 16 is arranged such that the secondary wires 21X and 21Y are electrically connected by connecting the wiring section 21Xb and the secondary wire 21Y via the opening 13h-2 of the middle insulating layer 13 instead of providing a conductive post.

The middle insulating layer 13 of the semiconductor device 1n of FIG. 16 has the opening 13h-2 formed in a place where the secondary wires 21X and 21Y are connected, and has a side wall 13s formed in a scribe line area. However, the middle insulating layer 13 is not limited to such an arrangement. That is, the middle insulating layer 13 can further suppress the curvature of the wafer by covering only an area where the secondary wire 21X is provided and an area therearound. It should be noted here that the lower insulating layer 11a is a film made of inorganic matter such as silicon oxide or silicon nitride and the lower insulating layer 11b is a film made of organic matter such as PBO or polyimide. In cases where there exists a single wiring section 21Yb (or a plurality of wiring sections 21Yb), the height of the wiring section 21Yb above the circuit-forming surface of the semiconductor chip may vary from place to place. Further, in this case, as shown in FIG. 16, the wiring section 21Yb may be arranged so as to overlap the secondary wire 21X via an insulating layer (middle insulating layer 13 in this case) (the wiring section 21Yb and the secondary wire 21×intersecting in FIG. 16).

Further, although not shown in FIG. 16, the semiconductor device according to the present embodiment may be arranged such that a secondary wire has a land section formed on an electrode pad peripherally disposed on a semiconductor chip. That is, a secondary wire may be arranged so as to have a land section formed on an electrode pad as an external connection terminal. However, it is not necessary to form, on an electrode pad, an external connection terminal of a secondary wire used as an inductor that does not need to be directly connected to the outside. In consideration of resistance to humidity, a secondary wire made of metal should be arranged so as not to be exposed. The same applies regardless of whether or not a target secondary wire is an uppermost secondary wire.

The foregoing arrangement makes it possible to form a part such as an inductor with use of the secondary wire 21X or 21Y in the central portion of the semiconductor chip 2. This is because the provision of multiple layers of secondary wires such as secondary wires 21X and 21Y makes it possible that, in cases where both ends of the inductor formed with use of the secondary wire 21X or 21Y are connected to peripherally-disposed electrode pads 10, that end of the secondary wire which is located in the center of the spiral is connected to an electrode pad 10.

For example, in the case of provision of an inductor, electrical characteristics are improved by reducing permittivity between neighboring secondary wires 21Y through forming a depression 12ho between the secondary wires 21Y as shown, for example, in FIG. 16. Although the semiconductor device 1n of FIG. 16 is arranged such that the depression 12ho forms a void portion between the secondary wires 21Y, the semiconductor device 1n of FIG. 16 is not limited to such an arrangement. The semiconductor device 1n of FIG. 16 may of course be arranged such that the void portion is formed by the side wall 13s' (see FIG. 14(b)) of the middle insulating layer 13. A combination of these arrangements may be adopted. Furthermore, the semiconductor device 1n of FIG. 16 may be arranged such that the side wall 11bs' (see FIG. 15(b)) of the lower insulating layer 11b is provided in addition to the depression 12ho and the side wall 13s'.

Also in this case, the total thickness of the insulating layers formed in the secondary-wire-free area 61B so as to include the lower insulating layers is less than the total thickness of the inferior insulating layers and the superior insulating layer in the secondary-wire-containing area 61A. This makes it possible to suppress the electromagnetic interference and to suppress the curvature of the wafer.

Figure 17:
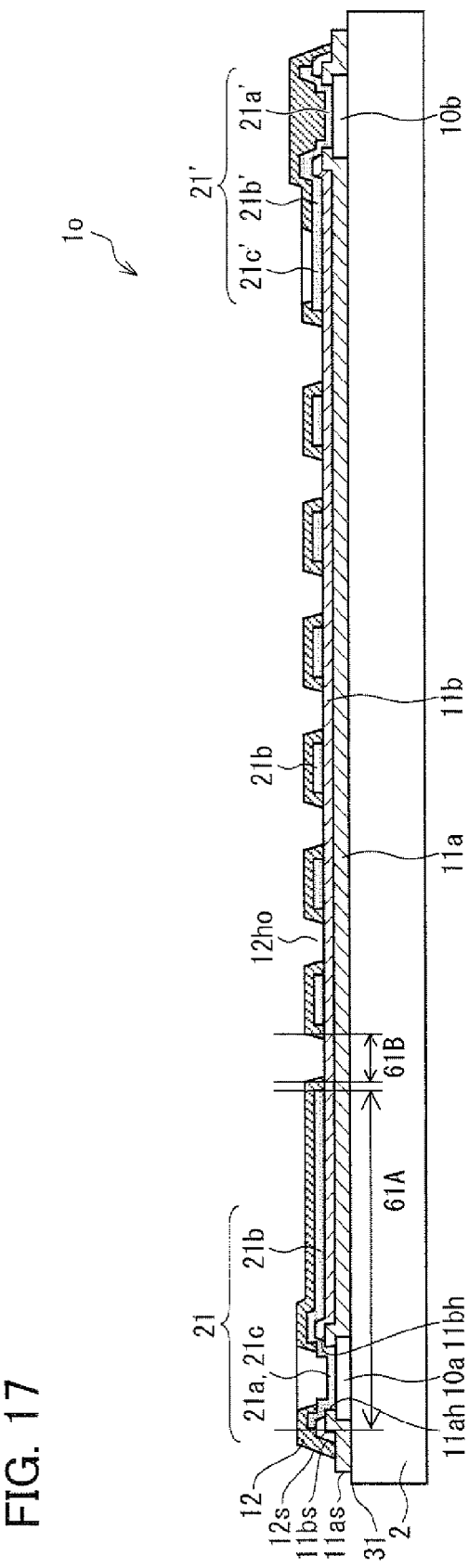
FIG. 17, showing another embodiment is a cross-sectional view showing an arrangement of a semiconductor device.

FIG. 17, showing an embodiment, is a cross-sectional view showing an arrangement of a semiconductor device 1o.

The semiconductor device 1o of FIG. 17 is arranged differently from the semiconductor device 1n of FIG. 16 in that secondary layers are formed by single-layer secondary wires 21.

As with the semiconductor device 1n of FIG. 16, the foregoing arrangement also makes it possible to form a part such an inductor with use of the secondary wire 21 in the central portion of the semiconductor chip 2, thereby making it possible to suppress the electromagnetic interference and to suppress the curvature of the wafer. The cross-sectional view of the semiconductor device 1o of FIG. 17 shows two electrode pads 10a and 10b. It should be noted here that whereas a secondary wire 21 electrically connected to the electrode pad 10a functions as such a spiral inductor as described above, a secondary wire 21 (numbered 21' in FIG. 17) electrically connected to the electrode pad 10b does not function as such a spiral inductor as described above. The electrode pad 10b is electrically connected via pad and wiring sections 21a' and 21b' of the secondary wire 21' to a land section 21c' serving as an external connection terminal.

Thus, a secondary wire serving as a spiral inductor is arranged in some cases so as to be connected to an electrode pad only at one end. In such a case, the inductor can be used as an antenna.

In each of the semiconductor devices 1a to 1m and 1p of FIGS. 1(a) and 1(b) through 9, FIGS. 11(a) and 11(b) through 15(a) and 15(b), and FIGS. 18(a) and 18(b), land sections of secondary wires (land sections 21c or land sections 21Xc and 21Yc) are disposed at regular intervals in a reticular pattern, so that mounting of various parts onto a substrate is facilitated. However, the semiconductor device is of course not limited to an arrangement in which land sections of secondary wires are disposed in a full matrix. The terminals may be partially omitted, or the land sections of the secondary wires may be replaced by dummy terminals. Meanwhile, in each of the semiconductor device 1i of FIGS. 11(a) and 11(b) and the semiconductor device 1o of FIG. 17 each arranged so as to have land sections formed on electrode pads 10 (or electrode pads 10a and 10b), even a case where the external connection terminals are placed at narrow pitches can be handled by forming the electrode pads 10 in advance in a peripheral area of the semiconductor chip 2, so that mounting of various parts onto a substrate can be facilitated.

As described above, also in each of the embodiments of FIGS. 16 and 17, the insulating layers are formed more thickly in the secondary-wire-containing area 61A than in the secondary-wire-free area 61B. Therefore, even in the case of overlap between a secondary wire and an electronic circuit section of a semiconductor chip, it becomes possible to suppress electromagnetic interference between the secondary wire and the electronic circuit section and to suppress the curvature of the wafer.

Further, the formation of the void portion between neighboring secondary wires (secondary wires 21 or secondary wires 21X, 21Y) makes it possible to reduce the parasitic capacitance. Therefore, the formation of the void portion between neighboring secondary wires, or between neighboring wiring sections of the neighboring secondary wires in particular, makes it possible to reduce the parasitic capacitance. This makes it possible to reduce wiring delays.

Furthermore, the insulating layers are formed more thinly in the secondary-wire-free area 61B than in the secondary-wire-containing area 61A. With this, even in cases where the semiconductor chip 2 has an analog circuit, stress on the electronic circuit section 51 can be reduced, so that a change in electrical characteristics can be suppressed.

That is, each of the semiconductor devices 1i to 1k of FIGS. 11(a) and 11(b) through 13(a) and 13(b) and the semiconductor devices 1n to 1p of FIGS. 16 through 18(a) and 18(b) is arranged such that the upper insulating layer 12 is provided so as not to be in the depression 12ho, but of course is not limited to such an arrangement. That is, each of the semiconductor devices 1i to 1k of FIGS. 11(a) and 11(b) through 13(a) and 13(b) and the semiconductor devices 1n to 1p of FIG. 16, FIG. 17, and FIGS. 18(a) and 18(b) only needs to be arranged such that the total thickness of the insulating layers in the secondary-wire-free area 61B is less than the total thickness of the inferior and superior insulating layers in the secondary-wire-containing area 61A. Moreover, as long as such an arrangement is satisfied, it does not matter whether the upper insulating layer 12 is present or absent in the depression 12ho.

As in any one of the aforementioned embodiments, it is preferable in the present embodiment that the lower insulating layer 11a be made of a nitride film or an oxide film. Similarly, it is preferable that the lower insulating layer 11b, the middle insulating layer 13, and the upper insulating layer 12 be made of organic matter, or polyimide or PBO in particular. Further, it is necessary that the organic insulating layers be formed in a secondary-wire-containing area where a secondary wire is provided or in the secondary-wire-containing area and an area therearound. Among such insulating layers, an insulating layer that is not formed in a secondary-wire-free area excluding the secondary-wire-containing area and the area therearound is preferably made of a positive-type photosensitive resin so as to have a thickness of not more than 40 µm. Meanwhile, an insulating layer that is formed also in the secondary-wire-free area does not need to be made of a positive-type photosensitive resin, but may be made of a negative-type photosensitive resin or a nonphotosensitive resin.

In cases where the influence on electromagnetic interference between a secondary wire and an electronic circuit of a semiconductor device and on electromagnetic interference between multiple layers of secondary wires overlapping each other needs to be preferentially suppressed, the insulating layer is preferably formed with use of a negative-type material that can be formed into a thick film, or formed by a printing method or the like with use of a nonphotosensitive material or the like. When the insulating layer is formed with use of a negative-type material, the insulating layer can be formed so as to have a thickness of approximately 100 µm. Alternatively, when the insulating layer is formed by a printing method or the like with use of a nonphotosensitive material or the like, the insulating layer can be more suitably formed so as to have a thickness of not less than 100 µm. Even in the case of use of a photosensitive material, the middle insulating layer 13 can be formed thickly by repeating a photo step more than once. However, such a method undesirably causes an increase in the number of steps.

The openings 11bh, 12h, and 13h provided above the opening 11ah of the lower insulating layer 11a are larger in size than the opening 11ah of the lower insulating layer 11a. Each of the present embodiment and the aforementioned embodiments is provided with a plurality of insulating layers. In view of this, in order to ensure an area through which an electrical current flows, the openings 11bh, 12h, and 13h are provided so as to be larger in size than one another as they are arranged from below in this order. However, in cases where the opening 11ah of the lower insulating layer 11a serving as the lowermost insulating layer has enough size to ensure the required electrical current, an opening of an insulating layer that is not the lowermost insulating layer is formed inside of the lower insulating layer 11a as with the opening 11ch of the lower insulating layer 11c of FIGS. 8(a) and 8(b) and the opening 11bh of the lower insulating layer 11b of each of FIGS. 2(b) and 2(b) through 4(a) and 4(b). This is more preferable because the coverage of a secondary wire is improved. Further, as shown in FIGS. 5(a) and 5(b), the lower insulating layer 11b may be formed inside of the opening 11ah so as to smooth that step portion of the insulating layer which is closer to the center of the semiconductor chip 2 on the electrode pad 10. In this case, as compared with the semiconductor devices 1b to 1d of FIGS. 2(a) and 2(b) through FIGS. 4(a) and 4(b), the curvature of a semiconductor wafer can be suppressed.

As with the lower insulating layer 11a, the lower insulating layer 11b, the upper insulating layer 12, and the middle insulating layer 13, each of which is an organic insulating layer, have the side walls 11bs, 12s, and 13s provided in the scribe line area, respectively. The side wall 12s is provided on top of the semiconductor conductor 2 so as to be closer to the center of the semiconductor chip 2 than is the side wall 11as and further away from the center of the semiconductor chip 2 than is the side wall 11bs, so as to be in substantially the same position as the side wall 11as and/or the side wall 11bs, or so as to be closer to the center of the semiconductor chip 2 than is the side wall 11bs. For the purpose of preventing chipping in a dicing step, this area is free at least of an organic insulating layer. Further, from a standpoint of wafer curvature, the scribe line area should be free of organic matter having a large coefficient of linear expansion. The side walls of the inferior insulating layers, such as the side walls 11bs' and 13s', are provided at a distance of approximately 0 µm to 200 µm from a secondary-wire-containing area. The same applies in cases where there are a plurality of inferior insulating layers. However, in the case of a combination of neighboring secondary wires that exert only a minor influence on each other (e.g., a combination that does not include a terminal for processing a minute electric current or a combination that does not process a high-frequency signal), only a few problems arise even if the secondary wires are free from a side wall. Meanwhile, in a superior insulating layer positioned higher than a secondary wire, a depression such as the depression 12ho is provided at a distance of approximately several micrometers to 200 μm from the secondary-wire-containing area in order to protect the secondary wire. That is, in this case, an area corresponding to a secondary-wire-free area is an area excluding the secondary-wire-containing area and an area within a distance of approximately several micrometers to 200 μm.

If an area of adhesion between the superior insulating layer provided with the depression and the base can be ensured to such an extent that the secondary-wire-containing area is sufficiently covered and can withstand changes in external temperature and humidity, it is preferable that the area of adhesion be formed as narrowly as possible. In other words, it is preferable that the distance between the secondary wire and the depression be as short as possible. The shorter the distance is, the more greatly the curvature of the wafer can be suppressed.

Further, in order to ensure adhesion between the inferior insulating layer and the superior insulating layer and to prevent the inferior insulating layer and the superior insulating layer from delaminating from each other, it is preferable that the area of adhesive be not less than 5 μm.

Further, in a portion where the distance between neighboring secondary wires (wiring sections of the secondary wires in particular) is shortest, the depression is made to occupy an area corresponding to approximately a third of the distance, so that a void portion can be surely formed in the superior insulating layer between the neighboring secondary wires 21. For example, in cases where the distance between the neighboring secondary wires is 15 μm, it is preferable that the area of adhesion occupy 5 μm for each of the neighboring secondary wires and the depression occupy the remaining 5 μm. However, in the case of a combination of neighboring secondary wires that exert only a minor influence on each other, only a few problems arise even if the void portion is omitted between the secondary wires.

In a semiconductor device according to the present embodiment or any one of the aforementioned embodiments, the respective thicknesses of the lower insulating layers 11a and 11b and the middle insulating layer 13 may be set for each specific area of the semiconductor chip 2 in accordance with the degree of electromagnetic interference between a secondary wire 21 (or secondary wire 21X or 21Y) and the electronic circuit section 51. That is, the respective thicknesses of the inferior insulating layers (lower insulating layer 11a, the lower insulating layer 11b, and the middle insulating layer 13) may be set in accordance with the degree of electromagnetic interference between a secondary wire 21 (or secondary wire 21X or 21Y) and the electronic circuit section 51.

Methods for manufacturing the aforementioned semiconductor devices 1i to 1p are each identical to the method of FIGS. 9(a) through 9(f) for manufacturing a semiconductor device. That is, as compared with the method of FIGS. 9(a) through 9(f) for manufacturing a semiconductor device, each of the methods for manufacturing the aforementioned semiconductor devices 1i to 1p additionally includes the secondary-wire forming steps of FIGS. 9(c) through 9(e) for the number of layers of secondary wires to be formed and a step of forming a middle insulating layer for insulating overlapping secondary wires from each other (e.g., in the case of a semiconductor device having n layers of secondary wires, a step of forming at least n−1 layers of middle insulating layers). For example, the method for manufacturing the semiconductor device 1i of FIGS. 11(a) and 11(b) includes: covering a semiconductor chip 2 with lower insulating layers 11a and 11b and a middle insulating layer 13 provided with openings (openings 11ah, 11bh, and 13h) via which electrode pads 10 are partially exposed; forming secondary wires 21X and 21Y so that exposed portions of the electrode pads 10 of the semiconductor chip 2 make contact with those portions of the secondary wires 21X and 21Y which exclude wiring sections 21Xb and 21Yb (pad sections 21Xa and 21Ya); and covering at least the secondary wires 21Y with the upper insulating layer 12. Further, as compared with the method of FIGS. 9(a) through 9(f) for manufacturing a semiconductor device, each of the methods for manufacturing the semiconductor devices 1i to 1p of FIGS. 11(a) and 11(b) through 18(a) and 18(b) additionally includes, instead of the step of FIG. 9(b) of forming a lower insulating layer 11b, the step of forming a middle insulating layer 13.

The embodiment thus far described are effective for a semiconductor device having an insulating layer made of common organic matter having a larger coefficient of linear expansion than do a base material such as a wafer and a material for a secondary wire.

In cases where secondary wires have an area ratio (in the case of multiple layers of secondary wires, the ratio of the projected area of the secondary wires as seen from the surface of a semiconductor chip) of 15% to 70% with respect to the chip size of a semiconductor chip (all of the area that is closer to the center of the semiconductor chip than is a scribe line center within the wafer), it is preferable that the area ratio of at least one organic insulating layer to be provided with a void portion (at least one of the aforementioned openings, side walls, and depressions) in an area of the semiconductor chip between secondary wires be 15% to 75%, including an area where the semiconductor chip is cut out along the scribe line center at the time of dicing (e.g., the edge 31 of FIG. 1(b)). This makes sure to bring about an effect of suppressing the curvature of a wafer. Further, this method is effective in cases where the area (chip size) surrounded by the scribe line is 2 mm×2 mm (amount of space of 4 mm$^2$) or larger. The reason for this is as follows: As the chip size becomes larger, an organic insulating layer becomes more likely to put shear stress on a wafer to curve the wafer. Further, the method is further effective in cases where the size of a wafer is not less than 8 inches. This is because a larger wafer is more likely to be curved. Further, the method is effective in cases where the thickness (base material portion such as silicon) of a wafer (semiconductor chip) is not more than 300 μm. Further, in an area between secondary wires where no secondary wire is provided, the void portion is provided, so that the aforementioned various void portions can be formed on the semiconductor chip so as to be between the secondary wires. This makes it possible to reduce the permittivity of an area between neighboring secondary wires.

Furthermore, it is preferable that an insulating layer, made of organic matter, which has the void portion formed in an area between secondary wires within a semiconductor chip be patterned so as to be in the shape of the secondary wires. In this case, the curvature of the wafer can be minimized. Further, in this case, the aforementioned various void portions can be formed on the semiconductor chip to a maximum extent. This makes it possible to minimize the permittivity of an area between neighboring secondary wires.

The aforementioned embodiments can dispose external connection terminals at regular pitches, and therefore do not cause a decrease in the number of terminals, so that mountability is not impaired.

A semiconductor device according to the present embodiment is arranged by the side wall 12s such that "all of the edge 31 extends further outward than the edge of the upper insulating layer 12", but is not limited to such an arrangement. A semiconductor device according to the present invention may be arranged such that a "part of the edge 31 extends further outward than the edge of the upper insulating layer 12".

Possible examples of a semiconductor device arranged such that a "part of the edge 31 extends further outward than the edge of the upper insulating layer 12" include an arrangement in which upper insulating layers formed on neighboring semiconductor chips yet to be separated from a wafer are integrally formed so as to straddle a part of the edge, i.e., an arrangement in which upper insulating layers are integrally formed on neighboring semiconductor chips so as to bridge between the semiconductor chips.

Embodiment 12

A method according to an embodiment for manufacturing a semiconductor device will be described below with reference to FIGS. 19(a) through 19(e).

FIGS. 19(a) through 19(e), showing a method according to the present embodiment for manufacturing a semiconductor device, are diagrams showing, as an example of the manufacturing method, steps of manufacturing the semiconductor device 1b of FIGS. 2(a) and 2(b) as seen from the same surface as in FIG. 2(b).

The semiconductor chip 3 of the semiconductor device 1b includes: an electronic circuit section 51 for processing an analog signal; and electrode pads 10 via which the electronic circuit section 51 is connected to an externally-connected circuit. Further, the semiconductor chip 3 includes primary wires (not shown), serving as components of the electronic circuit section 51, via which the electronic circuit section 51 is connected to another electronic circuit and the electronic circuit section 51 is connected to the electrode pads 10.

Electrode pads 10 are peripherally disposed on surfaces of semiconductor chips 3 regularly disposed in rows and columns on a wafer (not shown).

First, the surface of a semiconductor chip 3 on which electrodes pads 10 are provided is covered with a lower insulating layer 11a. The lower insulating layer 11a is provided with an opening 11ah via which an electrode pad 10 is partially exposed and a side wall 11as provided around a scribe line area. The lower insulating layer 11a is covered with a lower insulating layer 11b. The lower insulating layer 11b is provided with an opening 11bh via which an electrode pad 10 is partially exposed and a side wall 11bs provided around the scribe line area. Furthermore, the lower insulating layer 11b is provided with a side wall 11bs' (see FIG. 19(a)).

In order to protect an electronic circuit section 51 in the present embodiment and an embodiment described below, it is necessary to form at least one lower insulating layer in an area serving as a secondary-wire-free area. Further, in the area serving as a secondary-wire-free area, it is preferable that an organic insulating layer such as the lower insulating layer 11b or the upper insulating layer 12 be formed on the inorganic lower insulating layer 11a. Meanwhile, in order to suppress electromagnetic interference, it is necessary to form at least one organic lower insulating layer in an area serving as a secondary-wire-containing area, and it is preferable that the organic lower insulating layer be formed on the inorganic lower insulating layer 11a.

The lower insulating layer 11b is formed by a spin-coating method on a wafer having a plurality of semiconductor chips 3 disposed thereon. After being dried, the lower insulating layer 11b is hardened by exposure and development so that a secondary wire 21 can be formed. When the lower insulating layer 11b is made of a positive-type material, the accuracy of size of a clearance between side walls 11bs' is improved, so that an area around the secondary wire can be sufficiently reduced. This results in great suppression of the curvature of the wafer. Further, when the lower insulating layer 11b is made of a positive-type material, the accuracy of size of the opening 11bh is conveniently ensured.

Next, a thin film that has a barrier effect with respect to the electrode pads 10 is formed entirely on the wafer, and a thin film made of the same material as the secondary wire 21 is further formed. On the thin film, a photoresist 41 is formed all over the wafer. The photoresist 41 has a side wall 41s formed in an area where the secondary wire 21 is to be formed (see FIG. 19(b)).

Figure 19:
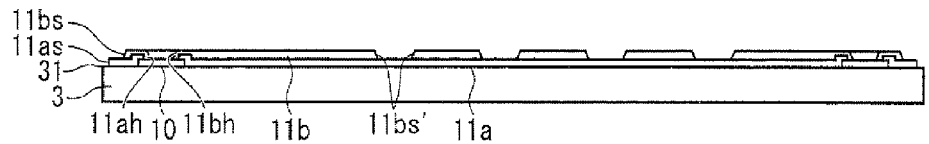
FIGS. 19(a) through 19(e), showing an embodiment show a method for manufacturing the semiconductor device of FIGS. 2(a) and 2(b).
Figure 19:
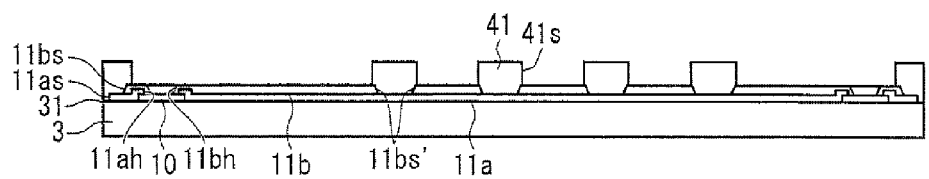
Figure 19:
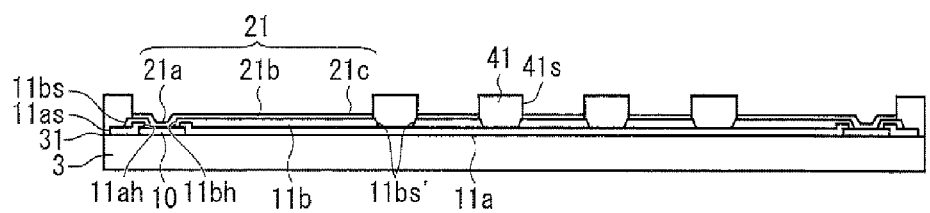
Figure 19:
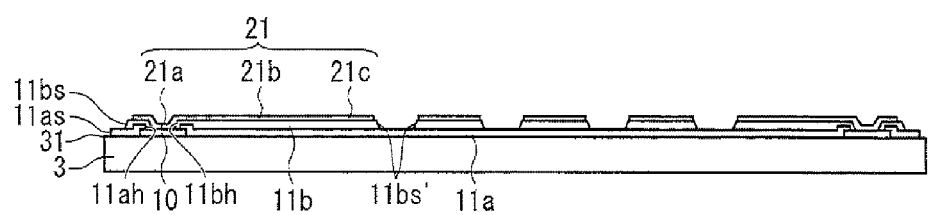
Figure 19:
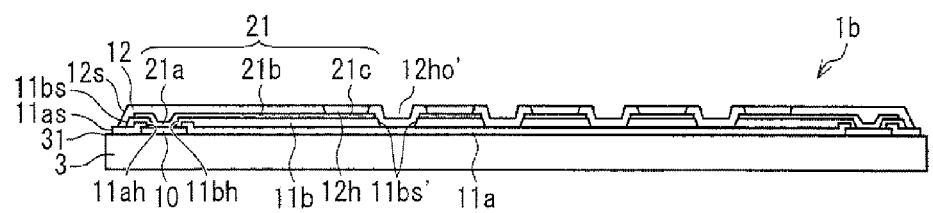
Figure 20:
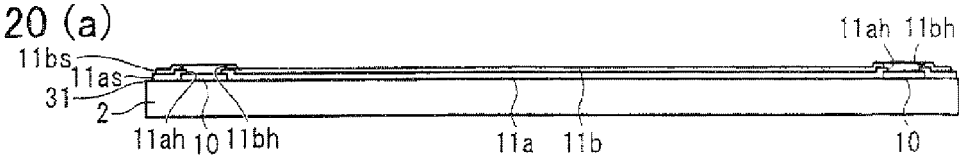
FIGS. 20(a) through 20(i), showing an embodiment, show a method for manufacturing the semiconductor device of FIGS. 13(a) and 13(b).
Figure 20:
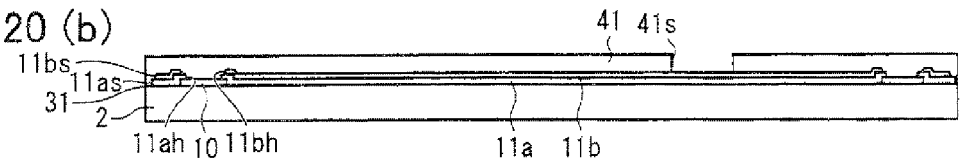
Figure 20:
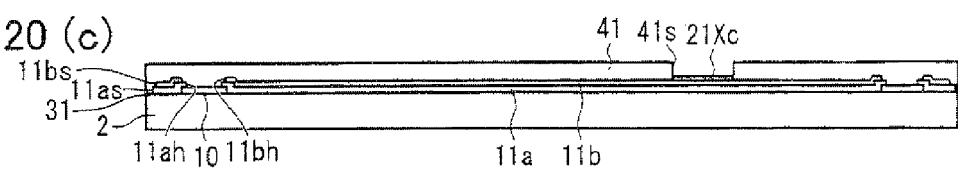
Figure 20:
Figure 20:
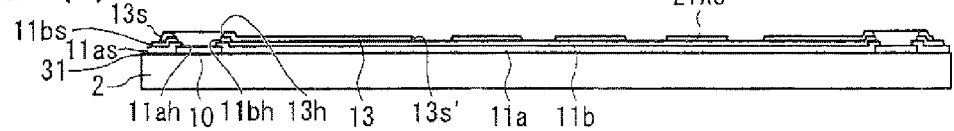
Figure 20:
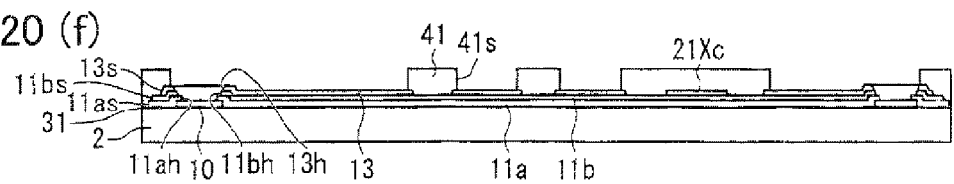
Figure 20:
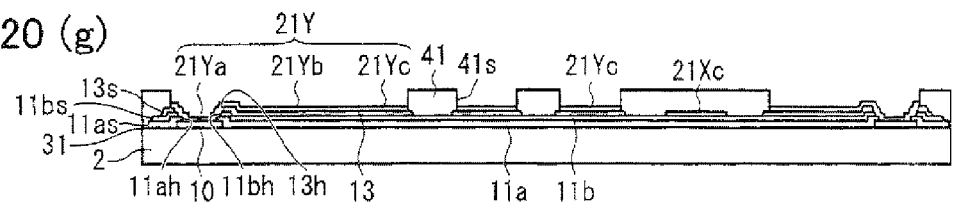
Figure 20:
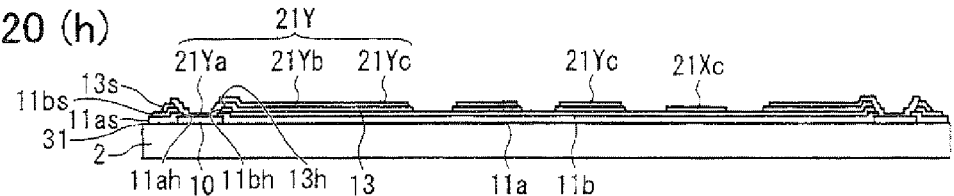
Figure 20:
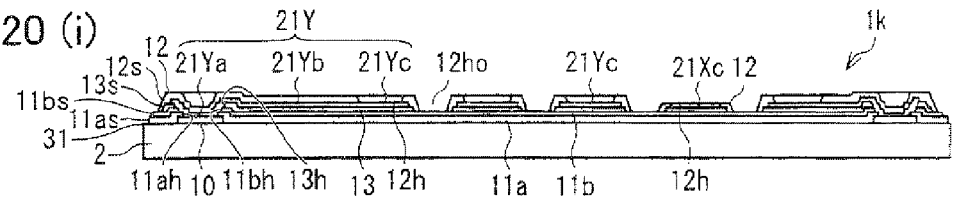
Figure 21:
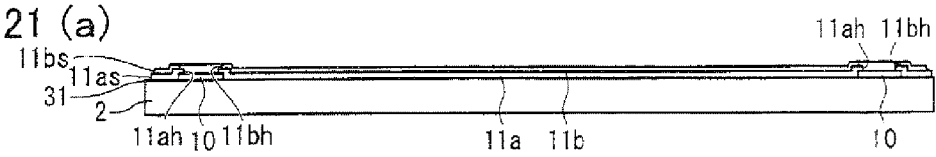
FIGS. 21(a) through 21(i), showing an embodiment, show a modified example of the method for manufacturing the semiconductor device of FIGS. 13(a) and 13(b).
Figure 21:
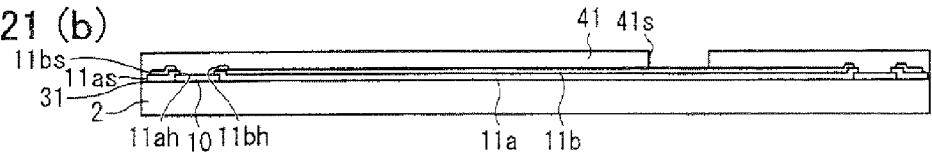
Figure 21:
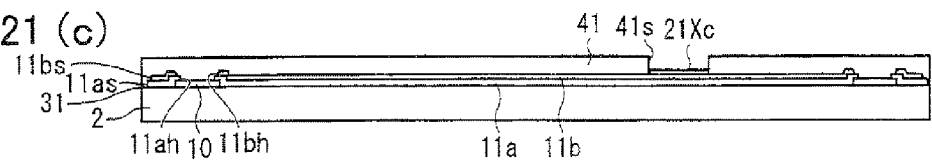
Figure 21:
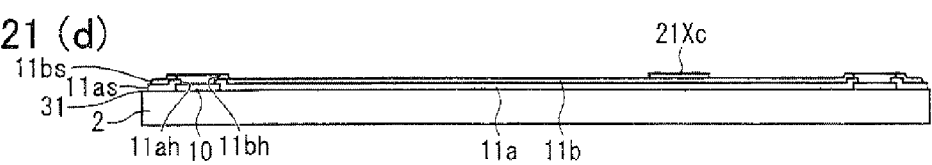
Figure 21:
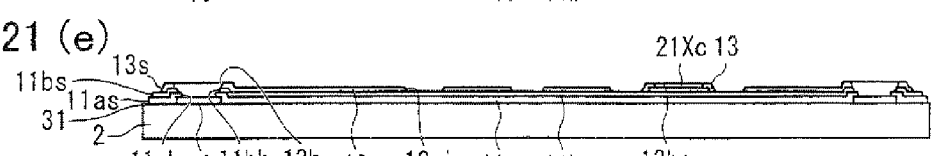
Figure 21:
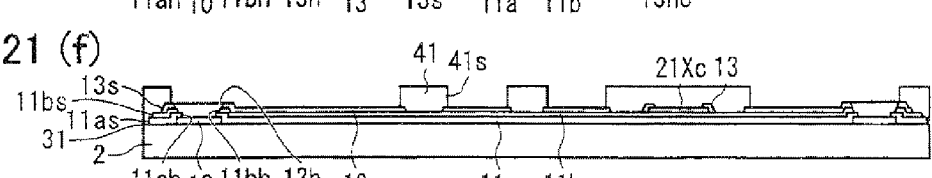
Figure 21:
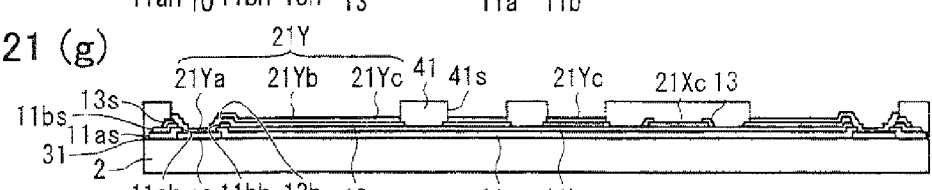
Figure 21:
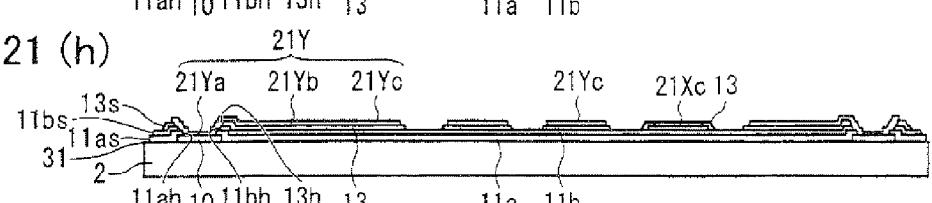
Figure 21:
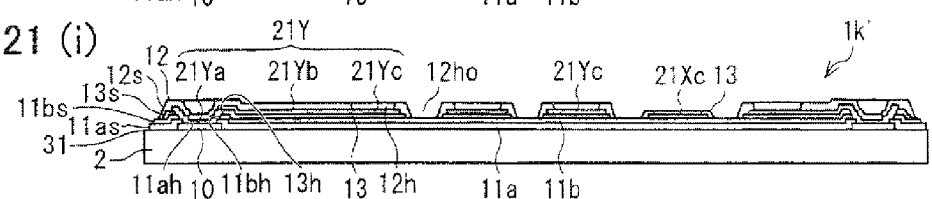
Figure 22:
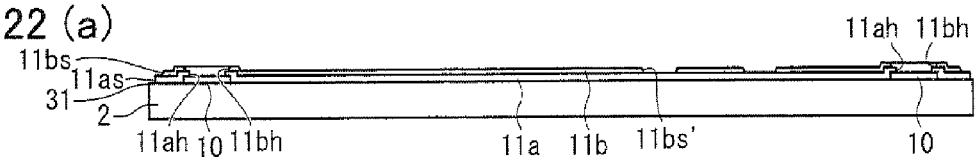
FIGS. 22(a) through 22(i), showing an embodiment, show a method for manufacturing the semiconductor device of FIGS. 15(a) and 15(b).
Figure 22:
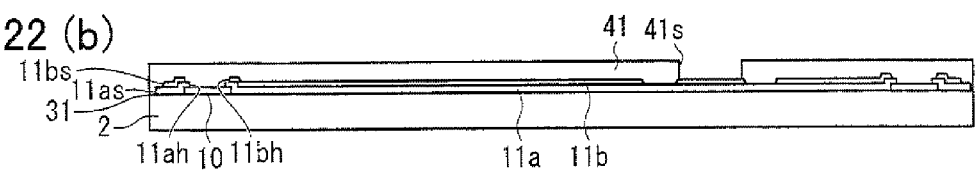
Figure 22:
Figure 22:
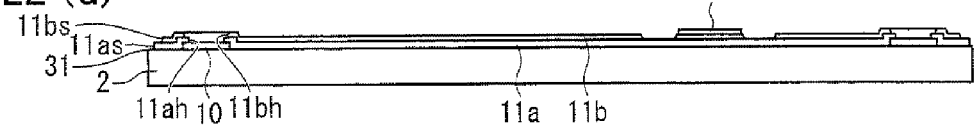
Figure 22:
Figure 22:
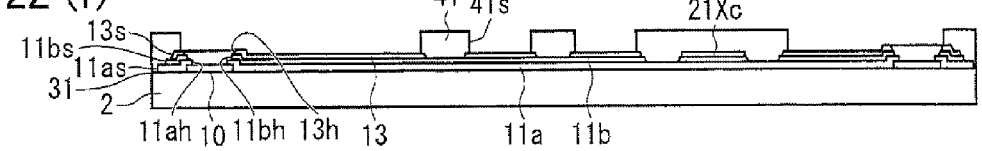
Figure 22:
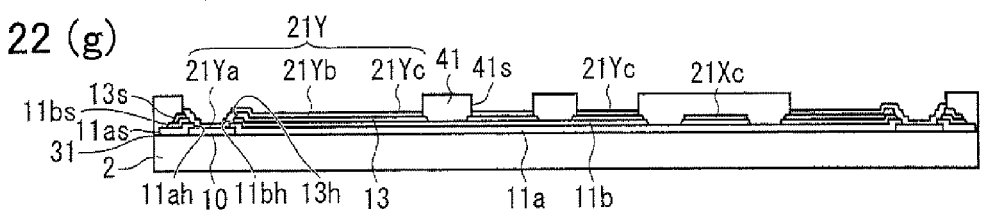
Figure 22:
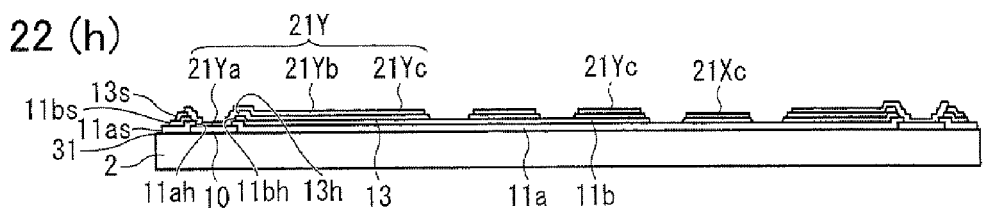
Figure 22:
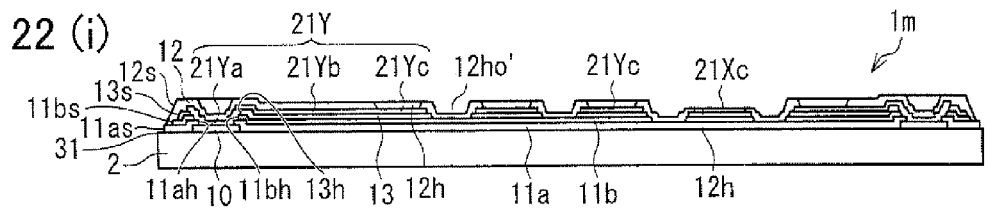

Next, the secondary wire 21, made of Cu for example, which includes a pad section 21a, a wiring section 21b, and a land section 21c is formed by electroplating so as to have a thickness of approximately 1 μm to 20 μm (see FIG. 19(c)). Next, the photoresist 40 is removed by remover, ashing, or the like, and the Cu thin film and the Ti, Ti—W, or Cr thin film are removed as unnecessary by etching (see FIG. 19(d)).

Finally, the upper insulating layer 12 is formed so as to cover upper and side surfaces of the secondary wire 21, and the upper insulating layer 12 has an opening 12h formed above the land section 21c. Further, the upper insulating layer 12 has a side wall 12s formed around the scribe line area. Furthermore, the upper insulating layer 12 covers a second secondary-wire-free area. That portion of the second secondary-wire-free area which is covered with the upper insulating layer 12 is provided with a depression 12ho' serving as a void portion (see FIG. 19(e)).

In order to surely protect the secondary wire 21 and to suppress the curvature of the wafer, it is preferable that the upper insulating layer 12 be made of PBO, which is positive-type photosensitive organic matter.

After these steps, if necessary, substrate mounting is facilitated by forming a bump with use of a material, such as solder, which forms a joint in a liquid phase. In making, instead of providing the land section 21c with a bump, an electrical connection to a mounting substrate with use of a material, such as solder, which forms a joint in a liquid phase, the formation of the opening 12h prevents the material, which forms a joint in a liquid phase, from flowing out to the wiring section 21b and the like.

Semiconductor devices 1b thus completed in wafer form are cut along scribe lines into separate semiconductor devices 1b. It should be noted that, as a finished product, each of the semiconductor devices 1b is used with the external connection terminals facing downward.

A semiconductor device 1b thus completed by the method makes it possible to suppress the electromagnetic interference and reduce wiring delays.

Further, in a stage prior to separating semiconductor devices 1b, for example, in cases where the semiconductor devices are prepared on a silicon wafer whose circuit-forming surface has a diameter of 8 inches, the curvature of the wafer can be kept not more than several millimeters even in the case of a thickness of 300 μm to 150 μm.

Furthermore, in a dicing step or the like, it becomes possible to suppress such problems as a transport error in the electrical signal and the breakage of the wafer.

Further, in cases where the influence on the curvature of the wafer is preferentially suppressed, that area of the semiconductor chip 3 which is further away from the center of the semiconductor chip 3 than are the peripherally-disposed electrode pads 10 and similar areas may be not be greatly influenced by electromagnetic interference even without forming the lower insulating layer 11b. In cases where at least one insulating layer is formed in such as case, the electronic circuit section 51 can be sufficiently protected from chemical damage and physical damage.

As a finished product, the semiconductor device 1b is arranged such that the edge 31 (and the edge of the lower insulating layer 11a) extend further outward than the upper insulating layer 12. Further, the lower insulating layer 11b and the secondary wire 21 are covered with the upper insulating layer 12. The upper insulating layer 12 ensures an area of adhesion of 5 µm to 200 µm with respect to the lower insulating layer 11a.

Embodiment 13

A method according to an embodiment for manufacturing a semiconductor device will be described below with reference to FIGS. 20(a) through 20(i), FIGS. 21(a) through 21(i), FIGS. 22(a) through 22(i), and FIGS. 23(a) through 23(i).

FIGS. 20(a) through 20(i), showing a method according to the present embodiment for manufacturing a semiconductor device, are diagrams showing, as an example of the manufacturing method, steps of manufacturing the semiconductor device 1k of FIGS. 13(a) and 13(b) as seen from the same surface as in FIG. 13(b).

The semiconductor chip 2 of the semiconductor device 1k includes: an electronic circuit section 51 for processing an analog signal; and electrode pads 10 via which the electronic circuit section 51 is connected to an externally-connected circuit. Further, the semiconductor chip 2 includes primary wires (not shown), serving as components of the electronic circuit section 51, via which the electronic circuit section 51 is connected to another electronic circuit and the electronic circuit section 51 is connected to the electrode pads 10.

Electrode pads 10 are peripherally disposed on surfaces of semiconductor chips 2 regularly disposed in rows and columns on a wafer (not shown).

The surface of a semiconductor chip 2 on which a plurality of electrode pads 10 are provided is covered with a lower insulating layer 11a. The lower insulating layer 11a is provided with (i) openings 11ah via which the electrode pads 10 are partially exposed, respectively, and (ii) a side wall 11as provided around a scribe line area. The lower insulating layer 11a is covered with a lower insulating layer 11b. The lower insulating layer 11b is provided with (a) openings 11bh via which the electrode pads 10 are partially disposed, respectively, and (b) a side wall 11bs provided around the scribed line area (see FIG. 20(a)).

It should be noted that each of the openings 11bh is equal or larger in size than each of the openings 11ah. The purpose of forming such an opening 11bh is to advantageously process a strong electrical current. The semiconductor device 1k is not provided with a side wall 11bs'. This makes it possible to sufficiently protect the electronic circuit section 51 from chemical damage and physical damage also in cases where the upper insulating layer 12 is later provided with a depression 12ho.

The lower insulating layer 11b is formed by a spin-coating method on a wafer having a plurality of semiconductor chips 2 disposed thereon. After being is dried, the lower insulating layer is hardened by exposure and development so as to be removed from the opening 11bh and an area around the side wall 11bs.

Next, a thin film that has a barrier effect with respect to the electrode pads 10 is formed entirely on the wafer, and a thin film made of the same material as a secondary wire 21X is further formed. On the thin film, a photoresist 41 is formed all over the wafer. The photoresist 41 has a side wall 41s formed in an area where the secondary wire 21X is to be formed (see FIG. 20(b)).

Next, the secondary wire 21X, made of Cu for example, which includes a pad section 21Xa, a wiring section 21Xb, and a land section 21Xc is formed by electroplating so as to have a thickness of approximately 1 µm to 20 µm (see FIG. 13(a) and FIG. 20(c)). Next, the photoresist 40 is removed by remover, ashing, or the like, and the Cu thin film and the Ti, Ti—W, or Cr thin film are removed as unnecessary by etching (see FIG. 20(d)).

Formed next is a middle insulating layer 13 for providing insulation between the secondary wire 21X and a secondary wire 21Y to be formed later. The middle insulating layer 13 may be formed in an area where the secondary wire 21Y is formed, and may be further formed in an area therearound. The middle insulating layer 13 is provided with (i) openings 13h via which the electrode pads 10 are partially exposed, respectively, and (ii) a side wall 13s provided around the scribe line area. Furthermore, the middle insulating layer 13 is provided with a side wall 13a' (see FIG. 20(e)).

It is necessary that the secondary wire 21X be covered with the middle insulating layer 13 and/or the upper insulating layer 12 to be formed later, excluding the land section 21Xc. However, in order to ensure adhesion to a base material (not show), it is necessary that an area around the secondary wire 21X be further covered, excluding the land section 21Xc, with a width of 5 µm to 200 µm. In cases where the secondary wires 21X and 21Y are electrically connected to each other, the middle insulating layer 13 only needs to be have an opening (not shown) provided in an area of overlap between the secondary wires 21X and 21Y (see FIG. 13(a)). It should be noted that each of the openings 13h is equal or larger in size than each of the openings 11bh. The purpose of forming such an opening 13h is to advantageously process a strong electrical current. The side wall 13s is formed so as to be closer to the center of the semiconductor chip 2 than is the side wall 11as, or so as to be in substantially the same position as the side wall 11a. In order to suppress the curvature of the wafer, it is only necessary that the side wall 13s be formed on the surface of the semiconductor chip 2 so as to be as close as possible to the center of the semiconductor chip 2.

Next, in the same manner as in the step of FIG. 20(b), a photoresist 41 is formed all over the wafer. The photoresist 41 has a side wall 41s formed in an area where the secondary wire 21Y is to be formed (see FIG. 20(f)).

Next, the secondary wire 21Y, made of Cu for example, which includes a pad section 21Ya, a wiring section 21Yb, and a land section 21Yc is formed by electroplating so as to have a thickness of approximately 1 µm to 20 µm. Next, the photoresist 40 is removed by remover, ashing, or the like, and the Cu thin film and the Ti, Ti—W, or Cr thin film are removed as unnecessary by etching (see FIG. 20(h)).

Finally, the upper insulating layer 12 is formed so as to cover upper and side surfaces of the secondary wire 21Y, and has an opening 12h formed above the land section 21Yc. Further, the upper insulating layer 12 has a side wall 12s formed around the scribe line area. Furthermore, the upper insulating layer 12 further covers upper and side surfaces of the secondary wire 21X, and has an opening 12h formed above the land section 21Xc. The upper insulating layer 12 has a depression 12ho formed in an area corresponding to the secondary-wire-free area 61B (see FIG. 11(b)) (see FIG. 20(i)).

In order to ensure an area of adhesion to a base material (not shown), the upper insulating layer 12 is formed by photolithography so as to exist on the secondary wire 21X and an area therearound and on the secondary wire 21Y and an area therearound. Here, pattern accuracy is given priority as measures against the curvature of the wafer and chipping.

The upper insulating layer 12 covers the secondary wire 21X and the secondary wire 21Y so as to ensure an area of adhesion of 5 μm to 200 μm in width with respect to the middle insulating layer 13 in an area around each of the secondary wire 21X and the secondary wire 21Y. In order to be in close contact with the lower insulating layer 11a or the lower insulating layer 11b, the upper insulating layer 12 only needs to ensure an area of adhesion of 5 μm to 200 μm in width with respect to the lower insulating layer 11a or the lower insulating layer 11b.

The semiconductor device 1k manufactured by taking the steps shown in FIGS. 20(a) through 20(i) is arranged such that the secondary wire 21X is covered with the upper insulating layer 12. However, the semiconductor device 1k is not limited to such an arrangement. The semiconductor device 1k may be arranged such that the secondary wire 21X is covered with the middle insulating layer 13.

A method for manufacturing a semiconductor device 1k', in which the secondary wire 21X of the semiconductor device 1k is covered with the middle insulating layer 13 instead of the upper insulating layer 12, will be described below with reference to FIGS. 21(a) through 21(i).

FIGS. 21(a) through 21(i), showing an embodiment of the present invention, show a method for manufacturing a semiconductor device 1k', which is a modified example of the semiconductor device 1k of FIGS. 13(a) and 13(b).

Steps of FIGS. 21(a) through 21(d) and FIGS. 21(f) through FIG. 21(h) are identical to those of FIGS. 20(a) through 20(d) and FIGS. 20(f) through FIG. 20(h), and therefore will not be described below in detail.

According to the step of FIG. 21(e), in addition to the step of FIG. 20(e), the secondary wire 21X is covered with the middle insulating layer 13. The middle insulating layer 13 covers upper and side surfaces of the secondary wire 21X, and has an opening 13ho formed above the land section 21Xc.

Meanwhile, according to the step of FIG. 21(i), the step of covering the secondary wire 21X with the upper insulating layer 12 is omitted from the step of FIG. 20(i).

FIGS. 22(a) through 22(i), showing a method according to the present invention for manufacturing a semiconductor device, are diagrams showing, as an example of the manufacturing method, steps of manufacturing the semiconductor device 1m of FIGS. 15(a) and 15(b) as seen from the same surface as in FIG. 15(b).

According to the step of FIG. 22(a), in addition to the step of FIG. 20(a), the side wall 11bs' of the lower insulating layer 11b is formed.

The lower insulating layer 11b is formed by a spin-coating method on a wafer having a plurality of semiconductor chips 2 disposed thereon. After being dried, the lower insulating layer 11b is hardened by exposure and development so as to be removed from the opening 11bh, and an area around the side wall 11bs, and an area where the lower insulating layer 11b is to be removed by the side wall 11bs'.

Steps of FIGS. 22(b) through 22(h) are identical to those of FIGS. 20(b) through 22(h), and therefore will not be described below in detail.

According to the step of FIG. 22(i), the upper insulating layer 12 is formed so as to cover upper and side surfaces of the secondary wire 21Y, and has an opening 12h formed above the land section 21Yc. The upper insulating layer 12 further covers upper and side surfaces of the secondary wire 21X, and has an opening 12h formed above the land section 21Xc. Further, the upper insulating layer 12 has a side wall 12s formed around the scribe line area. Furthermore, that portion of the secondary-wire-free area 62D which is covered by the upper insulating layer 12 is provided with a depression 12ho' serving as a void portion.

FIGS. 23(a) through 23(i), showing a method according to the present embodiment for manufacturing a semiconductor device, are diagrams showing, as an example of the manufacturing method, steps of manufacturing the semiconductor device 1p of FIGS. 18(a) and 18(b) as seen from the same surface as in FIG. 18(b).

Figure 23:
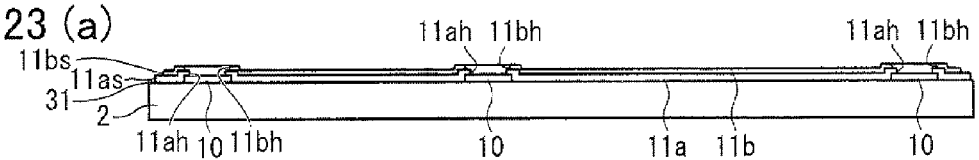
FIGS. 23(a) through 23(i), showing an embodiment, show a method for manufacturing the semiconductor device of FIGS. 18(a) and 18(b).
Figure 23:
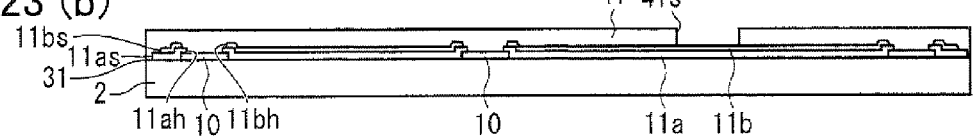
Figure 23:
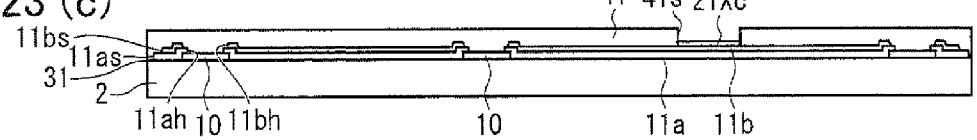
Figure 23:
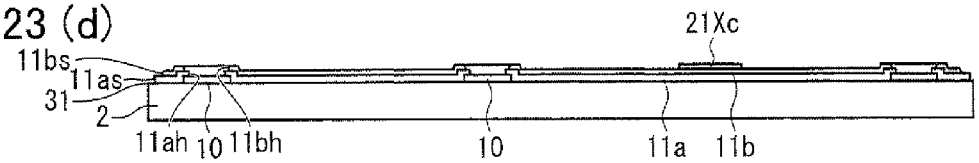
Figure 23:
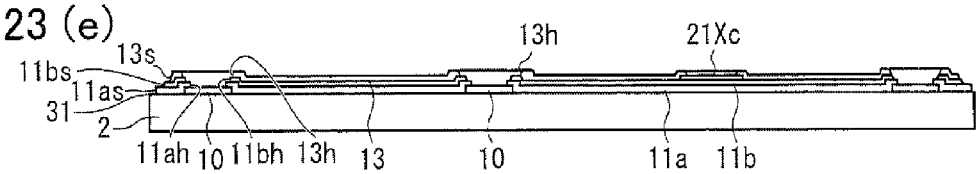
Figure 23:
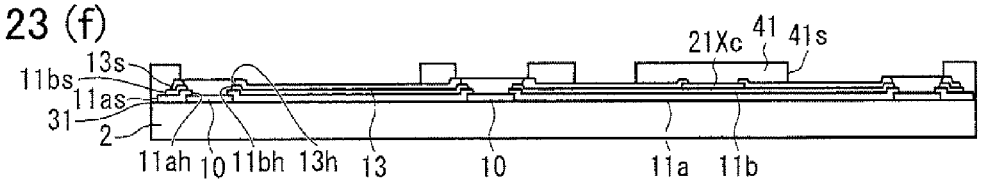
Figure 23:
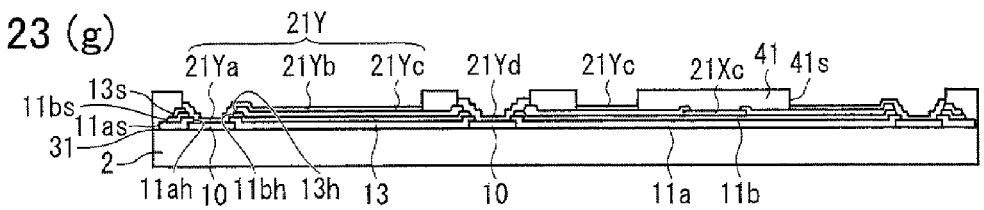
Figure 23:
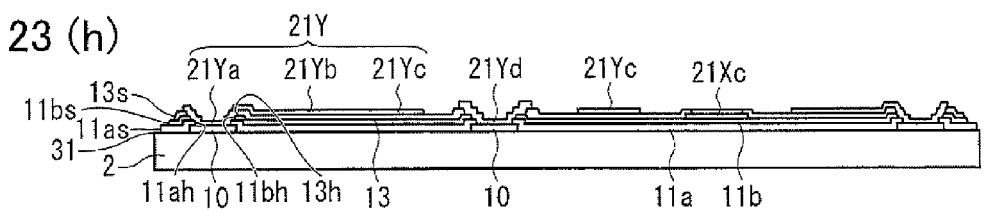
Figure 23:
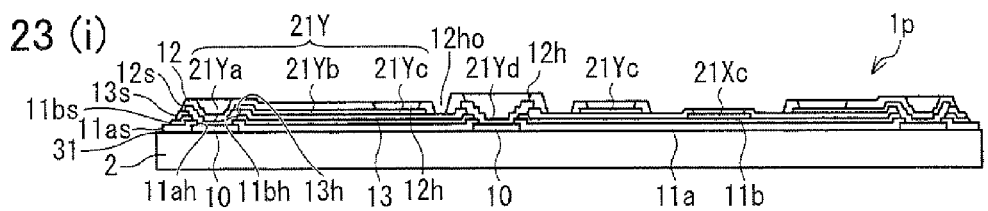

According the step of FIG. 23(a), in addition to the step of FIG. 20(a), an electrode pad 10 is formed on the semiconductor chip 2 so as to be near the center of the semiconductor chip 2. In so doing, the lower insulating layers 11a and 11b are provided with the openings 11ah and 11bh, respectively, via which to partially expose the electrode pad 10 formed near the center of the semiconductor chip 2.

Steps of FIGS. 23(b) through 23(d) are identical to those of FIGS. 20(b) through 20(d), and therefore will not be described below in detail.

According to the step of FIG. 23(e), in addition to the step of FIG. 20(e), the middle insulating layer 13 is provided with an opening 13h via which to partially expose the electrode pad 10 formed near the center of the semiconductor chip 2.

The step of FIG. 23(f) is identical to that of FIG. 20(f), and therefore will not be described below in detail.

According to the step of FIG. 23(g), in addition to the step of FIG. 20(g), the secondary wire 21Y has a land section 21Yd formed on the electrode pad 10 formed near the center of the semiconductor chip 2.

The step of FIG. 23(h) is identical to that of FIG. 20(h), and therefore will not be described below in detail.

According to the step of FIG. 23(i), in addition to the step of FIG. 20(i), the upper insulating layer 12 has an opening 12h formed above the land section 21Yd of the secondary wire 21Y.

After these steps, if necessary, a bump is formed with use of a material which forms a joint in a liquid phase. Semiconductor devices are cut along scribe lines into separate semiconductor devices. It should be noted that, as a finished product, the semiconductor device is used with the external connection terminals facing downward.

A semiconductor device thus completed by the method can suppress the electromagnetic interference and reduce wiring delays.

Further, in a stage prior to separating semiconductor devices, for example, in cases where the semiconductor devices are prepared on a silicon wafer whose circuit-forming surface has a diameter of 8 inches, the curvature of the wafer can be kept not more than several millimeters even in the case of a thickness of 300 μm to 150 μm.

Furthermore, in a dicing step or the like, it becomes possible to suppress such problems as a transport error in the electrical signal and the breakage of the wafer.

The lower insulating layer 11b according to the present embodiment does not need to be patterned with high accuracy, and therefore may be made of a nonphotosensitive resin. On the lower insulating layer 11b, patter formation may be performed with use of a photoresist in combination with a nonphotosensitive polyimide resin serving as a nonphotosensitive resin. This makes it possible to achieve cost reduction as compared with the use of photosensitive polyimide, PBO, or the like. Further, since such accuracy is required that an electrode pad 10 is surely exposed, it is more advantageous to perform pattern formation on the lower insulating layer 11b with use of photolithography than printing.

In the present embodiment, in order to prevent chipping at the time of dicing, it is only necessary that the middle insulating layer 13 have a side wall 13s formed on the surface of the semiconductor chip 2 so as to be closer to the center of the semiconductor chip 2 than is the side wall 11as, or so as to be in substantially the same position as the side wall 11as.

In the present embodiment, the middle insulating layer 13 serves as a superior insulating layer for the secondary wire 21X while serving as an inferior insulting layer for the secondary wire 21Y. The upper insulating layer 12 serves as a superior insulating layer for the secondary wire 21Y.

Further, in the present embodiment, the middle insulating layer 13 may be formed between the secondary wires 21X and 21Y only in an area of overlap between the secondary wires 21X and 21Y and an area therearound. By thus providing the middle insulating layer 13 between the secondary wires 21X and 21Y only in an area of overlap between the secondary wires 21X and 21Y and an area therearound, the curvature of a wafer can be further suppressed.

In order to solve the foregoing problems, a semiconductor device according to the present embodiment is a semiconductor device including: a semiconductor chip provided with an electrode pad; a lower insulating layer, covering the semiconductor chip, which is provided with an opening via which the electrode pad is partially exposed; a secondary wire including (i) a pad section for making an electrical connection to the electrode pad by making contact with an exposed portion of the electrode pad, (ii) a land section including an external connection terminal for making an electrical connection between the electrode pad and an external circuit provided outside of the semiconductor device, and (iii) a wiring section for making an electrical connection between the pad section and the land section; and an upper insulating layer, covering the secondary wire, which is provided with an opening via which at least the external connection terminal of the land section of the secondary wire is exposed, at least the wiring section of the secondary wire being provided on the lower insulating layer, a total thickness of insulating layers, provided in a secondary-wire-free area excluding a secondary-wire-containing area where at least the wiring section of the secondary wire is provided, which include at least the lower insulating layer being less than a total thickness of the lower insulating layer and the upper insulating layer in the secondary-wire-containing area, the semiconductor chip having an edge extending further outward than an edge of the upper insulating layer in an extending direction of a surface of the semiconductor chip on which the electrode pad is provided.

In other words, in order to solve the foregoing problems, a semiconductor device according to the present embodiment can be interpreted as being a semiconductor device including: a semiconductor chip provided with an electrode pad; a lower insulating layer, covering the semiconductor chip, which is provided with an opening via which the electrode pad is partially exposed; a secondary wire including (i) a pad section for making an electrical connection to the electrode pad by making contact with an exposed portion of the electrode pad, (ii) a land section including an external connection terminal for making an electrical connection between the electrode pad and an external circuit provided outside of the semiconductor device, and (iii) a wiring section for making an electrical connection between the pad section and the land section; and an upper insulating layer, covering the secondary wire, which is provided with an opening via which at least the external connection terminal of the land section of the secondary wire is exposed, at least the wiring section of the secondary wire being provided on the lower insulating layer, a total thickness of insulating layers, provided in a secondary-wire-free area excluding a secondary-wire-containing area where at least the wiring section of the secondary wire is provided, which include at least the lower insulating layer being less than a total thickness of the lower insulating layer and the upper insulating layer in the secondary-wire-containing area, the upper insulating layer being absent from an area placed at not more than a predetermined distance from an edge of the semiconductor chip in an extending direction of a surface of the semiconductor chip on which the electrode pad is provided.

It should be noted, in this specification, that the "edge of the semiconductor chip" means (i) the edge of a semiconductor chip separated from a wafer and (ii) that part of a semiconductor chip yet to be separated from a wafer which becomes the edge of the semiconductor chip when the semiconductor chip is separated later from the wafer.

According to the foregoing arrangement, in cases where the insulating layers including the upper insulating layer are made of organic matter whose coefficient of liner expansion is larger than the coefficient of liner expansion of inorganic matter, the insulating layers including at least the lower insulating layer are formed more thinly in the secondary-wire-free area than in the secondary-wire-containing area. It should be noted that the secondary-wire-free area means an area, excluding the secondary-wire-containing area where at least the wiring section of the secondary wire is provided, where it is necessary to protect the secondary wire and suppress the electromagnetic interference. The insulating layers made of organic matter whose coefficient of liner expansion is large are formed more thinly in the secondary-wire-free area than in the secondary-wire-containing area, so that the curvature of a wafer can be better suppressed as compared with a conventional semiconductor device. Further, this makes it possible that the lower insulating layer is formed so thickly as to have a thickness minimally required for suppression of the electromagnetic interference.

Therefore, even in the case of overlap between a secondary wire and an electronic circuit of the semiconductor chip, the arrangement brings about an effect of suppressing electromagnetic interference between the secondary wire and the electronic circuit and suppressing the curvature of a wafer. Further, the suppression of the curvature of the wafer brings about an effect of suppressing a change in electrical characteristics of the semiconductor device.

Patent Document 2 discloses an arrangement in which a warpage suppressing groove is provided in an appropriate portion of a semiconductor device including a wafer and a resin layer covering a part of the wafer.

Figure 4:
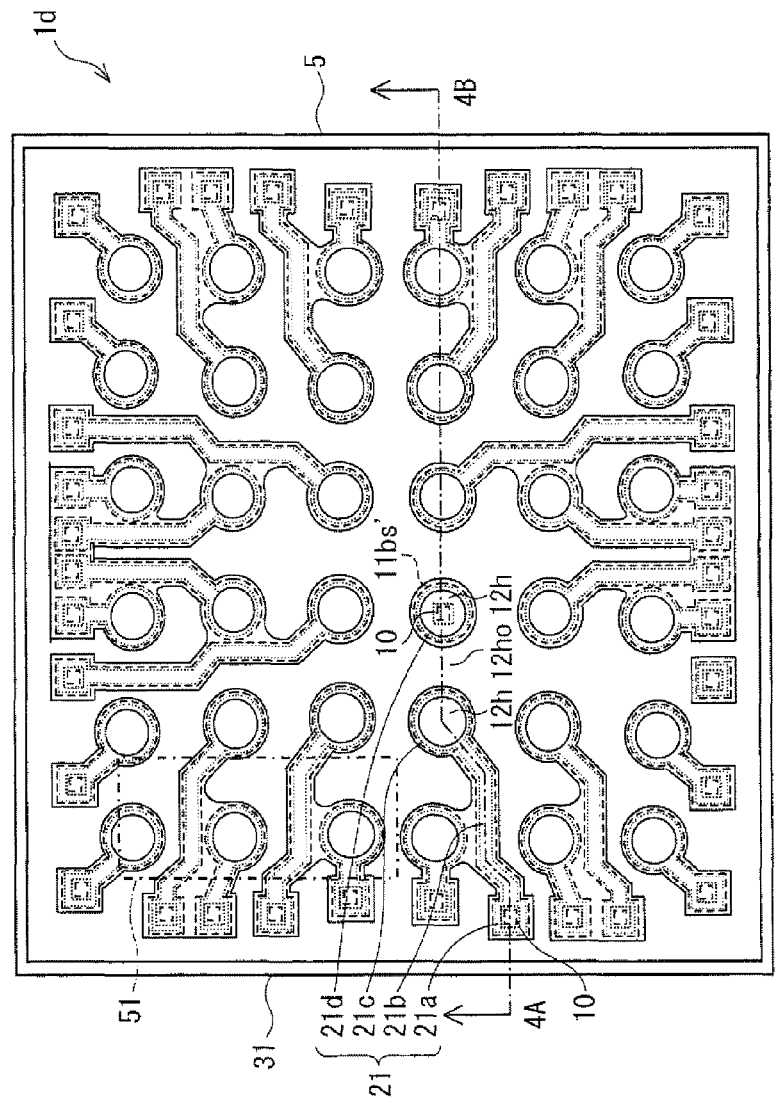
FIG. 4(a), showing another embodiment is a plan view showing an arrangement of a semiconductor device.
FIG. 4(b) is a cross-sectional view taken along the line 4A-4B of FIG. 4(a).
Figure 4:
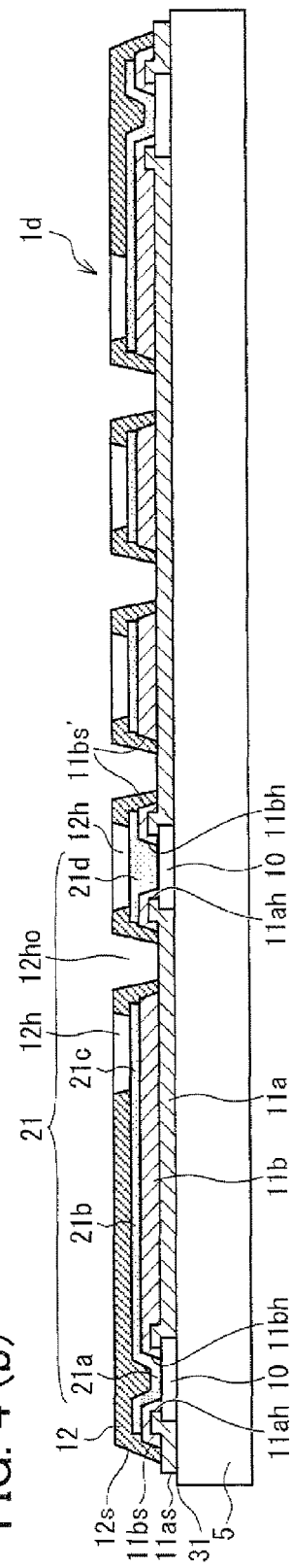

However, the technique disclosed in Patent Document 2 is merely arranged such that the warpage suppressing groove is locally provided, for example, by notching a part of the thickness direction of an insulating resin layer (lower insulating layer). Therefore, in order to obtain a sufficiently great wafer-curvature suppressing effect in cases where the insulating layer is made of organic matter, it is necessary to provide a large number of such warpage suppressing grooves. Accordingly, the technique disclosed in Patent Document 2 suffers from such a problem that a sufficiently great wafer-curvature suppressing effect cannot be obtained without complicating the structure of the semiconductor device. For example, since it is necessary that a rewiring layer (secondary wire) be surely protected by a sealing resin layer (upper insulating layer), it is not preferable that the sealing resin layer in an area where the rewiring layer is provided be provided with a notch or a groove. Formation of such a notch or a groove causes a crack in the sealing resin layer on the rewiring layer, thereby possibly causing corrosion of the rewiring layer. In order to obtain a wafer-curvature suppressing effect with use of the technique disclosed in Patent Document 2, it is conceivable, as shown in FIG. 4 of Patent Document 2, that the notches or grooves are provided in a reticular pattern or concentrically across substantially the entire surface of the semiconductor device. However, the arrangement cannot prevent the notches or grooves from traversing the area where the rewiring layer is provided, thereby easily causing corrosion of the rewiring layer.

Further, such a warpage suppressing groove is formed by laser exposure or a lithography step. However, in cases where the warpage suppressing groove is formed by laser exposure, the step of forming the warpage suppressing groove is made very cumbersome and complicated. Further, in cases where the warpage suppressing groove is formed by a lithography step, the warpage suppressing groove needs to be in a very complicated pattern, so that the step of forming the warpage suppressing groove is made very cumbersome and complicated. That is, the technique disclosed in Patent Document 2 suffers from such a problem that it is necessary to take very cumbersome and complicated manufacturing steps, because a sufficiently great wafer-curvature suppressing effect is obtained by complicating the structure of the semiconductor device. As shown in FIG. 4 of Patent Document 2, in order to form a notch or a groove in the sealing resin layer, it is necessary to very strictly set the allowable range of laser conditions and lithography conditions in each of an area containing the rewiring layer and an area free of the rewiring layer. This is because it is necessary to form a notch or a groove deeply in order to prevent the rewiring layer being exposed from the sealing resin layer and maximize the effect of suppressing the curvature of a wafer. Further, generally, in cases where the sealing resin layer has bases that vary from one area to another, i.e., in cases where Patent Document 2 has an area whose base is a rewiring layer and an area whose base is not a secondary wire, variations in the surface roughness of the bases, glossiness, and the like among the areas cause variations among the areas in the photosensitivity of the resin layers formed on the surfaces. This imposes stricter restrictions on the allowable range of lithography conditions. Further, in cases where the rewiring layer is formed by electrolytic plating, electroless plating, or the like, it is difficult to keep the depth of a notch or a groove constant. This is because it is necessary to consider the surface condition (particle size, glossiness, and the like) of a rewiring layer on the entire surface of a wafer, the number of wafers to be processed, a change in plating liquid with age, a change in photosensitive resin with age, and the like and it is very difficult to keep them constant.

Meanwhile, in the semiconductor device according to the present embodiment, the insulating layers are formed more thinly in the whole secondary-wire-free area than in the secondary-wire-containing area. Therefore, in cases where the lower insulating layer and the upper insulating layer are made of organic matter, the semiconductor device can bring about a sufficiently great wafer-curvature suppressing effect with a very simple structure. Further, this makes it possible to obtain a sufficiently great wafer-curvature suppressing effect by taking very simple steps as described below in manufacturing the semiconductor device.

Furthermore, in the semiconductor device according to the present embodiment, the semiconductor chip has an edge extending further outward than an edge of the upper insulating layer (at least a part of the upper insulating layer) in an extending direction of a surface of the semiconductor chip on which the electrode pad is provided, i.e., in a direction parallel to the surface on which the electrode pad is provided. This makes it possible to sufficiently remove an insulating layer, provided in an area around a scribe line, which possibly causes chipping in a dicing step. This brings about an effect of reducing the risk of occurrence of chipping in the dicing step.

Further, the semiconductor device according to the present embodiment may be arranged such that the secondary-wire-free area excludes the secondary-wire-containing area and an area around the secondary-wire-containing area.

Further, the semiconductor device according to the present embodiment may be arranged such that the lower insulating layer is thinner in the secondary-wire-free area than in the secondary-wire-containing area.

Further, the semiconductor device according to the present embodiment may be arranged such that: the upper insulating layer is provided in the secondary-wire-free area; and a total thickness of the lower insulating layer and the upper insulating layer in the secondary-wire-free area is not greater than a thickness of the lower insulating layer in the secondary-wire-containing area. Alternatively, the semiconductor device according to the present invention may be arranged such that the upper insulating layer is not provided in the secondary-wire-free area.

According to the foregoing arrangement, the thickness of the upper insulating layer in the secondary-wire-free area is not greater than the thickness of the lower insulating layer in the secondary-wire-containing area, or the upper insulating layer is not provided in the secondary-wire-free area. This results in formation of a space free of an insulating layer between a plurality of secondary wires. That is, the semiconductor device according to the present invention becomes arranged such that there exists air, whose relative permittivity is 1 plus, between the plurality of secondary wires between which an insulating layer that is organic matter (e.g., PBO) whose relative permittivity is approximately 3 is supposed be provided. This makes it possible to prevent high parasitic capacitance from occurring between the plurality of secondary wires, thereby reducing wiring delays.

Further, the semiconductor device according to the present embodiment may be arranged such that: the electrode pad is provided underneath the land section of the secondary wire; and the secondary-wire-free area further excludes an area provided with the land section underneath which the electrode pad is provided.

According to the foregoing arrangement, the electrode pad is provided on the semiconductor chip so as to be positioned underneath the land section of the secondary wire. Further, in this case, the secondary-wire-free area further excludes an area provided with the land section underneath which the electrode pad is provided. Similarly, in cases where the electrode pad needs to be provided underneath the land section, the total thickness of the insulating layers in the secondary-wire-free area is less than the total thickness of the lower insulating layer and the upper insulating layer in the secondary-wire-containing area. With this, even in cases where the electrode pad is provided underneath the land section, the curvature of wafer can be better suppressed as compared with a conventional semiconductor device. Further, the lower insulating layer can be formed so thickly as to have a thickness minimally required for suppression of the electromagnetic interference.

Therefore, even in the case of overlap between a secondary wire and an electronic circuit of the semiconductor chip and the case of provision of the electrode pad underneath the land section, an effect of suppressing electromagnetic interference between the secondary wire and the electronic circuit and suppressing the curvature of a wafer is brought about.

Further, the semiconductor device according to the present embodiment may be arranged such that the semiconductor chip further includes an electronic circuit for processing an analog signal.

According to the foregoing arrangement, the semiconductor chip further includes an electronic circuit for processing an analog signal. The electronic circuit is prone to cause the electromagnetic interference between secondary wires. Therefore, it is preferable that a semiconductor device having an electronic circuit for processing an analog signal be arranged as described above.

Further, the semiconductor device according to the present invention may be arranged such that the lower insulating layer has a thickness set for each specific area of the semiconductor chip in accordance with a degree of electromagnetic interference between the secondary wire and the electronic circuit.

In the semiconductor device having the electronic circuit, the degree of electromagnetic interference varies depending on how the electronic circuit is related in position to the secondary wire. Therefore, it is desirable that the thickness of the lower insulating layer be set for each specific area of the semiconductor chip in accordance with the degree of electromagnetic interference between the secondary wire and the electronic circuit. For example, it is desirable that the lower insulating layer be formed more thickly in a place where the electromagnetic interference exerts a great influence than in a place where the electromagnetic interference exerts a minor influence.

Further, a method according to the present for manufacturing a semiconductor device is a method for manufacturing the semiconductor device, the method including the steps of: (i) covering the semiconductor chip with the lower insulating layer provided with the opening via which the electrode pad is partially exposed; (ii) forming the secondary wire so that the pad section of the secondary wire makes contact with the exposed portion of the electrode pad of the semiconductor chip; and (iii) covering the secondary wire with the upper insulating layer provided with the opening via which the land section of the secondary wire is exposed.

According to the foregoing method, in cases where the insulating layers including the upper insulating layer are made of organic matter whose coefficient of liner expansion is larger than the coefficient of liner expansion of inorganic matter, the insulating layers including at least the lower insulating layer are formed more thinly in the secondary-wire-free area than in the secondary-wire-containing area. It should be noted that the secondary-wire-free area means an area, excluding at least the secondary-wire-containing area where the wiring section of the secondary wire is provided, where it is necessary to protect the secondary wire and suppress the electromagnetic interference. The insulating layers made of organic matter whose coefficient of liner expansion is large are formed more thinly in the secondary-wire-free area than in the secondary-wire-containing area, so that the curvature of a wafer can be better suppressed as compared with a conventional semiconductor device. Further, this makes it possible that the lower insulating layer is formed so thickly as to have a thickness minimally required for suppression of the electromagnetic interference.

Therefore, even in the case of overlap between a secondary wire and an electronic circuit of the semiconductor chip, the method brings about an effect of suppressing electromagnetic interference between the secondary wire and the electronic circuit and suppressing the curvature of a wafer. Further, the method brings about an effect of reducing the risk of occurrence of transport errors and wafer breakages in manufacturing processes. Furthermore, the method brings about an effect of suppressing a change in electrical characteristics of the semiconductor device.

Further, as described above, in the semiconductor device according to the present embodiment, the insulating layers are formed more thinly in the whole secondary-wire-free area than in the secondary-wire-containing area. Therefore, also in cases where the lower insulating layer and the upper insulating layer are made of organic matter, the semiconductor device can bring about a sufficiently great wafer-curvature suppressing effect with a very simple structure. This makes it possible to obtain a sufficiently great wafer-curvature suppressing effect by taking very simple manufacturing steps, such as the method according to the present invention for manufacturing a semiconductor device, in manufacturing the semiconductor device.

Further, the method according to the present embodiment for manufacturing a semiconductor device is characterized in that the step (iii) includes forming the upper insulating layer only in the secondary-wire-containing area and an area around the secondary-wire-containing area.

According to the foregoing method, the step (iii) includes forming the upper insulating layer only in the secondary-wire-containing area and an area around the secondary-wire-containing area. That is, the upper insulating layer is not formed in the secondary-wire-free area. This makes it possible to more greatly suppress the curvature of a wafer as compared with a conventional semiconductor device. Further, the lower insulating layer can be formed so thickly as to have a thickness minimally required for suppression of the electromagnetic interference.

Further, a method according to the present for manufacturing a semiconductor device is a method for manufacturing the semiconductor device, the method including the steps of: (i) covering the semiconductor chip with the lower insulating layer provided with the opening via which the electrode pad is partially exposed; (ii) forming the secondary wire so that the pad section of the secondary wire makes contact with the exposed portion of the electrode pad of the semiconductor chip; and (iii) covering the secondary wire with the upper insulating layer provided with (a) the opening via which the land section of the secondary wire is exposed and (b) a depression by which the total thickness of the insulating layers provided in the secondary-wire-free area so as to include at least the lower insulating layer is made less than the total thickness of the lower insulating layer and the upper insulating layer in the secondary-wire-containing area.

According to the foregoing method, the upper insulating layer is provided with a depression by which the total thickness of the insulating layers in the secondary-wire-free area is made less than the total thickness of the lower insulating layer and the upper insulating layer in the secondary-wire-containing area. This results in formation of a space free of a lower insulating layer or an upper insulating layer between a plurality of secondary wires. That is, the semiconductor device manufactured according to the present method becomes arranged such that there exists air, whose relative permittivity is 1 plus, between the plurality of secondary wires between which an insulating layer that is organic matter (e.g., PBO) whose relative permittivity is approximately 3 is supposed be provided. This makes it possible to prevent high parasitic capacitance from occurring between the plurality of secondary wires, thereby reducing wiring delays.

Further, a method according to the present for manufacturing a semiconductor device is a method for manufacturing the semiconductor device, the method including the steps of: (i) covering the semiconductor chip with the lower insulating layer provided with a side wall by which the lower insulating layer is made thinner in the secondary-wire-free area than in the secondary-wire-containing area; (ii) forming the secondary wire so that the pad section of the secondary wire makes contact with the exposed portion of the electrode pad of the semiconductor chip; and (iii) covering the secondary wire with the upper insulating layer provided with the opening via which the land section of the secondary wire is exposed.

According to the foregoing arrangement, the side wall makes it possible that the lower insulating layer is made thinner in the secondary-wire-free area than in the secondary-wire-containing area. Therefore, the curvature of a wafer can be sufficiently suppressed.

Further, a method according to the present for manufacturing a semiconductor device is a method for manufacturing the semiconductor device, the method including the steps of: (i) covering the semiconductor chip with the lower insulating layer provided with the opening via which the electrode pad is partially exposed; (ii) forming the secondary wire so that the pad section of the secondary wire makes contact with the exposed portion of the electrode pad of the semiconductor chip; and (iii) covering the secondary wire with the upper insulating layer provided with (a) the opening via which the land section of the secondary wire is exposed and (b) a depression by which the total thickness of the lower insulating layer and the upper insulating layer in the secondary-wire-free area excluding the secondary-wire-containing area and the area around the secondary-wire-containing area is made not less than the thickness of the lower insulating layer in the secondary-wire-containing area.

According to the foregoing method, the upper insulating layer is provided with a depression by which the total thickness of the lower insulating layer and the upper insulating layer in the secondary-wire-free area is made not less than the thickness of the lower insulating layer in the secondary-wire-containing area. This results in formation of a space free of a lower insulating layer and an upper insulating layer between a plurality of secondary wires. This makes it possible to prevent high parasitic capacitance from occurring between the plurality of secondary wires, thereby reducing wiring delays.

Further, a method according to the present for manufacturing a semiconductor device is a method for manufacturing the semiconductor device, the method including the steps of: (i) forming the lower insulating layer so that the thickness of the lower insulating layer is changed for each specific area of the semiconductor chip in accordance with the degree of electromagnetic interference between the secondary wire and the electronic circuit, the lower insulating layer having a side wall formed in the secondary-wire-free area of the semiconductor chip; (ii) forming the secondary wire so that the pad section of the secondary wire makes contact with the exposed portion of the electrode pad of the semiconductor chip; and (iii) covering the secondary wire with the upper insulating layer and providing the upper insulating layer with the opening via which the land section of the secondary wire is exposed.

The degree of electromagnetic interference varies depending on how an electronic circuit provided in a semiconductor chip is related in position to a secondary wire. Therefore, it is desirable that the thickness of the lower insulating layer be changed for each specific area of the semiconductor chip in accordance with the degree of electromagnetic interference between the secondary wire and the electronic circuit. For example, it is desirable that the lower insulating layer be formed more thickly in a place where the electromagnetic interference exerts a great influence than in a place where the electromagnetic interference exerts a minor influence.

It should be noted here that, in the case of formation of multiple layers of secondary wires, i.e., in the case of formation of multiple layers of secondary wires for which an inferior insulating layer has different thicknesses, it is necessary to provide one or more insulating layers (i.e., middle insulating layers) be provided between a lower insulating layer below the lowermost secondary wire and each of the multiple layers of secondary wires. Therefore, in the case of formation of multiple layers of secondary wires, it is necessary that an insulating layer be formed so thickly that a large numbers of layers of secondary wires can be provided. For example, in the case of formation of two layers of secondary wires, it is necessary to provide one or more middle insulating layers in addition to the lower insulating layer and the upper insulating layer. In the case of formation of three layers of secondary wires, it is necessary to provide two groups of one or more middle insulating layers. As a result, the presence of such an inferior insulating layer causes a problem with an increase in the curvature of wafer.

In order to solve the foregoing problems, a semiconductor device according to the present embodiment is a semiconductor device including: a semiconductor chip provided with an electrode pad; a lower insulating layer, covering the semiconductor chip, which is provided with an opening via which the electrode pad is partially exposed; multiple layers of secondary wires each of which has a part electrically connected to the electrode pad by making contact with an exposed portion of the electrode pad and further includes a wiring section provided so as to be run from the electrode pad onto an inferior insulating layer including at least the lower insulating layer, the inferior insulating layer having different thicknesses for the multiple layers of secondary wires; and a superior insulating layer covering at least a wiring section of an uppermost one of the multiple layers of secondary wires, a total thickness of insulating layers, provided in a secondary-wire-free area excluding an area where at least a wiring section of any one of the multiple layers of secondary wires is provided, which include at least the lower insulating layer being less than a total thickness of the inferior insulating layer and the superior insulating layer in a secondary-wire-containing area where at least the wiring section of the uppermost secondary wire is provided.

According to the foregoing arrangement, in cases where the insulating layers including the superior insulating layer are made of organic matter whose coefficient of liner expansion is larger than the coefficient of liner expansion of inorganic matter, the insulating layers are formed more thinly in the secondary-wire-free area than in the secondary-wire-containing area. It should be noted that the secondary-wire-free area means an area, excluding the area where the wiring section of at least any one of the multiple layers of secondary wires is provided, where it is necessary to protect the multiple layers of secondary wires for which the inferior insulating layer has different thicknesses and suppress the electromagnetic interference. Further, the secondary-wire-containing area means an area where at least the wiring section of the uppermost secondary wire is provided. The insulating layers made of organic matter whose coefficient of liner expansion is large are formed more thinly in the secondary-wire-free area than in the secondary-wire-containing area, so that the curvature of a wafer can be better suppressed as compared with a conventional semiconductor device. Further, this makes it possible that the lower insulating layer as well as the inferior insulating layer is formed so thickly as to have a thickness minimally required for suppression of the electromagnetic interference.

Therefore, even in the case of overlap between a specific secondary wire and an electronic circuit of the semiconductor chip, the arrangement brings about an effect of suppressing electromagnetic interference between the specific secondary wire and the electronic circuit and suppressing the curvature of a wafer. Further, the suppression of the curvature of the wafer brings about an effect of suppressing a change in electrical characteristics of the semiconductor device.

Further, the semiconductor device according to the present embodiment is arranged such that the semiconductor chip has an edge extending further outward than an edge of the superior insulating layer in an extending direction of a surface of the semiconductor chip on which the electrode pad is provided.

According to the foregoing arrangement, in the semiconductor device according to the present embodiment, the semiconductor chip has an edge extending further outward than an edge of the superior insulating layer (at least a part of the superior insulating layer) in an extending direction of a surface of the semiconductor chip on which the electrode pad is provided, i.e., in a direction parallel to the surface on which the electrode pad is provided. This makes it possible to sufficiently remove an insulating layer, provided in an area around a scribe line, which possibly causes chipping in a dicing step. This brings about an effect of reducing the risk of occurrence of chipping in the dicing step.

Further, the semiconductor device according to the present embodiment is arranged such that the secondary-wire-free area further excludes an area around the area where the wiring section of any one of the multiple layers of secondary wires is provided.

Further, the semiconductor device according to the present embodiment is arranged such that a thickness of the lower insulating layer in the secondary-wire-free area is less than a thickness of the inferior insulating layer in the secondary-wire-containing area.

Further, the semiconductor device according to the present embodiment is arranged such that: the superior insulating layer is provided in the secondary-wire-free area; and the total thickness of the insulating layers provided in the secondary-wire-free area so as to include at least the lower insulating layer and the superior insulating layer is not greater than a thickness of the inferior insulating layer in the secondary-wire-containing area. Alternatively, the semiconductor device according to the present invention is arranged such that the superior insulating layer is not provided in the secondary-wire-free area.

According to the foregoing arrangement, the superior insulating layer is provided in the secondary-wire-free area so that the total thickness of the insulating layers provided in the secondary-wire-free area so as to include at least the lower insulating layer and the superior insulating layer is not greater than the thickness of the inferior insulating layer in the secondary-wire-containing area, or the superior insulating layer is not provided in the secondary-wire-free area. This results in formation of a space free of an insulating layer between a plurality of secondary wires adjacent to each other. That is, the semiconductor device according to the present invention becomes arranged such that there exists air, whose relative permittivity is 1 plus, between the adjacent secondary wires between which an insulating layer that is organic matter (e.g., PBO) whose relative permittivity is approximately 3 is supposed be provided. This makes it possible to prevent high parasitic capacitance from occurring between the adjacent secondary wires, thereby reducing wiring delays.

Further, the semiconductor device according to the present embodiment is arranged such that the semiconductor chip further includes an electronic circuit for processing an analog signal.

According to the foregoing arrangement, the semiconductor chip further includes an electronic circuit for processing an analog signal. The electronic circuit is prone to cause the electromagnetic interference between secondary wires. Therefore, it is preferable that a semiconductor device having an electronic circuit for processing an analog signal be arranged as described above.

Further, the semiconductor device according to the present embodiment may be arranged such that the inferior insulating layer has a thickness set for each specific area of the semiconductor chip in accordance with a degree of electromagnetic interference between the secondary wire and the electronic circuit.

In the semiconductor device having the electronic circuit, the degree of electromagnetic interference varies depending on how the electronic circuit is related in position to the secondary wire. Therefore, it is preferable that the thickness of the inferior insulating layer be set for each specific area of the semiconductor chip in accordance with the degree of electromagnetic interference between the secondary wire and the electronic circuit. For example, it is preferable that the inferior insulating layer be formed more thickly in a place where the electromagnetic interference exerts a great influence than in a place where the electromagnetic interference exerts a minor influence.

Further, the semiconductor device according to the present embodiment may be arranged such that: the superior insulating layer covers at least one of the multiple layers of secondary wires; and the at least one secondary wire further includes a land section, obtained by exposing a predetermined area thereof, which makes an electrical connection to an external circuit provided outside of the semiconductor device.

According to the foregoing arrangement, the semiconductor device according to the present embodiment can be provided with an external connection terminal by using at least one of the multiple layers of secondary wires.

Further, the semiconductor device according to the present embodiment may be arranged such that: the electrode pad is provided underneath the land section so as to be electrically connected to the land section; and the secondary-wire-free area further excludes an area provided with the land section underneath which the electrode pad is provided.

According to the foregoing arrangement, the electrode pad is provided on the semiconductor chip so as to be electrically connected to the land section. Further, in this case, the secondary-wire-free area further excludes an area provided with the land section underneath which the electrode pad is provided. Similarly, in cases where the electrode pad needs to be provided underneath the land section, the total thickness of the insulating layers in the secondary-wire-free area is less than the total thickness of the insulating layers in the secondary-wire-containing area. With this, even in cases where the electrode pad is provided underneath the land section, the curvature of wafer can be better suppressed as compared with a conventional semiconductor device. Further, the lower insulating layer as well as the inferior insulating layer can be formed so thickly as to have a thickness minimally required for suppression of the electromagnetic interference.

Therefore, even in the case of overlap between multiple layers of secondary wires and an electronic circuit of the semiconductor chip and the case of provision of an electrode pad underneath a land section of a secondary wire, the arrangement bring about an effect of suppressing electromagnetic interference between the multiple layers of secondary wires, the secondary wire provided with the electrode pad, and the electronic circuit and suppressing the curvature of a wafer.

Further, a method according to the present for manufacturing a semiconductor device is a method for manufacturing any one of the semiconductor devices, the method including the steps of: (i) forming a plurality of electrode pads on the semiconductor chip; (ii) covering the semiconductor chip with the lower insulating layer provided with openings via which the electrode pads are partially exposed, respectively; (iii) making contact between the part of each of the multiple layers of secondary wires which excludes at least the wiring section and the exposed portion of each of the electrode pads and forming the wiring section of each of the multiple layers of secondary wires on the inferior insulating layer; and (iv) covering at least the uppermost secondary wire with the superior insulating layer.

According to the foregoing method, in cases where the insulating layers including the superior insulating layer are made of organic matter whose coefficient of liner expansion is larger than the coefficient of liner expansion of inorganic matter, the insulating layers are formed more thinly in the secondary-wire-free area than in the secondary-wire-containing area. The insulating layers made of organic matter whose coefficient of liner expansion is large are formed more thinly in the secondary-wire-free area than in the secondary-wire-containing area, so that the curvature of a wafer can be better suppressed as compared with a conventional semiconductor device. Further, this makes it possible that the lower insulating layer as well as the inferior insulating layer is formed so thickly as to have a thickness minimally required for suppression of the electromagnetic interference.

Therefore, even in the case of overlap between a specific secondary wire and an electronic circuit of the semiconductor chip, the method brings about an effect of suppressing electromagnetic interference between the specific secondary wire and the electronic circuit and suppressing the curvature of a wafer. Further the suppression of the curvature of the wafer brings about an effect of suppressing a change in electrical characteristics of the semiconductor device. Further, the method brings about an effect of reducing the risk of occurrence of transport errors and wafer breakages in manufacturing processes. Furthermore, the method brings about an effect of suppressing a change in electrical characteristics of the semiconductor device.

Further, as described above, in the semiconductor device according to the present embodiment, the insulating layers are formed more thinly in the whole secondary-wire-free area than in the secondary-wire-containing area. Therefore, also in cases where the inferior insulating layer and the superior insulating layer are made of organic matter, the semiconductor device can bring about a sufficiently great wafer-curvature suppressing effect with a very simple structure. This makes it possible to obtain a sufficiently great wafer-curvature suppressing effect by taking very simple manufacturing steps, such as the method according to the present invention for manufacturing a semiconductor device, in manufacturing the semiconductor device.

Further, the method according to the present embodiment for manufacturing a semiconductor device is characterized in that the step (iv) includes forming the superior insulating layer in the area where at least the wiring section of any one of the multiple layers of secondary wires is provided and an area therearound.

Further, the method according to the present invention for manufacturing a semiconductor device is characterized in that the step (iv) includes forming the superior insulating layer only in the secondary-wire-containing area and an area around the secondary-wire-containing area.

According to the foregoing method, the step (iv) includes forming the superior insulating layer only in the secondary-wire-containing area and an area around the secondary-wire-containing area. That is, the superior insulating layer is not formed in the secondary-wire-free area. This makes it possible to more greatly suppress the curvature of a wafer as compared with a conventional semiconductor device. Further, the lower insulating layer as well as the inferior insulating layer can be formed so thickly as to have a thickness minimally required for suppression of the electromagnetic interference.

Further, a method according to the present for manufacturing a semiconductor device is a method for manufacturing any one of the semiconductor devices, the method including the steps of: (i) forming a plurality of electrode pads on the semiconductor chip; (ii) covering the semiconductor chip with the lower insulating layer provided with openings via which the electrode pads are partially exposed, respectively; (iii) making contact between the part of each of the multiple layers of secondary wires which excludes at least the wiring section and the exposed portion of each of the electrode pads and forming the wiring section of each of the multiple layers of secondary wires on the inferior insulating layer; and (iv) covering at least the uppermost secondary wire with the superior insulating layer provided with a depression by which the total thickness of the insulating layers provided in the secondary-wire-free area so as to include at least the lower insulating layer is made less than the total thickness of the inferior insulating layer and the superior insulating layer in the secondary-wire-containing area.

According to the foregoing arrangement, the superior insulating layer is provided with a depression by which the total thickness of the insulating layers provided in the secondary-wire-free area so as to include at least the lower insulating layer is made less than the total thickness of the inferior insulating layer and the superior insulating layer in the secondary-wire-containing area. This results in formation of a space free of an insulating layer between a plurality of secondary wires adjacent to each other. That is, the semiconductor device according to the present invention becomes arranged such that there exists air, whose relative permittivity is 1 plus, between the adjacent secondary wires between which an insulating layer that is organic matter (e.g., PBO) whose relative permittivity is approximately 3 is supposed be provided. This makes it possible to prevent high parasitic capacitance from occurring between the adjacent secondary wires, thereby reducing wiring delays.

Further, a method according to the present for manufacturing a semiconductor device is a method for manufacturing any one of the semiconductor devices, the method including the steps of: (i) forming a plurality of electrode pads on the semiconductor chip; (ii) covering the semiconductor chip with the lower insulating layer provided with (a) openings via which the electrode pads are partially exposed, respectively, and (b) a side wall by which the thickness of the lower insulating layer in the secondary-wire-free area is made less than the total thickness of the inferior insulating layer in the secondary-wire-containing area; (iii) making contact between the part of each of the multiple layers of secondary wires which excludes at least the wiring section and the exposed portion of each of the electrode pads and forming the wiring section of each of the multiple layers of secondary wires on the inferior insulating layer; and (iv) covering at least the uppermost secondary wire with the superior insulating layer.

According to the foregoing arrangement, the lower insulating layer is provided with a side wall by which the thickness of the lower insulating layer in the secondary-wire-free area is made less than the total thickness of the inferior insulating layer in the secondary-wire-containing area. This results in formation of a space free of an insulating layer between a plurality of secondary wires adjacent to each other. That is, the semiconductor device according to the present invention becomes arranged such that there exists air, whose relative permittivity is 1 plus, between the adjacent secondary wires between which an insulating layer that is organic matter (e.g., PBO) whose relative permittivity is approximately 3 is supposed be provided. This makes it possible to prevent high parasitic capacitance from occurring between the adjacent secondary wires, thereby reducing wiring delays.

Further, a method according to the present for manufacturing a semiconductor device is a method for manufacturing any one of the semiconductor devices, the method including the steps of: (i) forming a plurality of electrode pads on the semiconductor chip; (ii) covering the semiconductor chip with the lower insulating layer provided with openings via which the electrode pads are partially exposed, respectively; (iii) making contact between the part of each of the multiple layers of secondary wires which excludes at least the wiring section and the exposed portion of each of the electrode pads and forming the wiring section of each of the multiple layers of secondary wires on the inferior insulating layer; and (iv) covering at least the uppermost secondary wire with the superior insulating layer provided with a depression by which the total thickness of the insulating layers provided in the secondary-wire-free area so as to include the lower insulating layer and the superior insulating layer is made not less than the thickness of the inferior insulating layer in the uppermost secondary-wire-containing area.

According to the foregoing method, the superior insulating layer is provided with a depression by which the total thickness of the lower insulating layer and the superior insulating layer in the secondary-wire-free area is made not less than the thickness of at least the inferior insulating layer in the uppermost secondary-wire-containing area. With this, a space where neither a lower insulating layer nor an upper insulating layer is provided is formed between specific layers of secondary wires adjacent to each other. This makes it possible to prevent high parasitic capacitance from occurring between the specific layers of secondary wires adjacent to each other, thereby reducing wiring delays.

Further, a method according to the present for manufacturing a semiconductor device is a method for manufacturing any one of the semiconductor devices, the method including the steps of: (i) forming the inferior insulating layer so that the thickness of the inferior insulating layer is changed for each specific area of the semiconductor chip in accordance with the degree of electromagnetic interference between the secondary wire and the electronic circuit, the inferior insulating layer having a side wall formed in the secondary-wire-free area of the semiconductor chip; (ii) making contact between the part of each of the multiple layers of secondary wires which excludes the wiring section and the exposed portion of each of the electrode pads of the semiconductor chip and forming the wiring section of each of the multiple layers of secondary wires on the inferior insulating layer; and (iii) covering at least the uppermost secondary wire with the superior insulating layer.

In the semiconductor device having the electronic circuit, the degree of electromagnetic interference varies depending on how the electronic circuit is related in position to the secondary wire. Therefore, it is preferable that the thickness of the inferior insulating layer be set for each specific area of the semiconductor chip in accordance with the degree of electromagnetic interference between the secondary wire and the electronic circuit. For example, it is preferable that the inferior insulating layer be formed more thickly in a place where the electromagnetic interference exerts a great influence than in a place where the electromagnetic interference exerts a minor influence.

Further, a method according to the present for manufacturing a semiconductor device is a method for manufacturing any one of the semiconductor devices, the method including the steps of: (i) forming a plurality of electrode pads on the semiconductor chip; (ii) covering the semiconductor chip with the lower insulating layer provided with openings via which the electrode pads are partially exposed, respectively; (iii) making contact between the part of each of the multiple layers of secondary wires which excludes the wiring section and the exposed portion of each of the electrode pads of the semiconductor chip and forming the wiring section of each of the multiple layers of secondary wires on the inferior insulating layer; and (iv) covering at least the uppermost secondary wire and at least one of the multiple layers of secondary wires with superior insulating layer and providing the at least one secondary wire with the land section.

According to the foregoing arrangement, the semiconductor device according to the present embodiment can be provided with an external connection terminal by using at least one of the multiple layers of secondary wires.

In order to solve the foregoing problems, a semiconductor device according to the present embodiment is a semiconductor device including: a semiconductor chip provided with an electrode pad; a lower insulating layer, covering the semiconductor chip, which is provided with an opening via which the electrode pad is partially exposed; a secondary wire having a part electrically connected to the electrode pad by making contact with an exposed portion of the electrode pad and further including a wiring section provided so as to be run onto the lower insulating layer; and an upper insulating layer covering at least the wiring section of the secondary wire, a total thickness of insulating layers, provided in a secondary-wire-free area excluding at least a secondary-wire-containing area where the wiring section of the secondary wire is provided, which include at least the lower insulating layer being less than a total thickness of the lower insulating layer and the upper insulating layer in the secondary-wire-containing area, the semiconductor chip having an edge extending further outward than an edge of the upper insulating layer in an extending direction of a surface of the semiconductor chip on which the electrode pad is provided.

In other words, in order to solve the foregoing problems, a semiconductor device according to the present embodiment can be interpreted as being a semiconductor device including: a semiconductor chip provided with an electrode pad; a lower insulating layer, covering the semiconductor chip, which is provided with an opening via which the electrode pad is partially exposed; a secondary wire having a part electrically connected to the electrode pad by making contact with an exposed portion of the electrode pad and further including a wiring section provided so as to be run onto the lower insulating layer; and an upper insulating layer covering at least the wiring section of the secondary wire, a total thickness of insulating layers, provided in a secondary-wire-free area excluding at least a secondary-wire-containing area where the wiring section of the secondary wire is provided, which include at least the lower insulating layer being less than a total thickness of the lower insulating layer and the upper insulating layer in the secondary-wire-containing area, the upper insulating layer being absent from an area placed at not more than a predetermined distance from an edge of the semiconductor chip in an extending direction of a surface of the semiconductor chip on which the electrode pad is provided.

Further, a method according to the present embodiment for manufacturing a semiconductor device is a method for manufacturing the semiconductor device, the method comprising the steps of: (i) covering the semiconductor chip with the lower insulating layer provided with the opening via which the electrode pad is partially exposed; (ii) forming the secondary wire so that a part of the secondary wire which excludes the wiring section makes contact with the exposed portion of the electrode pad of the semiconductor; and (iii) covering the secondary wire with the upper insulating layer.

According to the foregoing arrangement, in cases where the insulating layers including the upper insulating layer are made of organic matter whose coefficient of liner expansion is larger than the coefficient of liner expansion of inorganic matter, the insulating layers are formed more thinly in the secondary-wire-free area than in the secondary-wire-containing area. It should be noted that the secondary-wire-free area means an area, excluding at least the area where the wiring section of the secondary wire is provided, where it is necessary to protect the secondary wire and suppress the electromagnetic interference. Further, the secondary-wire-containing area means an area where at least the wiring section of the secondary wire is provided. The insulating layers made of organic matter whose coefficient of liner expansion is large are formed more thinly in the secondary-wire-free area than in the secondary-wire-containing area, so that the curvature of a wafer can be better suppressed as compared with a conventional semiconductor device. Further, this makes it possible that the lower insulating layer is formed so thickly as to have a thickness minimally required for suppression of the electromagnetic interference.

Therefore, even in the case of overlap between a secondary wire and an electronic circuit of the semiconductor chip, the arrangement brings about an effect of suppressing electromagnetic interference between the secondary wire and the electronic circuit and suppressing the curvature of a wafer. Further, the suppression of the curvature of the wafer brings about an effect of suppressing a change in electrical characteristics of the semiconductor device.

Furthermore, in the semiconductor device according to the present embodiment, the semiconductor chip has an edge extending further outward than an edge of the upper insulating layer (at least a part of the upper insulating layer) in an extending direction of a surface of the semiconductor chip on which the electrode pad is provided, i.e., in a direction parallel to the surface on which the electrode pad is provided. This makes it possible to sufficiently remove an insulating layer, provided in an area around a scribe line, which possibly causes chipping in a dicing step. This brings about an effect of reducing the risk of occurrence of chipping in the dicing step.

A semiconductor device of the present embodiment can be suitably used as a small semiconductor device in which electromagnetic interference between a secondary wire and an electronic circuit section and the curvature of a wafer are small.

The embodiments and concrete examples of implementation discussed in the foregoing detailed explanation serve solely to illustrate the technical details of the present embodiments, which should not be narrowly interpreted within the limits of such embodiments and concrete examples, but rather may be applied in many variations within the spirit of the present embodiments, provided such variations do not exceed the scope of the patent claims set forth below.

What is claimed is:

1. A semiconductor device comprising:
    a semiconductor chip having a circuit-forming surface provided with an electrode pad;
    a lower insulating layer, covering the semiconductor chip, which is provided with an opening via which the electrode pad is partially exposed;
    a secondary wire including (i) a pad section for making an electrical connection to the electrode pad by making contact with an exposed portion of the electrode pad, (ii) a land section including an external connection terminal for making an electrical connection between the electrode pad and an external circuit provided outside of the semiconductor device, and (iii) a wiring section for making an electrical connection between the pad section and the land section; and
    an upper insulating layer, covering the secondary wire, which is provided with an opening via which at least the external connection terminal of the land section of the secondary wire is exposed,
    at least the wiring section of the secondary wire being provided on the lower insulating layer,
    a total thickness of insulating layers, provided in a secondary-wire-free area excluding a secondary-wire-containing area where at least the wiring section of the secondary wire is provided, which include at least the lower insulating layer being less than a total thickness of the lower insulating layer and the upper insulating layer in the secondary-wire-containing area, excluding the land section,
    the semiconductor chip having an edge extending further outward than an edge of the upper insulating layer in an extending direction of a surface of the semiconductor chip on which the electrode pad is provided, wherein:
    the lower insulating layer comprises a first lower insulating layer and a second lower insulating layer, wherein the first lower insulating layer is made of an oxide film or a nitride film, and the second lower insulating layer is made of an organic film,
    the semiconductor chip further includes an electronic circuit for processing an analog signal which electronic circuit is provided on the circuit-forming surface; and
    the lower insulating layer has a predetermined value of thickness for each specific area of the semiconductor chip such that a degree of electromagnetic interference between the secondary wire and the electronic circuit is suppressed.

2. The semiconductor device as set forth in claim 1, wherein the secondary-wire-free area excludes the secondary-wire-containing area and an area around the secondary-wire-containing area.

3. The semiconductor device as set forth in claim 1, wherein the lower insulating layer is thinner in the secondary-wire-free area than in the secondary-wire-containing area.

4. The semiconductor device as set forth in claim 2, wherein:
    the upper insulating layer is provided in the secondary-wire-free area; and
    a total thickness of the lower insulating layer and the upper insulating layer in the secondary-wire-free area is not greater than a thickness of the lower insulating layer in the secondary-wire-containing area.

5. The semiconductor device as set forth in claim 2, wherein the upper insulating layer is not provided in the secondary-wire-free area.

6. The semiconductor device as set forth in claim 1, wherein:
the electrode pad is provided underneath the land section of the secondary wire; and
the secondary-wire-free area further excludes an area provided with the land section underneath which the electrode pad is provided.

7. A semiconductor device comprising:
a semiconductor chip having a circuit-forming surface provided with an electrode pad;
a lower insulating layer, covering the semiconductor chip, which is provided with an opening via which the electrode pad is partially exposed;
a secondary wire having a part electrically connected to the electrode pad by making contact with an exposed portion of the electrode pad and further including a wiring section provided so as to be run onto the lower insulating layer; and
an upper insulating layer covering at least the wiring section of the secondary wire,
a total thickness of insulating layers, provided in a secondary-wire-free area excluding a secondary-wire-containing area where at least the wiring section of the secondary wire is provided, which include at least the lower insulating layer being less than a total thickness of the lower insulating layer and the upper insulating layer in the secondary-wire-containing area, excluding a land section including an external connection terminal for making an electrical connection between the electrode pad and an external circuit provided outside of the semiconductor device,
the semiconductor chip having an edge extending further outward than an edge of the upper insulating layer in an extending direction of a surface of the semiconductor chip on which the electrode pad is provided, wherein
the lower insulating layer comprises a first lower insulating layer and a second lower insulating layer, wherein the first lower insulating layer is made of an oxide film or a nitride film, and the second lower insulating layer is made of an organic film;
the semiconductor chip further includes an electronic circuit for processing an analog signal which electronic circuit is provided on the circuit-forming surface; and
the lower insulating layer has a predetermined value of thickness for each specific area of the semiconductor chip such that a degree of electromagnetic interference between the secondary wire and the electronic circuit is suppressed.

* * * * *